(12) United States Patent  
Rabkin et al.

(10) Patent No.: US 9,368,510 B1  
(45) Date of Patent: *Jun. 14, 2016

(54) METHOD OF FORMING MEMORY CELL WITH HIGH-K CHARGE TRAPPING LAYER

(71) Applicant: SanDisk Technologies Inc., Plano, TX (US)

(72) Inventors: Peter Rabkin, Cupertino, CA (US); Jayavel Pachamuthu, San Jose, CA (US); Johann Alsmeier, San Jose, CA (US); Masaaki Higashitani, Cupertino, CA (US)

(73) Assignee: SanDisk Technologies Inc., Plano, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/721,501

(22) Filed: May 26, 2015

(51) Int. Cl.
*H01L 27/115* (2006.01)

(52) U.S. Cl.
CPC .... *H01L 27/11582* (2013.01); *H01L 27/11568* (2013.01)

(58) Field of Classification Search
None
See application file for complete search history.

(56) References Cited

U.S. PATENT DOCUMENTS

| 8,283,265 | B2 | 10/2012 | Ramappa et al. | |
|---|---|---|---|---|
| 2009/0023280 | A1 | 1/2009 | Ang et al. | |
| 2010/0062595 | A1* | 3/2010 | Lim | H01L 21/28273 438/591 |
| 2010/0072539 | A1* | 3/2010 | Yasuda | H01L 21/28282 257/326 |
| 2011/0303968 | A1* | 12/2011 | Lue | H01L 29/792 257/324 |
| 2012/0146126 | A1* | 6/2012 | Lai | G11C 8/10 257/324 |
| 2013/0140621 | A1 | 6/2013 | Chin et al. | |
| 2014/0217492 | A1 | 8/2014 | Chang-Liao et al. | |

OTHER PUBLICATIONS

Zhao, Chun, et al., "Review on Non-Volatile Memory with High-k Dielectrics: Flash for Generation Beyond 32nm," Materials, vol. 7, Issue 7, Jul. 15, 2014, 29 pages.
Sugizaki, T., et al., "Novel Multi-bit SONOS Type Flash Memory Using a High-k Charge Trapping Layer," Symposium on VLSI Technology Digest of Technical Papers, Jun. 2003, 2 pages.
Kim, Min Choul, et al., "Nonvolatile memories using deep traps formed in HfO2 by Nb ion implantation," Journal of Applied Physics, vol. 109, Mar. 8, 2011, 4 pages.
U.S. Appl. No. 14/721,536, filed May 26, 2015.
Non-final Office Action dated Apr. 8, 2016, U.S. Appl. No. 14/721,536 filed May 26, 2015.

* cited by examiner

*Primary Examiner* — Asok K Sarkar
(74) *Attorney, Agent, or Firm* — Vierra Magen Marcus LLP

(57) ABSTRACT

A non-volatile storage device with memory cells having a high-k charge storage region, as well as methods of fabrication, is disclosed. The charge storage region has three or more layers of dielectric materials. At least one layer is a high-k material. The high-k layer(s) has a higher trap density as compared to $Si_3N_4$. High-k dielectrics in the charge storage region enhance capacitive coupling with the memory cell channel, which can improve memory cell current, program speed, and erase speed. The charge storage region has a high-low-high conduction band offset, which may improve data retention. The charge storage region has a low-high-low valence band offset, which may improve erase.

22 Claims, 37 Drawing Sheets

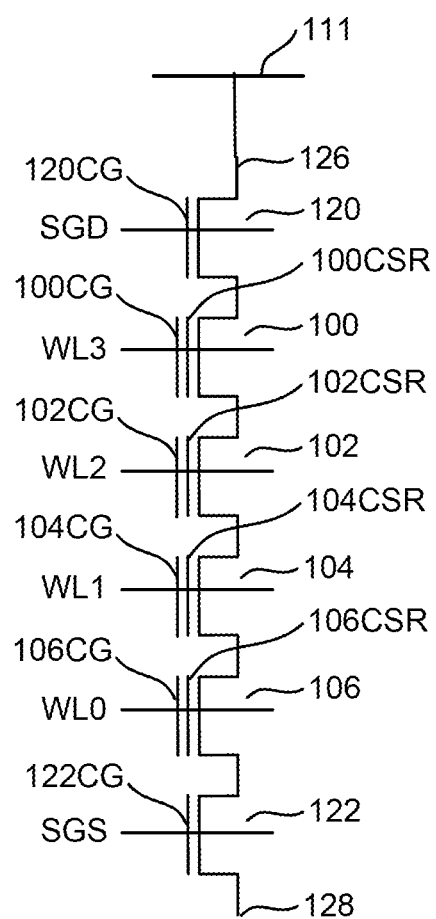

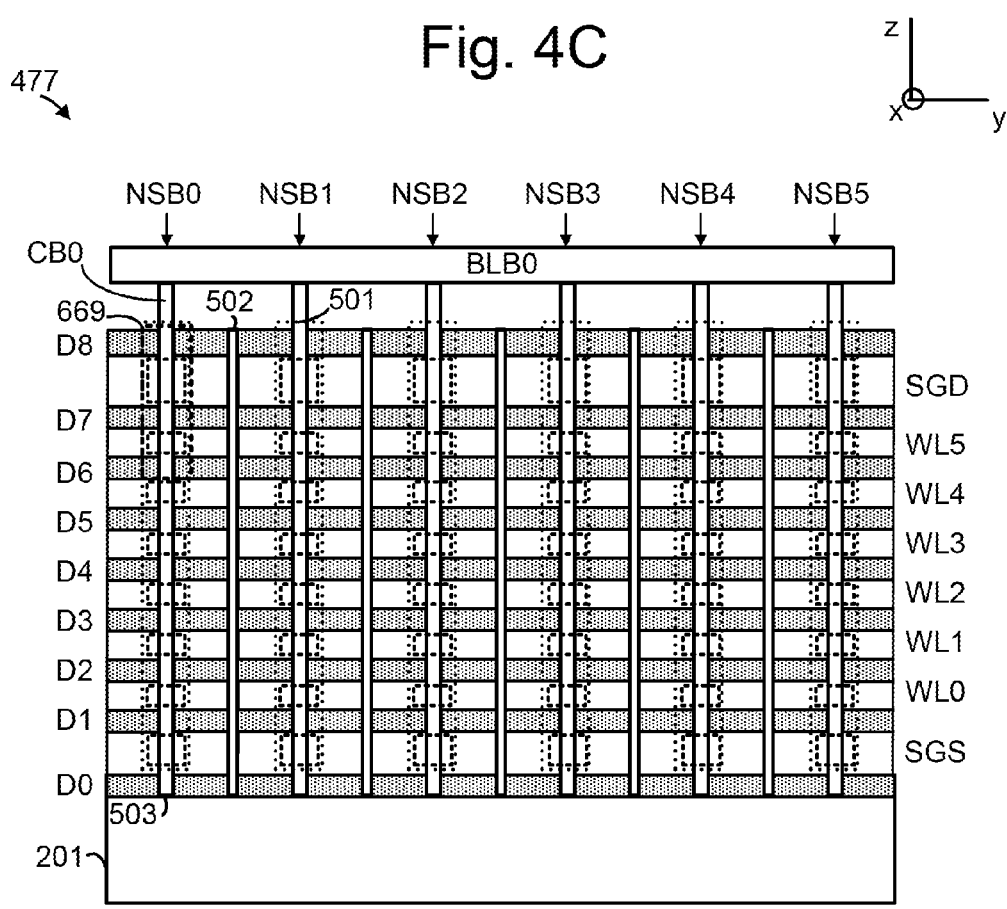

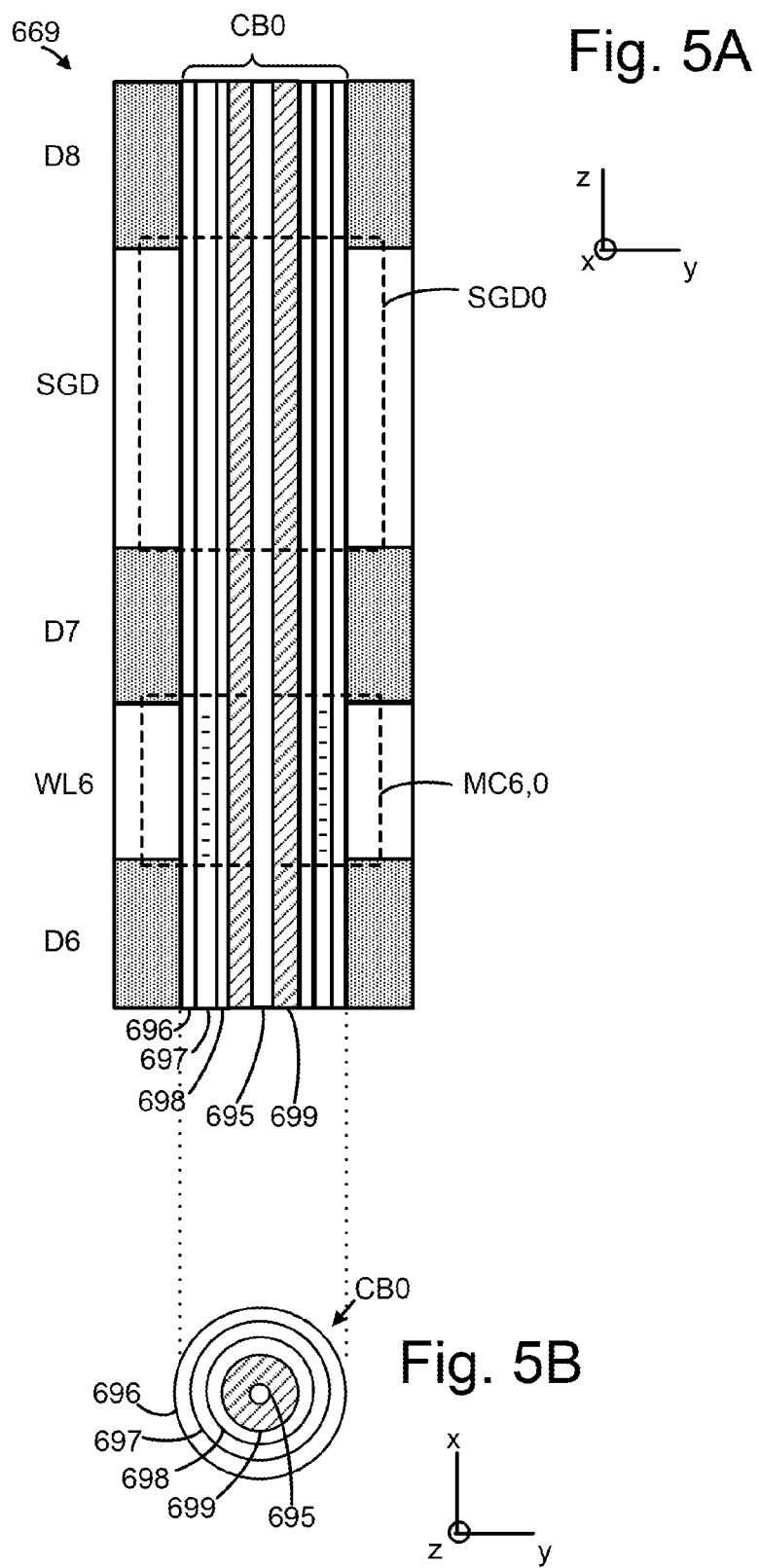

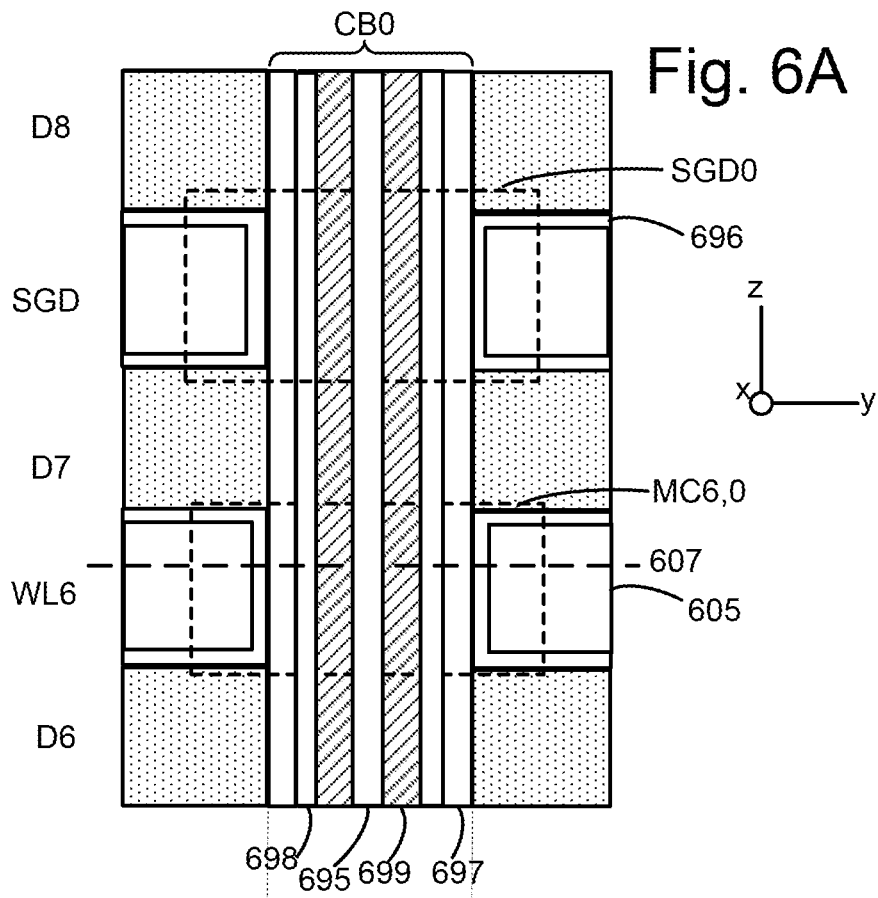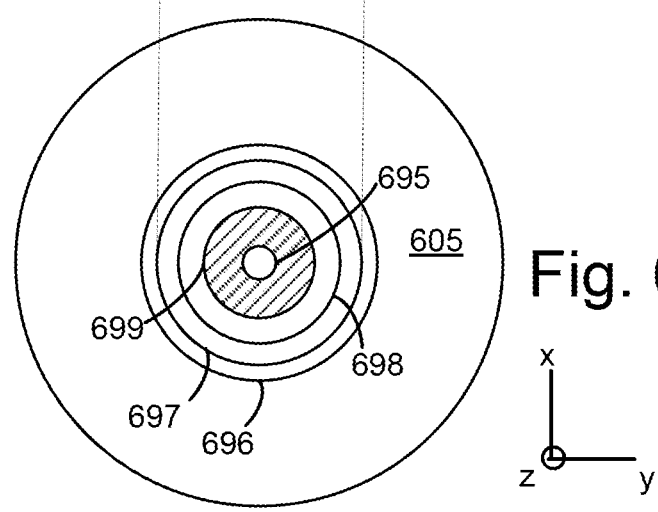

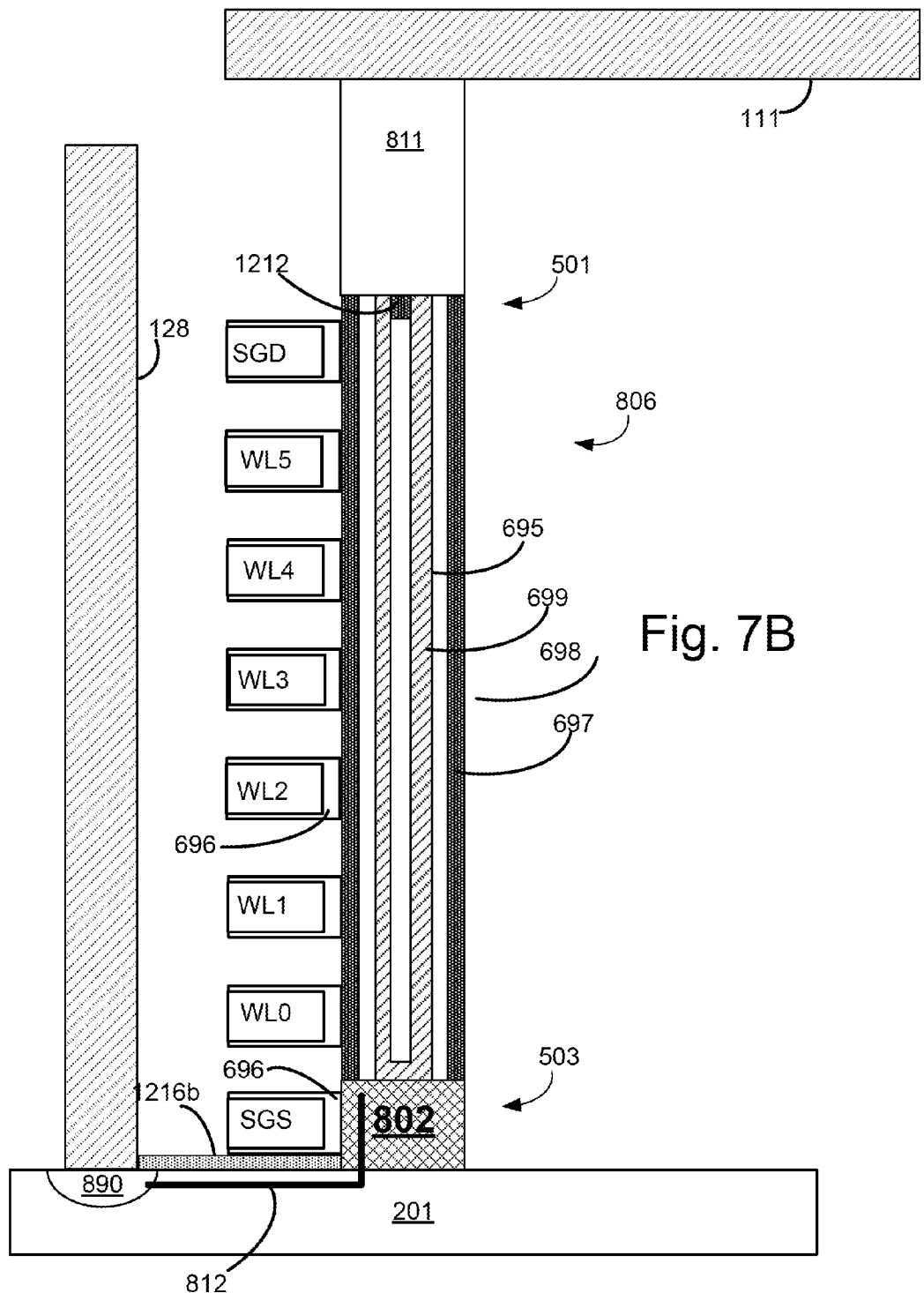

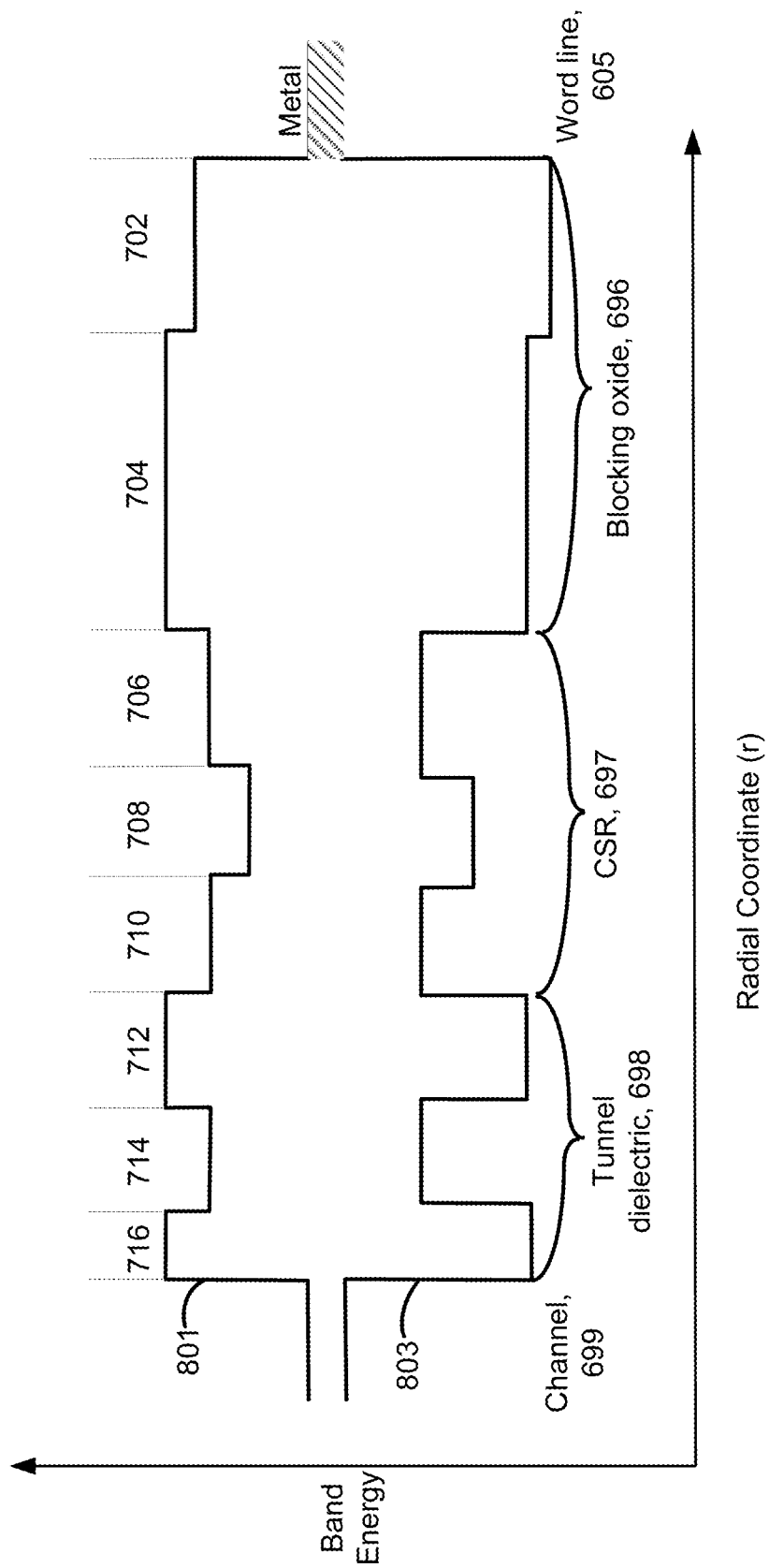

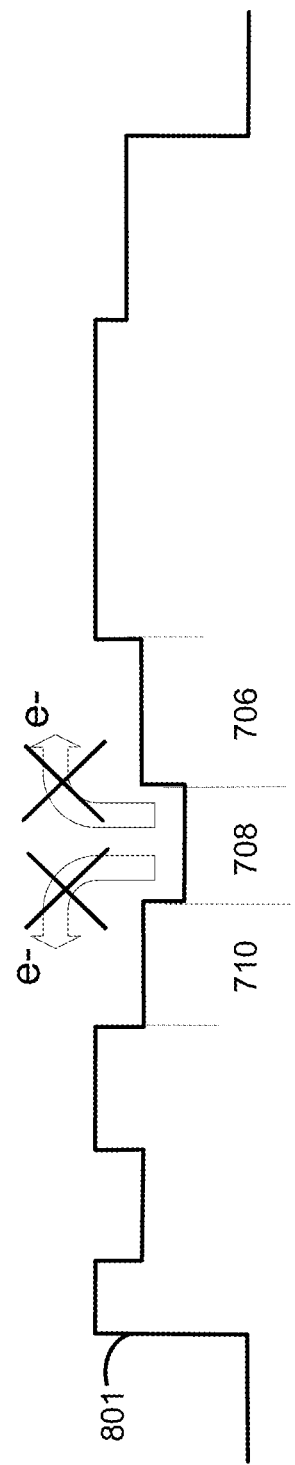

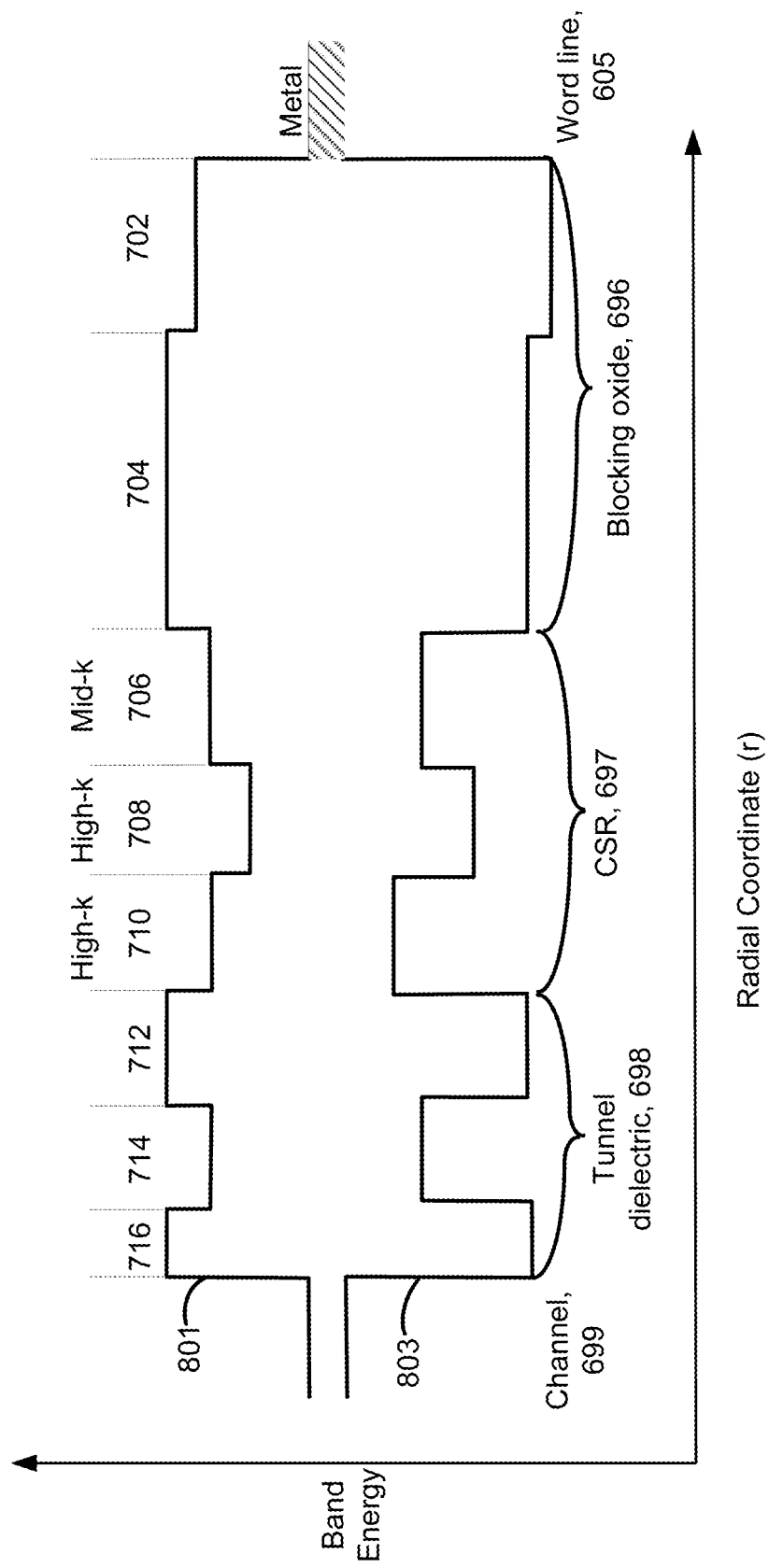

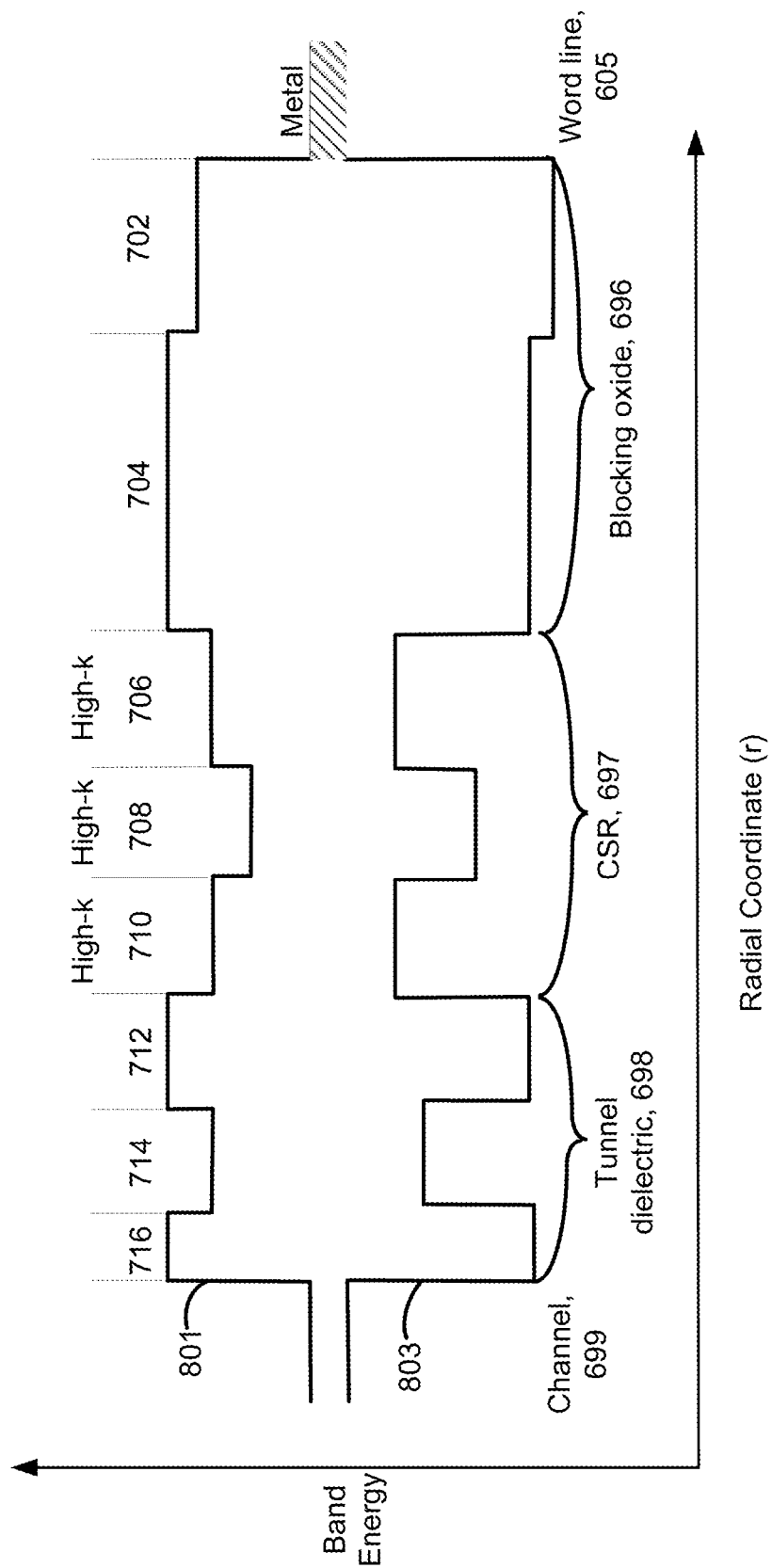

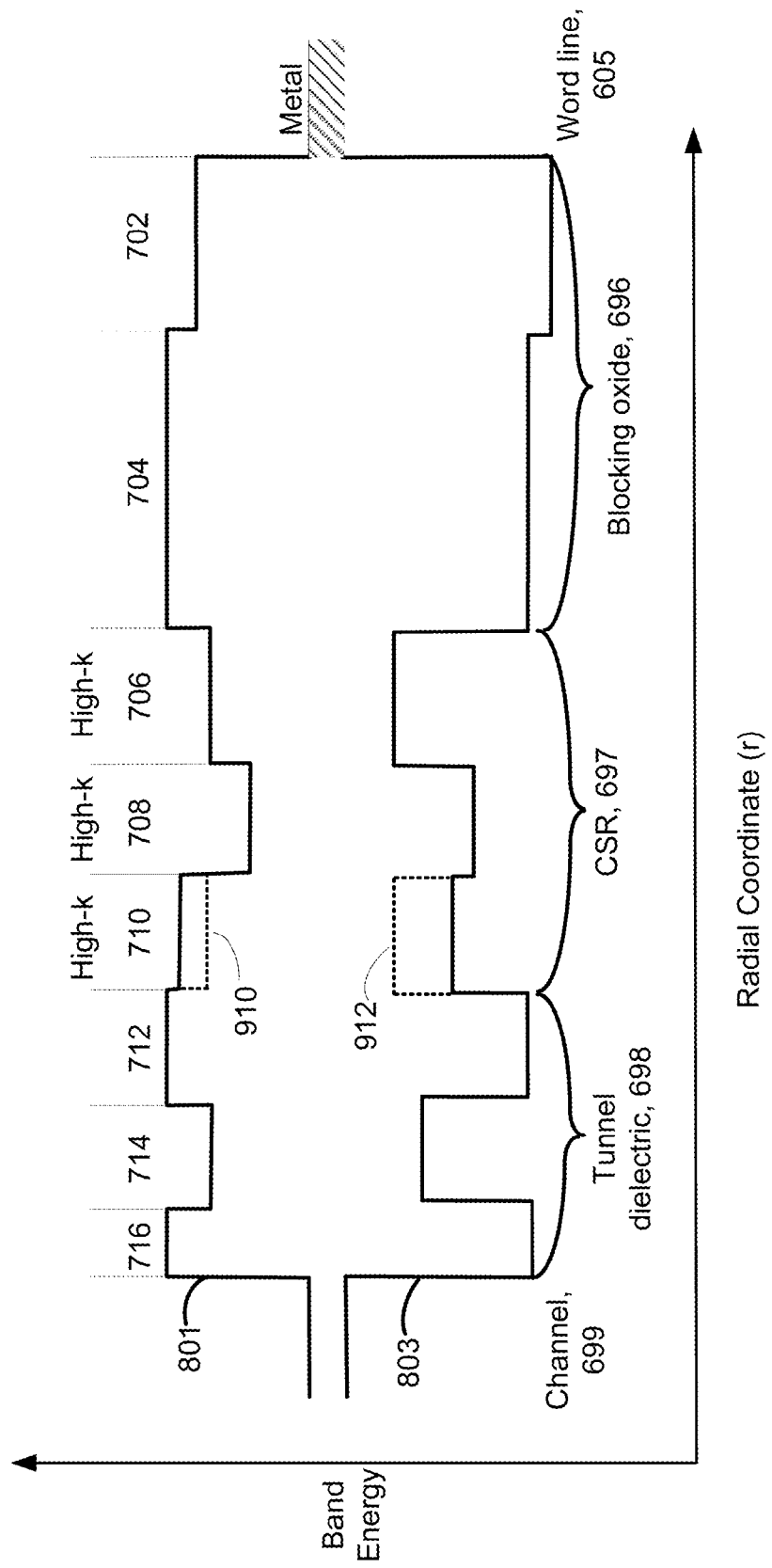

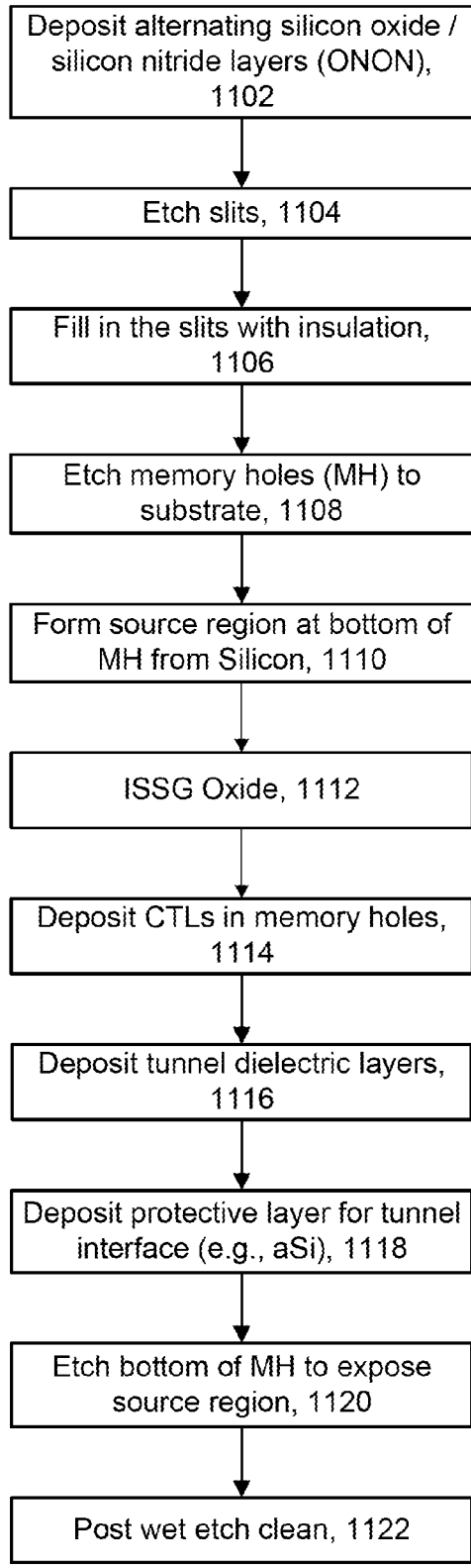
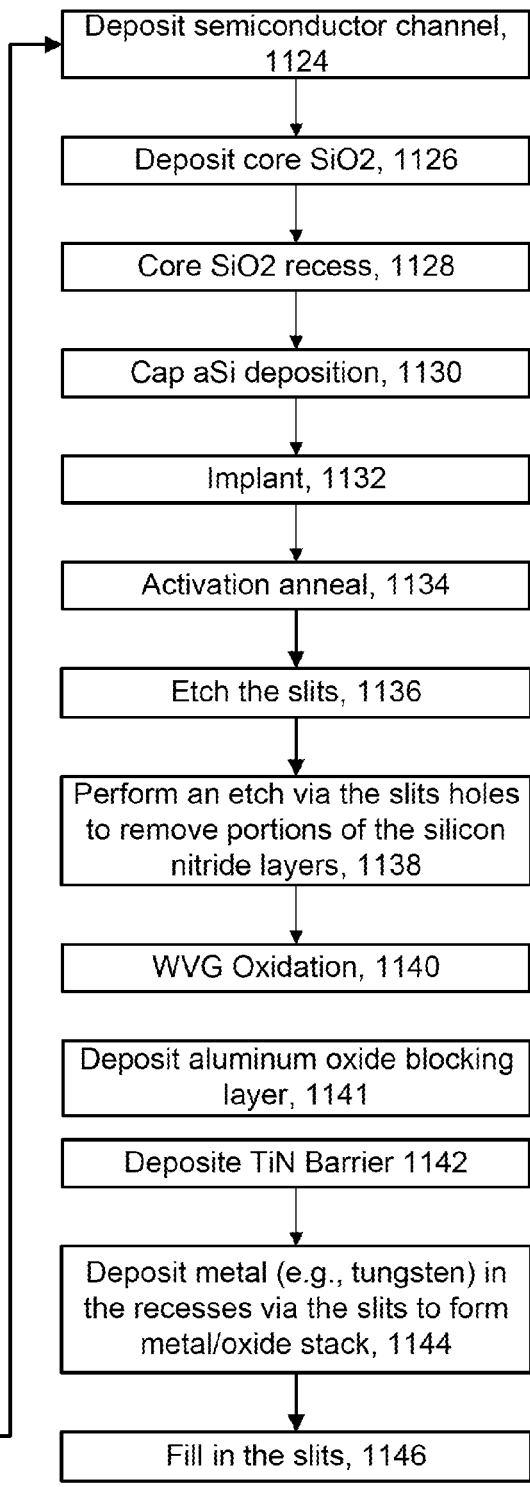
Fig. 11

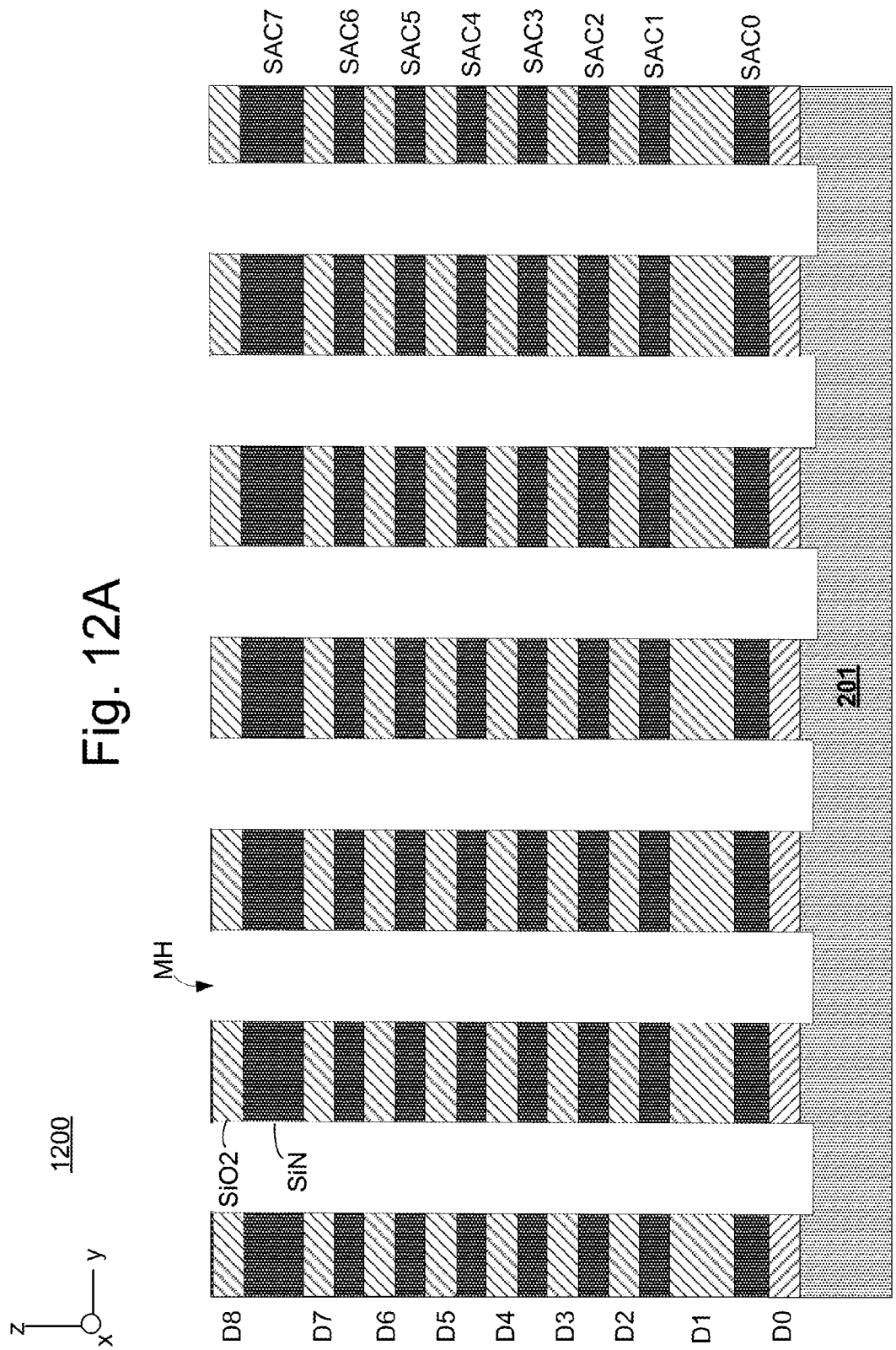

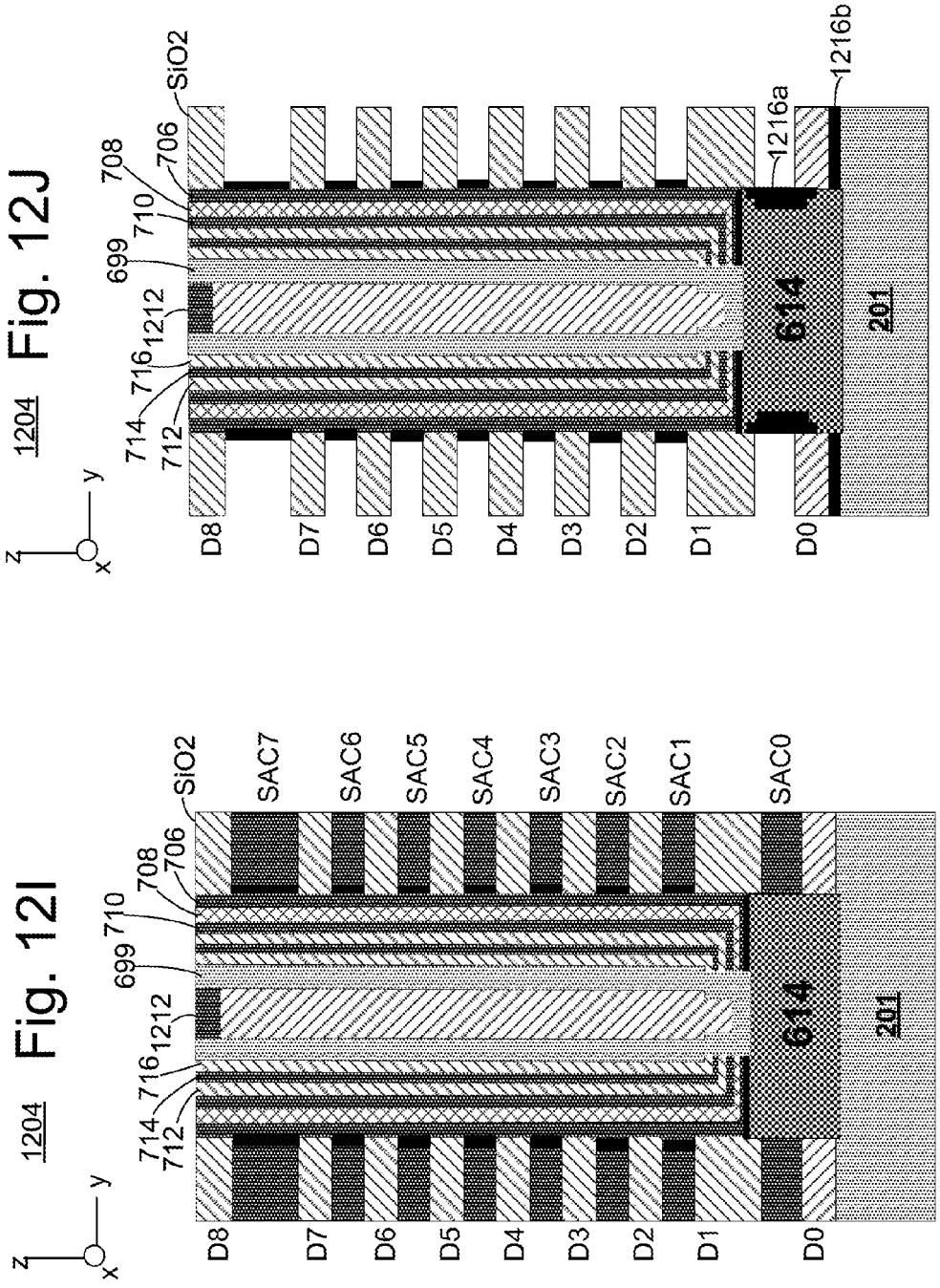

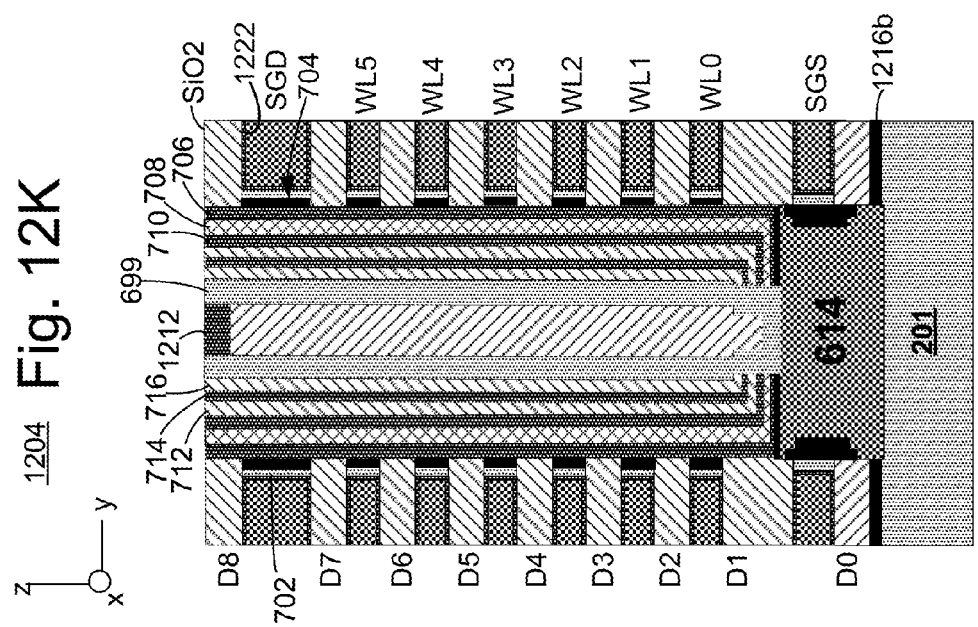

METHOD OF FORMING MEMORY CELL WITH HIGH-K CHARGE TRAPPING LAYER

BACKGROUND

The present technology relates to non-volatile memory.

One type of non-volatile memory cell uses a charge trapping region to store information. As one example, the memory cell is a transistor that has a stack of films adjacent to the memory cell channel. Moving in a direction away from the channel, there is a tunnel dielectric, a charge trapping region, a blocking oxide, and a control gate. The memory cell is programmed by injecting electrons from the memory cell channel into the charge trapping region, where they are trapped and stored. This stored charge then changes the threshold voltage of the cell in a manner that is detectable. The cell may be erased by injecting holes from the channel into the charge trapping region where they recombine with electrons, and thereby "cancel" or reduce the stored charge. Cells may be also erased by extracting electrons from the charge trapping region, e.g., by applying an electric field making electrons tunnel from the charge trapping region to the channel. Cells may be erased by a combination of the two mechanisms above.

BRIEF DESCRIPTION OF THE DRAWINGS

Like-numbered elements refer to common components in the different figures.

FIG. 1 is a circuit representation of a NAND string.

FIG. 4C depicts a cross-sectional view of a block of a 3D non-volatile memory device having straight strings.

FIG. 5A depicts a close-up view of the region 669 of the column C0 of FIG. 4C, showing a drain-side select transistor SGD0 and a memory cell MC6,0.

FIG. 5B depicts a cross-sectional view of the column C0 of FIG. 5A.

FIGS. 6A and 6B depict an alternative embodiment to that of FIGS. 5A and 5B.

FIG. 7B shows electrical connections between of one embodiment the semiconductor channel and a bit line and a source line.

FIG. 8A is an energy band diagram of one embodiment of a memory cell.

FIG. 8D is an energy band diagram for one embodiment of a memory cell showing improved data retention.

FIG. 9B is an energy band diagram of one embodiment of a memory cell in which two of the charge storage layers are a high-k dielectric, but one of the charge storage layers is a mid-k dielectric.

FIG. 9C is an energy band diagram of one embodiment of a memory cell in which three of the charge storage layers are a high-k dielectric.

FIG. 9D is an energy band diagram of one embodiment of a memory cell in which three of the charge storage layers are a high-k dielectric.

FIG. 11 is a flowchart of one embodiment of a process of fabricating a 3D memory array in which the charge storage region comprises a high-k dielectric.

FIGS. 12A-12K depict results after various steps of FIG. 11.

DETAILED DESCRIPTION

Figure 2A:
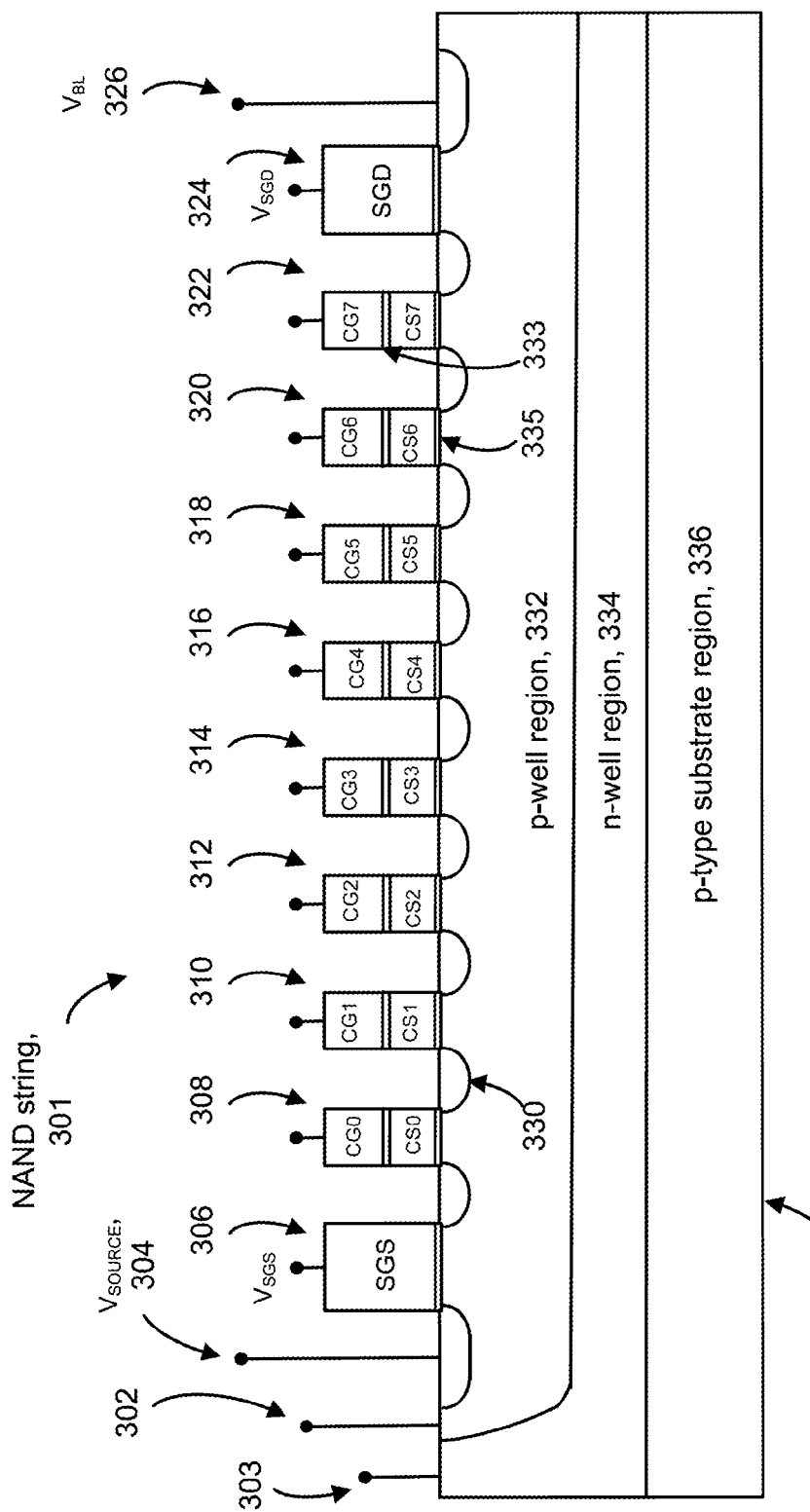
FIG. 2A depicts a cross-sectional view of a 2D NAND string formed on a semiconductor substrate.

Disclosed herein is a non-volatile storage device with memory cells having a high-k charge storage region, as well as methods of fabrication. The non-volatile storage device is 2D NAND, in one embodiment. The non-volatile storage device is 3D NAND, in one embodiment.

A NAND string has a number of memory cells in series. Each memory cell has a charge storage region. A tunnel dielectric film resides between the charge storage region and the NAND channel. The charge storage region comprises several layers of material, in one embodiment. At least one of the materials is a high-k dielectric. A high-k dielectric, as defined herein, is a material having a dielectric constant greater than 7.9. In one embodiment, the middle of three layers in the charge storage region is a high-k dielectric. The outside two layers of the charge storage region are also a high-k dielectric, in one embodiment. Note that there may be four or more layers (or films) in the charge storage region.

The outside two layers of the charge storage region are a mid-k dielectric (with the middle layer being a high-k dielectric), in one embodiment. A mid-k dielectric, as defined herein, is a material having a dielectric constant of less than or equal to 7.9, but greater than 3.9. A low-k dielectric, as defined herein, is a material having a dielectric constant of less than or equal to 3.9. Note that if the middle charge storage layer is a high-k dielectric, then the outer two charge storage layers may be made quite thin.

It has been proposed to use silicon nitride as the only material for the charge storage region in a non-volatile memory cell. Silicon nitride may have a relatively low trap density. If the silicon nitride is too thin, it may not be able to trap and hold charges. Also, high temperatures may make data retention worse for thin layers of silicon nitride. The silicon nitride could be made thicker to overcome these limitations. However, the added thickness has drawbacks. A thicker silicon nitride layer will increase the overall thickness of the memory film. Also, gate capacitance (and capacitive coupling to the channel) may decrease with a thicker silicon nitride layer, leading to lower cell current and lower overall cell performance.

The high-k layer(s) in the charge storage region of embodiments disclosed herein has a higher trap density as compared to $Si_3N_4$. The higher trap density allows for greater charge storage capacity. This allows the charge storage region to be scaled down in thickness. Also, a charge storage region having a high-k dielectric has better capacitive coupling than a $Si_3N_4$ charge storage region of the same thickness.

High-k dielectrics in the charge storage region enhance capacitive coupling with the memory cell channel, in one embodiment. This can improve memory cell current, program speed, and erase speed for the same program and erase voltages. Alternatively, this can allow a reduction in operating voltages with the same memory cell current and program and erase speeds. It follows that a smaller reduction in operating voltages could be used while still providing for some improvement in memory cell current, program speed, and erase speed. Additionally, reduction in operating voltages will allow for better vertical scaling of 3D NAND, as well as CMOS scaling for smaller chip size.

In some embodiments disclosed herein, band gap engineering is used to optimize program efficiency, erase efficiency, and/or data retention.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 1 is a circuit representation of a NAND string. The NAND string depicted in FIG. 1 includes four memory cell transistors 100, 102, 104 and 106 in series and sandwiched between (drain side) select transistor 120 and (source side) select transistor 122.

Select transistor 120 connects the NAND string to a bit line 111. Select transistor 122 connects the NAND string to source line 128. Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 1600CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Typically, each block may have a common source line. There may be a separate source line for each block. Bit lines may be shared with multiple NAND strings. The bit line may be connected to a sense amplifier.

The charge storage region (CSR) may utilize a non-conductive dielectric material to store charge in a non-volatile manner. The charge storage region comprises several (e.g., three, four, or more) layers (or films) of different dielectric materials, in one embodiment. At least one of the charge storage layers is a high-k material, in one embodiment. In one embodiment, one or more of the charge storage layers is a mid-k dielectric.

The memory cell transistor has a tunnel dielectric between the charge storage region and the channel of the memory cell transistor. Electrons can tunnel from the channel to the CSR during programming. The tunnel dielectric may include one or more different dielectric materials. In one embodiment, the tunnel dielectric comprises a single layer of silicon oxide (e.g., $SiO_2$). In one embodiment, the tunnel dielectric comprises a triple layer of silicon oxide (e.g., $SiO_2$), silicon nitride (e.g., $Si_3N_4$), and silicon oxide (e.g., $SiO_2$). The tunnel dielectric is not limited to these example materials.

The memory cell transistor has a control gate dielectric between the charge storage region and the control gate. The control gate dielectric may have one or more dielectric materials. The control gate dielectric is sometimes referred to as a "blocking layer" or "blocking oxide". The control gate dielectric region comprises $Al_2O_3$ as a blocking layer, which blocks un-desirable tunneling of electrons from CSR to control gate or from control gate to CSR, in one embodiment. The control gate dielectric could instead of, or in addition to, the $Al_2O_3$ comprise a silicon oxide (e.g., $SiO_2$) layer. The control gate dielectric is not limited to these example materials.

The cell is programmed by injecting electrons from the cell channel (or NAND string channel) into the CSR, where they are trapped and stored in a limited region. This stored charge then changes the threshold voltage of the cell in a manner that is detectable. The cell may be erased by injecting holes from the channel into the CSR where they recombine with electrons, and thereby "cancel" or reduce the stored charge. Cells may be also erased by extracting electrons from the CSR, e.g., by applying an electric field making electrons tunnel from the CSR to the channel. Cells may be erased by both these mechanisms combined.

Figure 2B:
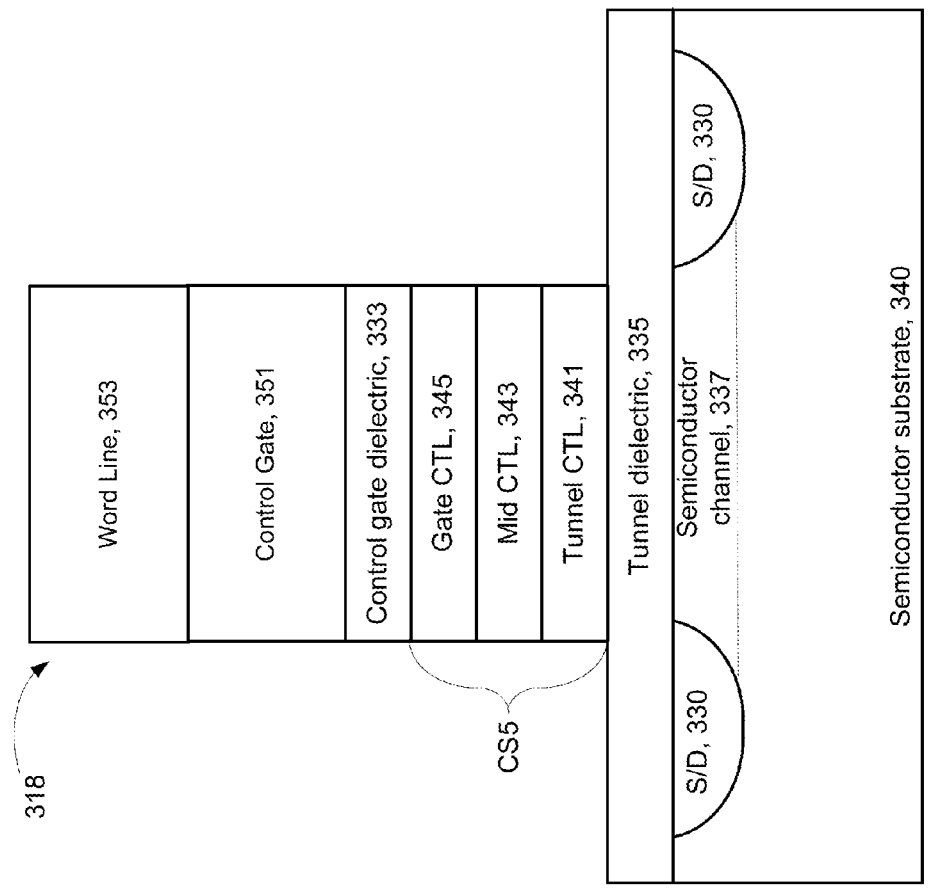
FIG. 2B shows further details of one embodiment of memory cell 318 from FIG. 2A.

FIG. 2A depicts a cross-sectional view of a 2D NAND string formed on a semiconductor substrate. The view is simplified and not to scale. FIG. 2B shows details of one embodiment of one of the memory cells 318. The 2D NAND string 301 includes a source-side select gate 306, a drain-side select gate 324, and eight non-volatile storage elements 308, 310, 312, 314, 316, 318, 320 and 322, formed on semiconductor substrate 340. A number of source/drain regions, one example of which is source/drain region 330, are provided on either side of each storage element and the select gates 306 and 324.

Each memory cell includes a charge storage region (CS0-CS7) and a control gate (CG0-CG7). Each charge storage region may comprise several dielectric layers (or films) in a stack between the tunnel dielectric and the control gate. FIG. 2B shows that memory cell 318 has tunnel charge trapping layer (CTL) 341, middle CTL 343, and gate CTL 345 within charge storage region CS5. In one embodiment, each charge storage region comprises at least one high-k material. In one embodiment, at least the middle charge trapping layer 343 is a high-k dielectric. There may be more than three layers of dielectric materials. The same dielectric material could be used in more than one layer. Further details are discussed below.

A semiconductor channel 337 is labeled between the two source/drain regions 330. As is well understood, during operation of a transistor, a channel forms between the two source/drain regions 330. Herein, the term "semiconductor channel" or the like refers to the semiconductor region in a memory cell transistor in which a channel typically forms during operation. The semiconductor channel 337 may be formed from various types of semiconductors, including but not limited to, silicon, germanium, or a III-V compound.

Each memory cell also has a tunnel dielectric 335 between the charge storage region and the semiconductor channel 337. In one embodiment, the tunnel dielectric 335 comprises a layer of silicon oxide (e.g., $SiO_2$). In one embodiment, the tunnel dielectric 335 consists of a single layer of silicon oxide (e.g., $SiO_2$). That is, the tunnel dielectric 335 is not required to have multiple layers of different dielectric materials. However, multiple layers of different dielectric materials are one possibility for the tunnel dielectric 335.

Each memory cell also has a control gate dielectric 333 between the charge storage region and the control gate 351. The control gate dielectric 333 may also be referred to as a "blocking oxide." The control gate dielectric 333 may include one or more different dielectric materials. The control gate dielectric 333 may have one or more dielectric materials. The control gate dielectric 333 is sometimes referred to as a "blocking layer" or "blocking oxide". The control gate dielectric 333 comprises $Al_2O_3$ as a blocking layer, which blocks un-desirable tunneling of electrons from CSR to control gate or from control gate to CSR, in one embodiment. The control gate dielectric 333 could instead of, or in addition to, the $Al_2O_3$ comprise a silicon oxide (e.g., $SiO_2$) layer. The control gate dielectric is not limited to these example materials.

The control gate 351 could be formed from metal or another conductive material such as heavily doped polysilicon. In the example of FIG. 2B, the control gate 351 and the word line 353 are formed from two different materials. The control gate 351 is heavily doped polysilicon in one embodiment. The control gate 351 can be silicide, e.g., tungsten silicide, nickel silicide or other metal silicide, in one embodiment. The word line 353 is tungsten, or some other metal, in this embodiment. However, the control gate 351 and word line 353 may be formed from the same material. For example, both regions 351, 353 could be formed from a metal.

In one approach, the substrate 340 employs a triple-well technology which includes a p-well region 332 within an n-well region 334, which in turn is within a p-type substrate region 336. The 2D NAND string and its non-volatile storage elements can be formed, at least in part, on the p-well region.

A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. Voltages can be applied to the control gates of the memory cells during various operations (read, program, erase). $V_{SGS}$ and $V_{SGD}$ are applied to the select gates SGS 306 and SGD 324, respectively.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

Figure 2C:
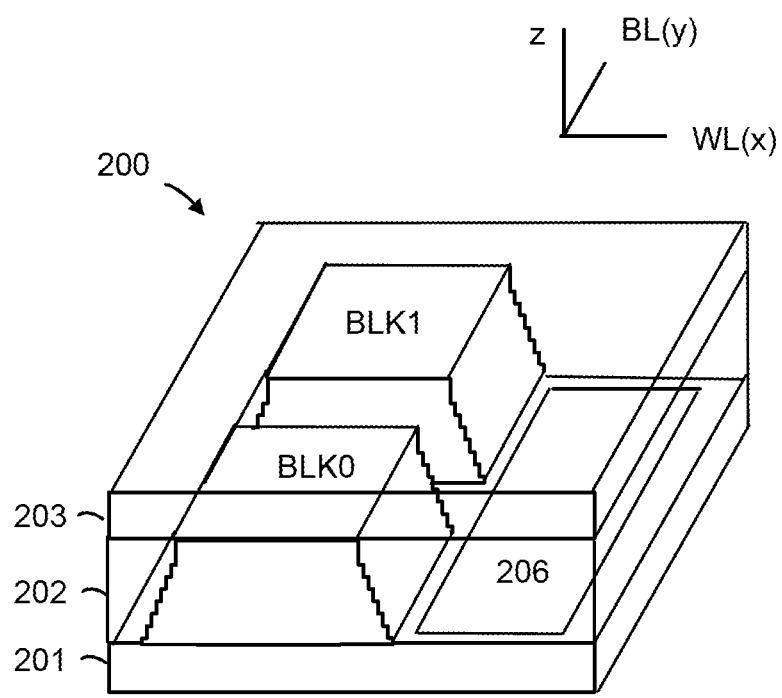
FIG. 2C is a perspective view of a 3D stacked non-volatile memory device.

The following discussion of an example 3D memory device is presented as one possible architecture in which embodiments may be practiced. These examples include a 3D NAND memory device. FIG. 2C is a perspective view of a 3D stacked non-volatile memory device. The 3D memory device 200 includes a substrate 201. In one embodiment, the substrate 201 is formed from a semiconductor such as silicon. The substrate 201 may be formed from a semiconductor wafer. The substrate 201 has a major surface that extends in what will be referred to herein as a horizontal plane, in one embodiment. In FIG. 2C, the x-axis and y-axis define the horizontal plane.

On the substrate 201 are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3A:
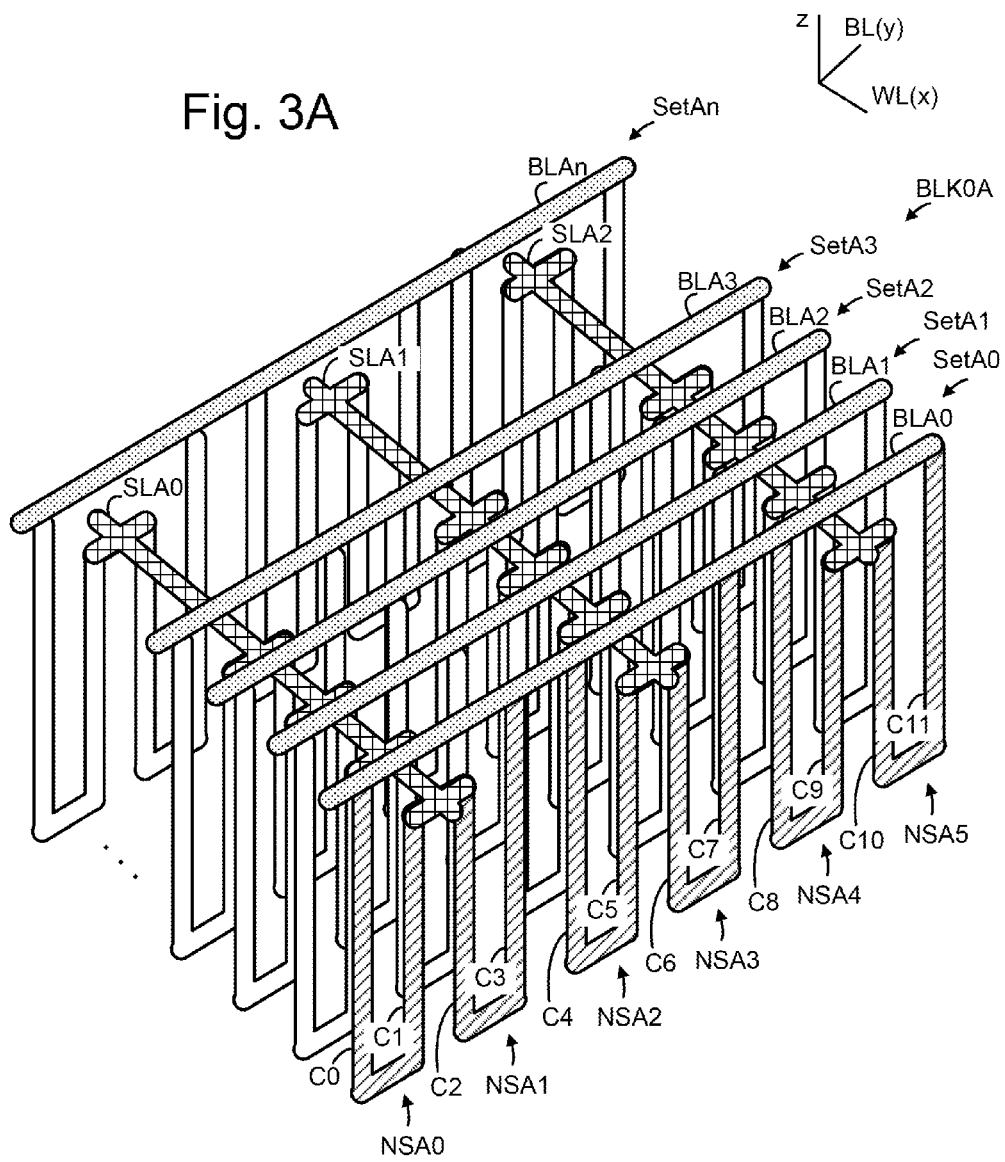
FIG. 3A depicts an embodiment of block BLK0 of FIG. 2C which includes U-shaped NAND strings.

In one embodiment, NAND strings have a U-shape. In another embodiment, NAND strings have a straight shape. FIG. 3A depicts an embodiment of block BLK0 of FIG. 2C which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, . . . , BLAn). In one embodiment, each NAND string has a drain side select transistor that is able to connect/disconnect the NAND string from its bit line. The drain side select transistors in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 3B:
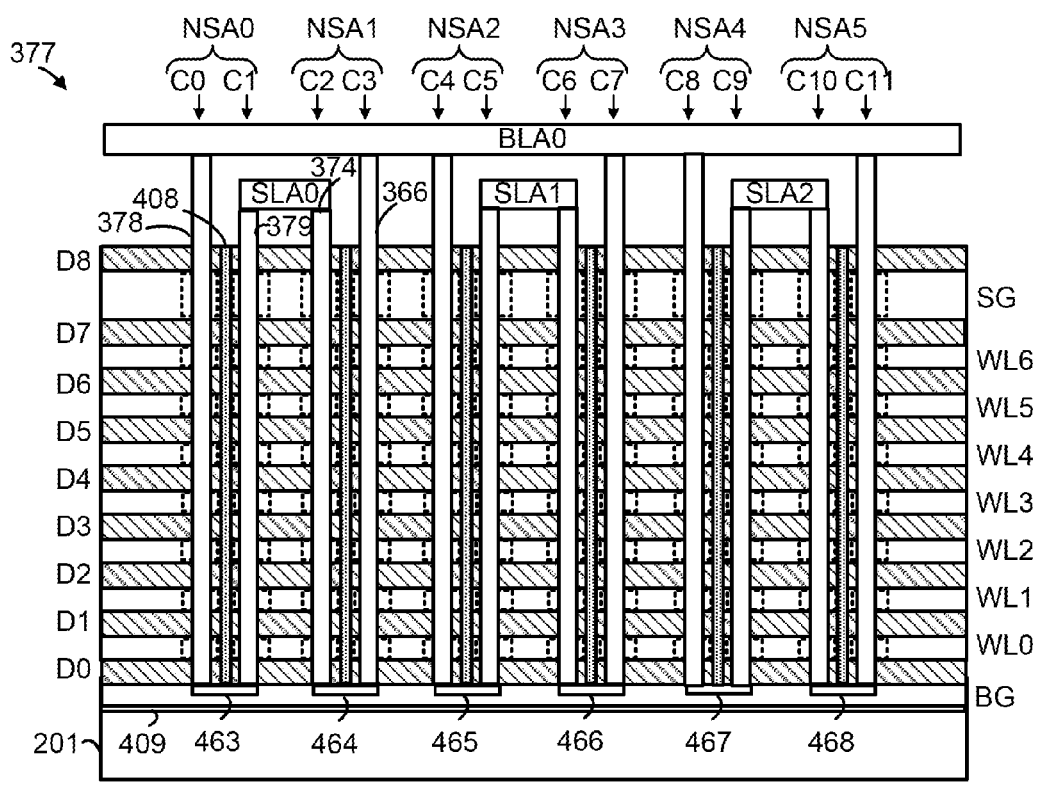
FIG. 3B depicts a cross-sectional view of a block of the 3D non-volatile memory device of FIG. 3A of SetA0 of NAND strings of FIG. 3A.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 201, an insulating film 409 on the substrate 201, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate when properly biased, allows the back gate transistor to connect, through the pipe connection, thus connecting the two columns of each U-shaped NAND string. For example, NSA0 includes columns C0 and C1 and connecting portion 463. NSA0 has a drain end 378 and a source end 379. NSA1 includes columns C2 and C3 and connecting portion 464. NSA1 has a drain end 366 and a source end 374. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 379 and 374 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 377 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLAT, SLA2 are also depicted. A portion of the bit line BLA0 is also depicted.

Short dashed lines depict memory cells (or memory cell transistors) and select transistors, as discussed further below. Thus, FIG. 3B shows strings (e.g., NAND strings) of non-volatile storage elements formed above the substrate 201 in multiple physical levels of a three-dimensional memory array. Each of the strings has an active area comprising a channel that extends vertically through the physical levels. Each string comprises non-volatile storage elements and a drain side select transistor in the SG layer.

Figure 4A:
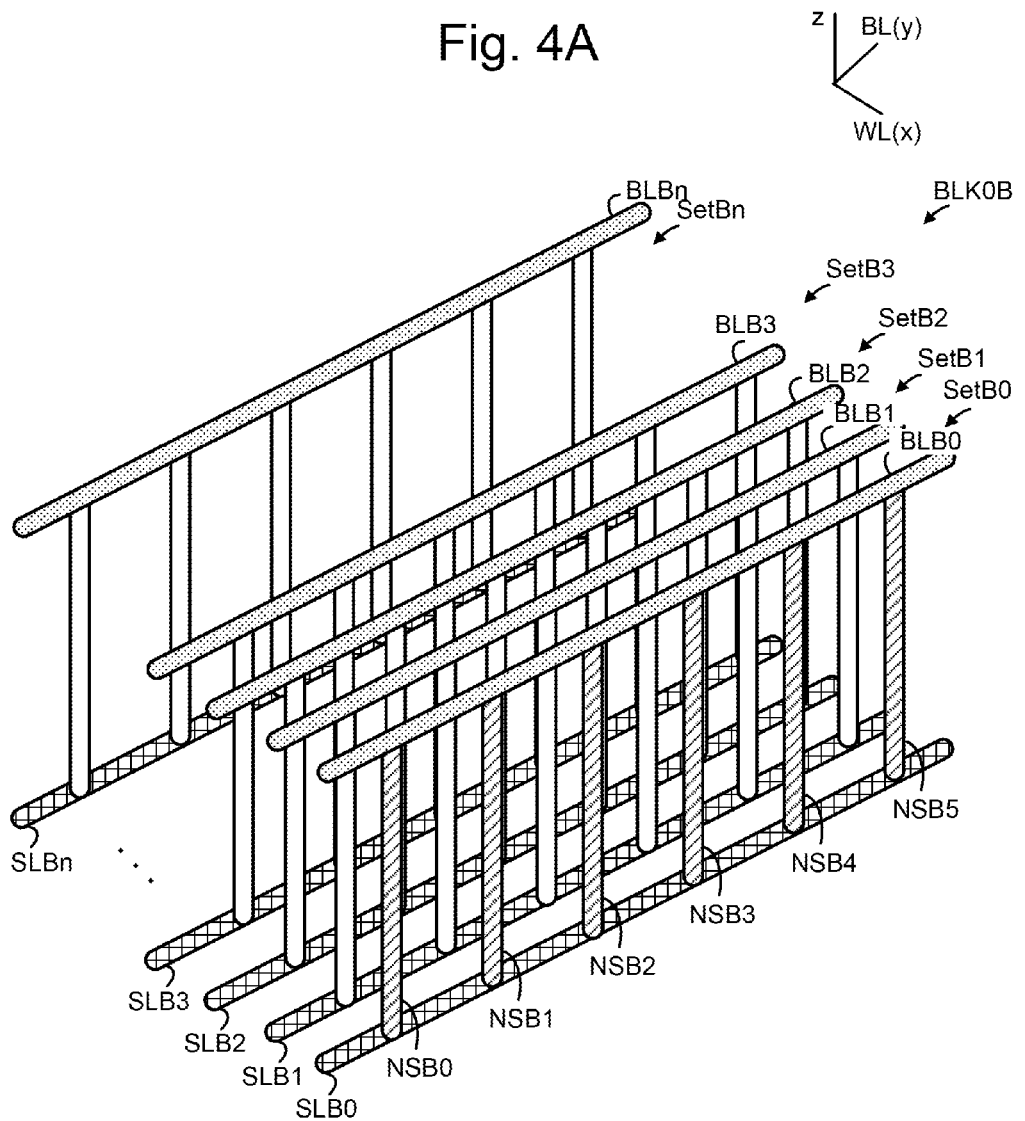
FIG. 4A depicts an embodiment of block BLK0 of FIG. 2C which includes straight NAND strings.

FIG. 4A depicts an embodiment of block BLK0 of FIG. 2C which includes straight NAND strings. The block BLK0B includes straight NAND strings arranged in sets (SetB0, SetB1, SetB2, SetB3, . . . , SetBn, where there are n+1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 4B:
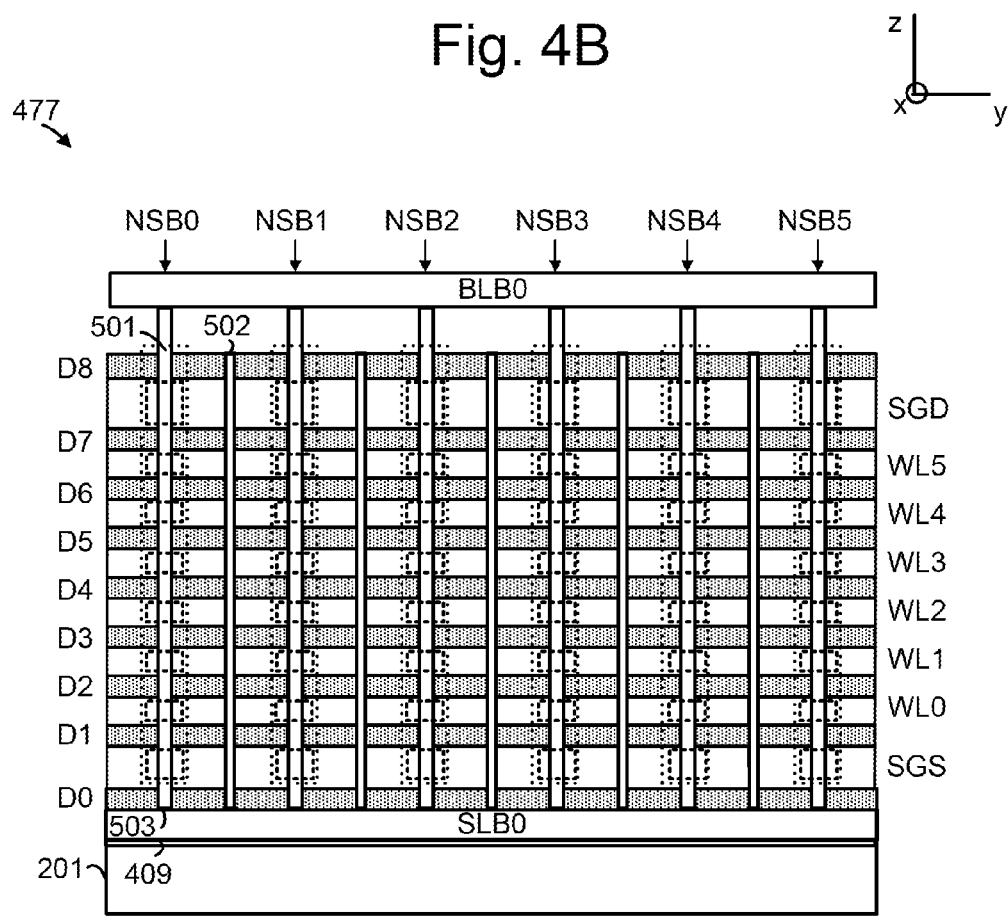
FIG. 4B depicts a cross-sectional view of a block of the 3D non-volatile memory device of FIG. 4A having straight strings.

FIG. 4B depicts a cross-sectional view of a block of the 3D non-volatile memory device of FIG. 4A having straight strings. The view of a portion of setB0 of NAND strings of FIG. 4A. Columns of memory cells corresponding to NAND strings NSB0 to NSB5, respectively, are depicted in the multi-layer stack. The stack 477 includes a substrate 201, an insulating film 409 on the substrate, and a portion of a source line SLB0. Additional straight NAND strings in a sub-block may extend in front of and in back of the NAND strings depicted in the cross-section, e.g., along the x-axis. The NAND strings NSB0 to NSB5 may each be in a different sub-block, but are in a common set of NAND strings (SetB0). NSB0 has a source end 503 and a drain end 501. A slit 502 is also depicted with other slits. It is not required that there be a slit 502 between each pair of strings, as depicted. For example, slits could be used to separate blocks. Slits could be placed between several groups of strings within a block. In this case, a group of strings separated by slits within a block may be referred to as a "finger". There may be several fingers within a block. A portion of the bit line BLB0 is also depicted. Dashed lines depict memory cells and select transistors, as discussed further below.

FIG. 4C depicts a cross-sectional view of a block of another embodiment of a 3D non-volatile memory device having straight strings. This embodiment differs from that of the embodiment of FIG. 4B in that the source end 503 of the NAND strings does not directly contact the source line. Instead, the source end 503 of the NAND string is in direct physical contact with the semiconductor substrate 201. The semiconductor substrate 201 may be silicon. The source line is not depicted in FIG. 4C. A region 669 of the stack that includes column CB0 is shown in greater detail in FIG. 5A.

FIG. 5A depicts a close-up view of region 669, which includes column CB0 of FIG. 4C, showing a drain-side select transistor SGD0 and a memory cell MC6,0 (also referred to as "memory cell transistor"). FIG. 5B depicts a cross-sectional view of the column CB0 of FIG. 5A. The region 669 shows portions of the dielectric layers D6 to D8 and the conductive layers WL6 and SGD.

Each column includes a number of regions, 695 696, 697, 698, 699. Region 696 is a control gate dielectric (also referred to as a "blocking oxide"). The portion of word line WL6 that is adjacent to region 696 serves as the control gate for memory cell MC6,0. Region 697 is the charge storage region (CSR). Region 698 is the tunnel dielectric region. Region 699 is the semiconductor channel. Region 695 is an optional core dielectric.

A variety of techniques could be used to form the regions, 695 696, 697, 698, 699. One technique is to drill memory holes into horizontal layers of some material and then fill those memory holes. Note that the memory holes are not necessarily drilled into the horizontal material depicted in FIG. 5A. One option is to first have a sacrificial material instead of the conductive layers WL6 and SGD. After drilling the memory holes and filling the memory holes to form the column, the sacrificial material can be replaced with conductive material for WL6 and SGD. Some of the layers might be formed using atomic layer deposition. For example, a block oxide (or blocking layer) can be deposited on vertical sidewalls of the memory hole as layer 696, several dielectric layers can be deposited as layer 697, and a tunnel dielectric (or tunneling layer) can be deposited as layer 698. It is not required that all of these layers be formed in the column. An example is discussed below in FIG. 6A in which the blocking layer is not a part of the column.

The charge storage region 697 comprises several layers of different materials, in one embodiment. The charge storage region 697 is formed from at least one high-k material, in one embodiment. Further details are discussed below.

The block oxide layer 696 and the tunnel dielectric layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel dielectric layer 698 comprises a stack of oxide, nitride and oxide films. Additional memory cells are similarly formed throughout the columns.

When a memory cell such as depicted in FIG. 5A is programmed, electrons are stored in a portion of the charge trapping layer which is associated with the memory cell. For example, electrons are represented by "-" symbols in the charge trapping region 697 for MC6,0 in FIG. 5A. These electrons are drawn into the charge trapping region from the semiconductor channel 699, and through the tunnel dielectric 698. The threshold voltage of a memory cell is increased in proportion to the amount of stored charge.

During one embodiment of an erase operation, a voltage in the NAND channel may be raised due to GIDL, while a voltage of one or more selected word line layers floats. GIDL may occur due to high potential difference between bit line bias and bias applied on SGD to the control gate of the drain side transistor, and similarly, between source line bias and bias applied on SGS to the control gate of the source side transistor. The voltage of the one or more selected word line layers is then driven down sharply to a low level such as 0 V to create an electric field across the tunnel dielectric which may cause holes to be injected from the memory cell's body to the charge trapping region and recombine with electrons. Also, electrons can tunnel from the charge trapping region to the positively biased channel. One or both of these mechanisms may work to remove negative charge from the charge trapping region and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel dielectric is relatively small, and no, or very little, hole tunneling will occur. If word lines are floated, they will be electrically coupled to the NAND channel. As a result their potential will rise resulting in low potential difference between NAND channel and respective word lines. Memory cells of the unselected word lines will experience little or no Vth downshift, and as a result, they will not be erased. Other techniques may be used to erase.

FIGS. 6A and 6B depict an alternative embodiment to that of FIGS. 5A and 5B. FIG. 6A shows similar layers D6, WL6, D7, SGD, and D8, as were depicted in FIG. 5A. A memory cell MC6,0 and a drain side select transistor SGD0, are shown. Note that in this embodiment, the column CB0 has charge trapping region 697, tunnel dielectric layer 698, and the semiconductor channel 699. However, in the embodiment of FIGS. 6A and 6B, the blocking layer 696 is located outside of the column CB0. The blocking layer 696 has a portion that is in direct contact with charge trapping region 697. The blocking layer 696 has an optional portion above and below the word line 605. This optional portion results from one embodiment of the fabrication process in which after forming the column, sacrificial material is removed where the word line and blocking layer are to be formed. Then, the blocking layer 696 is deposited, followed by depositing the word line 605. FIG. 6B shows a cross section of FIG. 6A along line 607.

Note that the size of the memory holes may impact the operating voltages due to what may be referred to as "the curvature effect". The smaller the radius of the memory hole, the greater the curvature. Greater curvature may lead to higher electric fields. Thus, if the radius of the memory hole is increased, this may lead to lower electric fields. These lower electric fields may lead to the need for higher operating voltages. Therefore, if the radius of the memory hole is larger, higher operating voltages may be needed. The high-k film in the charge trapping region 697 of embodiments disclosed herein allows gate to channel capacitive coupling to increase, and the device to be operated with smaller operating voltages without compromising cell performance. Cell performance may even be improved. Thus, utilizing high-k film(s) in the charge trapping region may allow reducing operating voltages while improving cell performance and reliability.

Figure 7A:
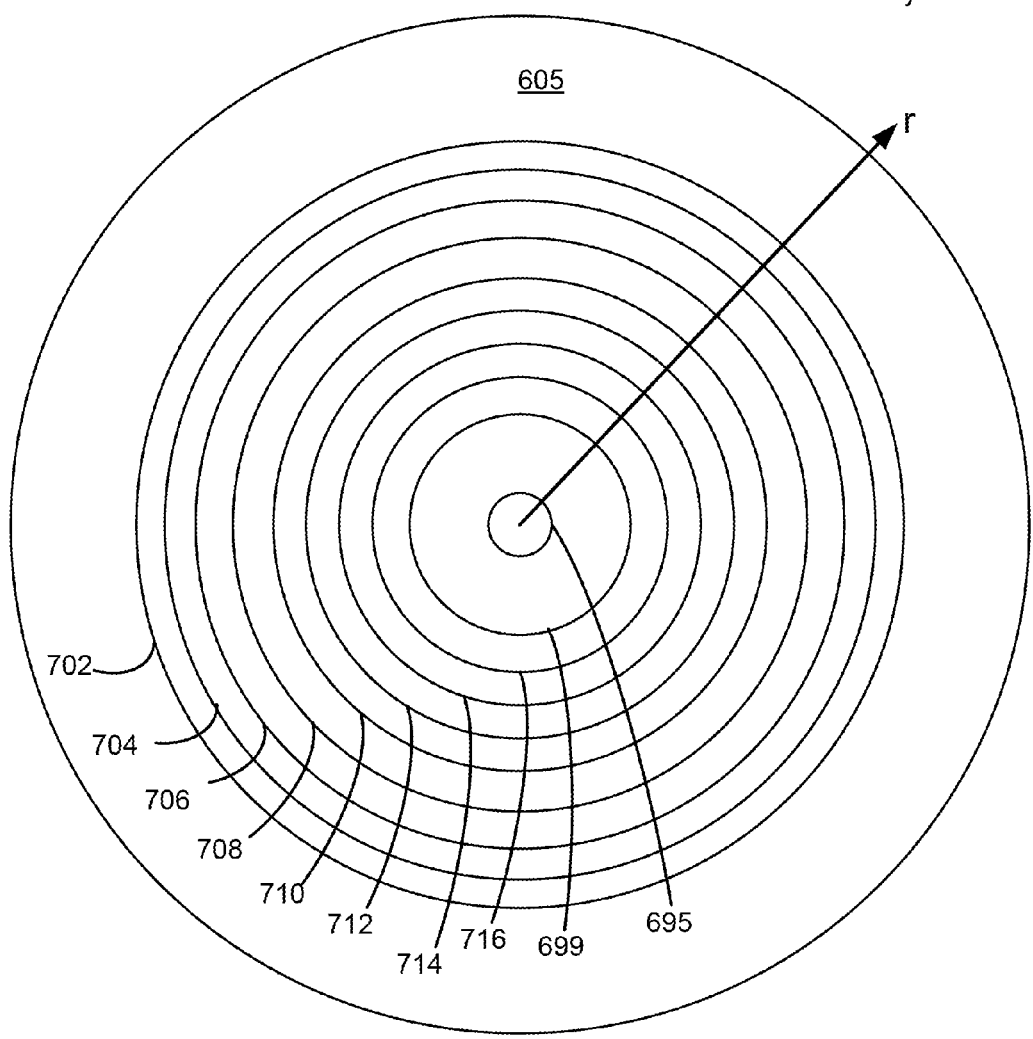
FIG. 7A shows further details of one embodiment of the blocking layer, the charge trapping layer, the tunnel dielectric layer, and semiconductor channel.

FIG. 7A shows further details of one embodiment of the blocking layer 696, the charge trapping layer 697, the tunnel dielectric layer 698, and semiconductor channel 699. The diagram is a cross section in the x-y plane, and shows a cross section of a column and the material just outside of the column. A radial axis (r) is depicted. The cross section may be of a memory cell, such as the examples of FIGS. 5B and 6B. The outermost region is the word line 605 (which serves as the control gate of the memory cell). In order from outside in, there is blocking Al$_2$O$_3$ layer 702, blocking SiO$_2$ layer 704, first (or gate) charge trapping layer 706, second (or middle) charge trapping layer 708, third (or tunnel) charge trapping layer 710, tunnel SiO$_2$ layer 712, tunnel SiN layer 714, tunnel SiO$_2$ layer 716, semiconductor channel 699, and core dielectric 695.

Together, blocking Al$_2$O$_3$ layer 702 and blocking SiO$_2$ layer 704 form one embodiment of the blocking layer 696. First charge trapping layer 706, second trapping layer 708, and third trapping layer 710 are one embodiment of the charge trapping region 697. As one example, first charge trapping layer 706 is silicon nitride (e.g., Si$_3$N$_4$), second charge trapping layer 708 is hafnium oxide (HfO$_2$), third charge trapping layer 710 is silicon nitride (e.g., Si$_3$N$_4$). Another examples for layers 706, 708, 710 respectively include: silicon nitride (e.g., Si$_3$N$_4$), zirconium oxide (ZrO$_2$), silicon nitride (e.g., Si$_3$N$_4$). Table I lists a few combinations for the charge trapping layers.

TABLE I

| Layer 710 | Layer 708 | Layer 706 |
|---|---|---|
| Si$_3$N$_4$ | High-k | Si$_3$N$_4$ |
| Si$_3$N$_4$ | High-k | La$_2$O$_3$ |
| La$_2$O$_3$ | High-k | Si$_3$N$_4$ |
| La$_2$O$_3$ | High-k | La$_2$O$_3$ |
| LaAlO$_3$ | High-k | La$_2$O$_3$ |

In Table I, the High-k material for middle layer 708 could include, but is not limited to, HfO$_2$, ZrO$_2$, Y$_2$O$_3$, La$_2$O$_3$, ZrSiO$_4$, BaZrO$_2$, BaTiO$_3$, T$_2$O$_5$, Zr$_2$SO$_3$. Note that example materials for layers 706 and 710 include both mid-k and high-k materials.

In some embodiments, layers 706/708/710 have a high-low-high conduction band offset. In some embodiments, layers 706/708/710 have a low-high-low valence band offset. In one embodiment, properties of the high-k material such as energy band offsets are modulated by, for example, using oxynitride options. Examples include, but are not limited to, HfON, ZrON, and YON. Further details of the energy band offsets are discussed below.

In one embodiment, one or more of the charge trapping layers, 706, 708, 710 is implanted with metallic or other dopants (e.g., As, Ge, Zn). This may increase the ability of the charge trapping layer to store charge.

The charge trapping layers 706, 708, 710 could be amorphous, poly-crystalline, or mono-crystalline. Crystallizing a charge trapping layer may increase the k-value.

Example thicknesses of the charge trapping layers are 2 to 3 nm for charge trapping layer 710, 4 to 6 nm for charge trapping layer 708, and 2 to 3 nm for charge trapping layer 706. As one specific example, 2 to 3 nm for silicon nitride in charge trapping layer 710, 4 to 6 nm for a high-k dielectric in charge trapping layer 708, and 2 to 3 nm for silicon nitride in charge trapping layer 706. The thickness numbers above are provided for illustration only; the thicknesses of each of the layers 706, 708, 719 may be smaller or bigger. Also, the combination of thicknesses can be different than these examples.

Together, tunnel SiO$_2$ layer 712, tunnel SiN layer 714, and tunnel SiO$_2$ layer 716 form one embodiment of the tunnel dielectric 698. In one embodiment, tunnel SiN layer 714 is replaced with SiON.

As was discussed above with respect to FIG. 2B, a 2D memory cell may also have a charge trapping region. The various materials and processing techniques that were discussed in connection with FIG. 7A for layers 710, 708, and 706 for the 3D cell may also be used for the tunnel CTL 341, the mid CTL 343, and the gate CTL 345, respectively, for a 2D memory cell, such as one depicted in FIG. 2B.

FIG. 7B shows electrical connections between of one embodiment the semiconductor channel 699 and a bit line 111 and a source line 128. A single column 806 is depicted. The column 806 has charge storage region 697, tunnel dielectric 698, semiconductor channel 699, and core 695. On one side of the column 806, several word lines (WL0-WL5), SGS, and SGD are depicted. Also, a blocking layer 696 is associated with each of SGS, WL0-WL5, and SGD. Note that the word lines and blocking layer may completely surround the column 806, as previously shown and described. However, this is not depicted in FIG. 7B so as to not obscure the diagram. Also, the dielectric layers that alternate with the word line layers are not depicted.

The drain end 501 of the core 695 has a cap 1212, which is doped semiconductor for low resistance. The cap 1212 and drain end of the semiconductor channel 699 are in contact with a bit line contact 811. The bit line contact 811 is formed from metal, in one embodiment. Likewise, bit line 111 is formed from metal, in one embodiment. Example metals for the bit line and bit line contact include, but are not limited to, titanium, tungsten, copper, aluminum, and molybdenum.

FIG. 7B also depicts a source side select transistor. The source line, SGS, which may be formed from metal, serves as the control gate of the source side select transistor. The portion of the blocking layer 696 that is between SGS and the body 802 serves as a gate dielectric of the source side select transistor. The body 802 of the source side select transistor is formed from crystalline silicon, in one embodiment. The source side select transistor body 802 is in direct physical contact with the substrate 201, which may be formed from silicon. The portion of the substrate that is adjacent to the body 802 may be p-type. The channel 812 of the source side select transistor has a vertical component in the column 806 and a horizontal component in the substrate 201. A gate oxide 1216b is depicted on the surface of the substrate 210. This may serve as a portion of the gate oxide of the source side select transistor.

Source 890 may act as the source of the source side select transistor. The source 890 may be an n+ region. Thus, source 890 can be formed by heavily doping the silicon substrate 201. The n-type impurity can be phosphorous (P), arsenic (As) or a combination of both, for example.

The source line 128 is in electrical contact with the source 890. The source line 128 is formed from metal, in one embodiment. Example metals include, but are not limited to, titanium, tungsten, copper, aluminum, and molybdenum. The source line 128 can be electrically connected to the NAND string channel 699 by the action of the source side select transistor, when a respective bias is applied to the SGS line. Note that the source line 128 may serve as a common source line for a number of NAND strings. For example, all of the NAND strings depicted in FIG. 4C may share a common source line.

FIG. 8A is an energy band diagram of one embodiment of a 3D memory cell. The diagram is consistent with the regions depicted in FIG. 7A. The energy band diagram has a conduction band lower edge 801 and a valence band upper edge 803. The conduction band lower edge 801 will be referred to simply as the "the conduction band". Likewise, the valence band upper edge 803 will be referred to simply as the "the valence band". FIG. 8A shows the condition for thermodynamic equilibrium and when no bias is applied across the memory cell. (Likewise, FIGS. 8D and 9A-9E show the condition for thermodynamic equilibrium and when no bias is applied across the memory cell). The band diagrams throughout this disclosure are depicted using known material band information, such as band gap and conduction and valence band offsets with respect to silicon (e.g., poly-silicon). Thus, the depicted band diagrams throughout this disclosure can be "band-gap engineered" and formed using known materials, as described below.

The physical regions are laid out from the semiconductor channel 699 to the metal word line, moving from left to right in FIG. 8A. The horizontal axis is labeled "radial coordinate" to indicate the radial direction, consistent with the radial axis (r) in FIG. 7A. The physical regions include the semiconductor channel 699, tunnel dielectric 698 (regions 716, 714, 712), CSR 697 (regions 710, 708, 706), blocking oxide 696 (regions 704, 702), and metal word line 605). The portion of the metal word line that is adjacent to the blocking oxide 696 may also be referred to as the control gate of the memory cell.

In one embodiment, the semiconductor channel 699 is silicon, tunnel dielectric layer 716 is silicon oxide (e.g., $SiO_2$), tunnel dielectric layer 714 is silicon nitride (e.g., $Si_3N_4$), tunnel dielectric layer 712 is silicon oxide (e.g., $SiO_2$), charge storage layer 710 is silicon nitride (e.g., $Si_3N_4$), charge storage layer 708 is a high-k material, charge storage layer 706 is silicon nitride (e.g., $Si_3N_4$), blocking layer 704 is silicon oxide (e.g., $SiO_2$), blocking layer 702 is aluminum oxide (e.g., $Al_2O_3$). The metal word line 605 could be, for example, tungsten. The high-k material is hafnium oxide (e.g., $HfO_2$), in one embodiment. The high-k material is zirconium oxide (e.g., $ZrO_2$), in one embodiment. Both of these high-k materials have a suitable band offset to be used with other materials just listed.

Regions 706, 708, 710 may formed with any of the materials listed in the discussion of FIG. 7A. Note that the energy band levels may vary somewhat from material to material. However, the high-low-high conduction band offset, as well as the low-high-low valence band offset, discussed below may be achieved. Note that for some materials band engineering may be used to achieve the foregoing band offsets for the charge storage region 697. Also, the choice of materials for the tunnel dielectric 698, as well as the blocking oxide 696, may impact what materials can be used (or band engineering) to achieve the high-low-high conduction band offset, as well as the low-high-low valence band offset, discussed below.

For purposes of discussion, the conduction band of a given region will be compared to the conduction band of the semiconductor channel, which will be referred to as a "conduction band offset". For example, the difference in energy level between the conduction band of region 710 and the conduction band of the semiconductor channel will be referred to as the conduction band offset of region 710. Similar terminology will be used for valence band offsets. For example, the difference in energy level between the valence band of region 710 and the valence band of the semiconductor channel will be referred to as the valence band offset of region 710.

The CSR 697 has a high-low-high conduction band offset, in this embodiment. For example, the second charge trapping layer 708 has a smaller conduction band offset relative to the semiconductor channel 699 than a conduction band offset of the first charge trapping layer 710 relative to the semiconductor channel 699. Also, the second charge trapping layer 708 has a smaller conduction band offset relative to the semiconductor channel 699 than a conduction band offset of the third charge trapping layer 706 relative to the semiconductor channel 699. This high-low-high conduction band offset helps improve data retention.

The CSR 697 has a low-high-low valence band offset, in this embodiment. For example, the second charge trapping layer 708 has a larger valence band offset relative to the semiconductor channel 699 than a valence band offset of the first charge trapping layer 710 relative to the semiconductor channel 699. Also, the second charge trapping layer 708 has a larger valence band offset relative to the semiconductor channel 699 than a valence band offset of the third charge trapping layer 706 relative to the semiconductor channel 699. This, low-high-low valence band offset helps to improve erase efficiency.

The tunnel dielectric 698 has a high-low-high conduction band offset, in this embodiment. That is, region 716 has a greater conduction band offset than region 714. Furthermore, region 714 has a smaller conduction band offset than region 712.

The tunnel dielectric 698 has a high-low-high valence band offset, in this embodiment. That is, region 716 has a larger valence band offset (relative to the valence band of the semiconductor channel 699) than region 714. Furthermore, region 714 has a smaller valence band offset than region 712.

Also, charge storage region 710 has a smaller valence band offset (relative to the valence band of the semiconductor channel 699) than the valence band offset of dielectric tunnel region 712. This may help to improve erase efficiency and data retention.

Figure 8B:
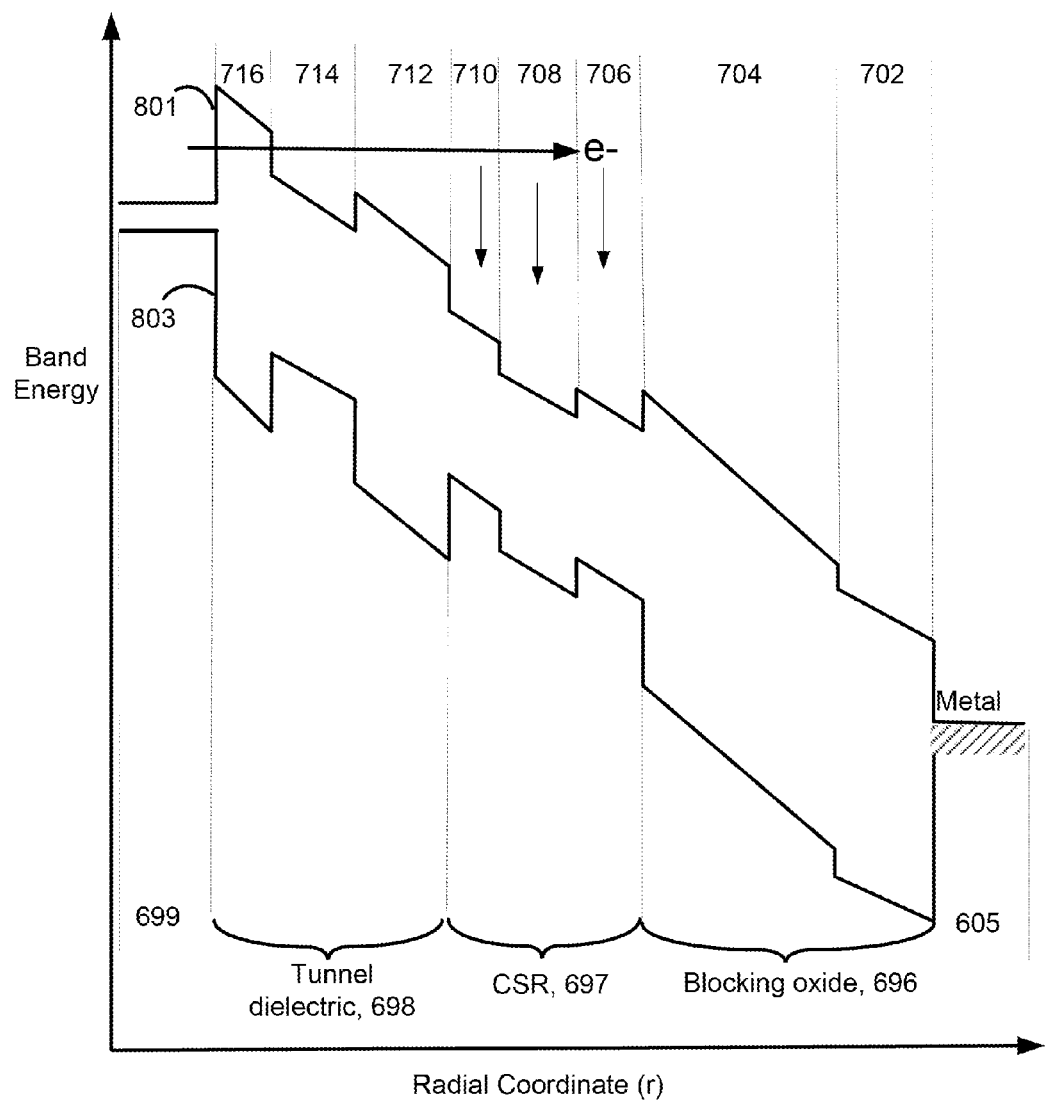
FIG. 8B is an energy band diagram for one embodiment of a memory cell under program.
Figure 8C:
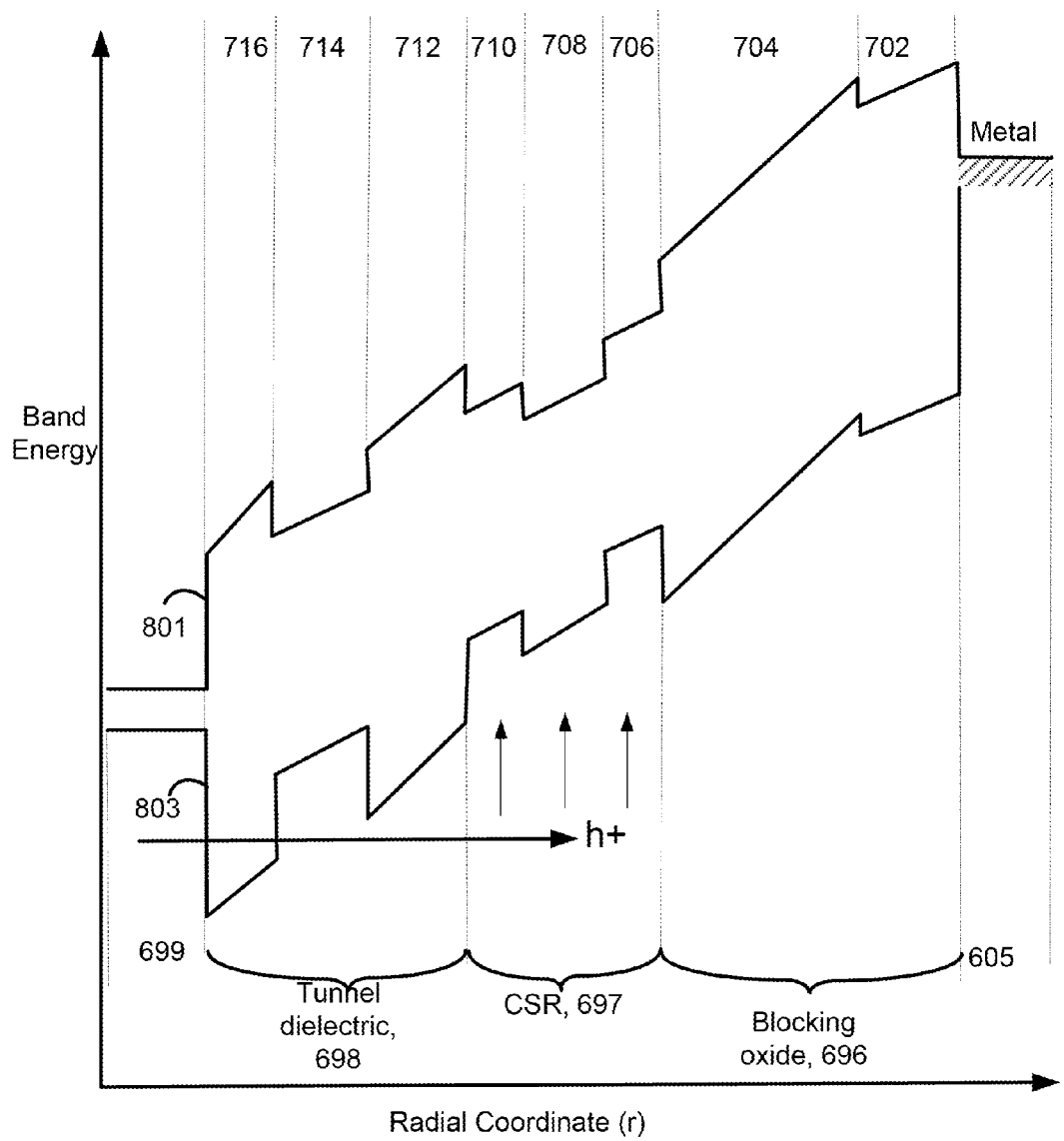
FIG. 8C is an energy band diagram for one embodiment of a memory cell under erase.

FIG. 8B is an energy band diagram for one embodiment of a memory cell under program bias conditions when a high positive bias (e.g., approximately 20V) is applied to the control gate with respect to the channel, which is kept at a low bias (e.g., approximately 0 volts). FIG. 8C is an energy band diagram for one embodiment of a memory cell under erase bias conditions, when the channel potential is raised to high level (e.g., approximately 20V), while the control gate is kept at low bias (e.g., approximately 0 volts). The physical regions in FIGS. 8B and 8C are consistent with those of FIG. 8A.

Referring to FIG. 8B, during program, a high bias is applied to the metal control gate of the memory cell (or word line 605). The semiconductor channel 699 is at a lower bias, such as, for example, ground. Electrons from the semiconductor channel 699 tunnel through dielectric layer 716. Note that given that tunnel dielectric region 714 has a smaller conduction band offset than tunnel dielectric region 716, the more energetic electrons do not need to tunnel through tunnel dielectric region 714 to reach the CSR 697. Electrons that reach the CSR 697 may become trapped in any of the charge storage layers 710, 708, 706.

Referring to FIG. 8C, during erase, the semiconductor channel 699 is at a higher potential than the metal control gate 605. Holes from the semiconductor channel 699 tunnel through dielectric layer 716. Note that given that tunnel dielectric region 714 has a smaller valence band offset than tunnel dielectric region 716, some of the holes do not need to tunnel through tunnel dielectric region 714 to reach the CSR 697. Holes that reach the CSR 697 may re-combine with electrons that are trapped in the CSR 697.

Also referring back to FIG. 8A, note that charge trapping layer 708 has a greater valence band offset (e.g., relative to the semiconductor channel 699) than the valence band offset of charge trapping layer 710. Likewise, charge trapping layer 708 has a greater valence band offset than the valence band offset of charge trapping layer 706. The foregoing may make it easier to erase the memory cell.

Also referring back to FIG. 8A, note that charge trapping layer 710 has a smaller valence band offset (e.g., relative to the semiconductor channel 699) than the valence band offset of dielectric layer 712. Referring again to FIG. 8A, this means that holes that do not need to tunnel through dielectric layer 712 also do not need to tunnel through charge trapping layer 710. On the other hand, if the valence band offset of charge trapping layer 710 were hypothetically greater than the valence band offset of dielectric layer 712, then some holes that did not need to tunnel through dielectric layer 712 during erase might need to tunnel through charge trapping layer 710, which could make it more difficult to erase the memory cell. Thus, the configuration of valence bands of regions 710 and 712 in this embodiment facilitates erasing the memory cell.

As noted above, the high-low-high conduction band offset of the CSR may improve data retention. Referring to FIG. 8D, electrons (e-) that are trapped in charge storage layer 708 face a potential barrier in the conduction band 801 to move to either charge storage layer 706 or 710. Moreover, charge storage layer 708 has a larger conduction band offset with respect to tunnel dielectric layer 712 than the larger conduction band offset of charge storage layer 710 with respect to tunnel dielectric layer 712. Thus, data retention may be improved.

In one embodiment, band engineering is used to lower the conduction band of charge storage layer 708 to create an even larger potential barrier. In other words, the conduction band offset of charge storage layer 708 is reduced. The high-k material of charge storage layer 708 may be doped to decrease the conduction band level, as one example.

In one embodiment, band engineering is used to lower the valence band of charge storage layer 708. In other words, the valence band offset of charge storage layer 708 is increased. For example, the high-k material of charge storage layer 708 may be doped. Increasing the valence band offset of charge storage layer 708 may improve erase.

Note that in the embodiment in which charge storage layers 706 and 710 are silicon nitride, these layers may be considered to be a mid-k dielectric. In one embodiment, charge storage layers 706 and 708 are each a high-k dielectric, but charge storage layer 710 is a mid-k dielectric. In one embodiment charge storage layers 710 and 708 are each a high-k dielectric, but charge storage layer 706 is a mid-k dielectric. In one embodiment, charge storage layers 706 and 710 are each a high-k dielectric, but charge storage layer 708 is a mid-k dielectric. In one embodiment, charge storage layers 706, 708, and 710 are each a high-k dielectric.

Figure 9A:
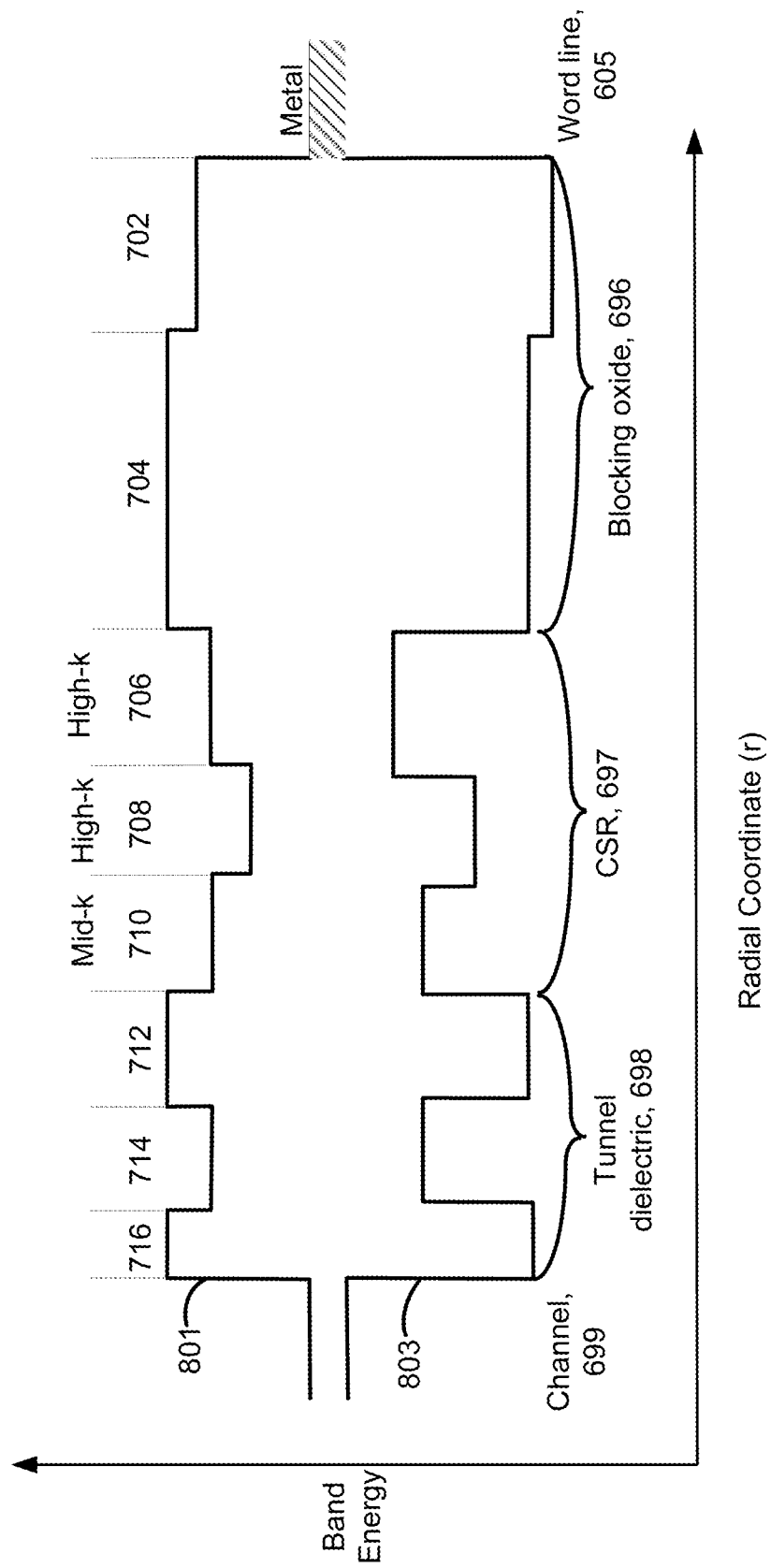
FIG. 9A is an energy band diagram of one embodiment of a memory cell.

FIG. 9A is an energy band diagram of one embodiment of a memory cell in which two of the charge storage layers are a high-k dielectric, but one of the charge storage layers is a mid-k dielectric. Referring to FIG. 9A, charge storage layers 706 and 708 are each a high-k dielectric. As one example, charge storage layer 706 is lanthanum oxide (e.g., $La_2O_3$). Charge storage layer 708 may be, but is not limited to, hafnium oxide (e.g., $HfO_2$), zirconium oxide (e.g., $ZrO_2$), $Y_2O_3$ or $ZrSo_4$. The mid-k dielectric for layer 710 may be, for example, silicon nitride (e.g., $Si_3N_4$). The tunnel dielectric 698 and blocking oxide 696 could be the same or similar to the materials listed for the example of FIG. 7A.

The material that is selected for charge storage layer 706 has a similar band structure as silicon nitride. For example, $La_2O_3$ has a similar energy band structure as $Si_3N_4$ (at least with respect to the upper edge of the valence band and the lower edge of the conduction band). However, $Si_3N_4$ may be a mid-k dielectric. The high-k dielectric provides higher control gate capacitive coupling. Therefore, memory cell performance may be improved.

FIG. 9B is an energy band diagram of one embodiment of a memory cell in which two of the charge storage layers are a high-k dielectric, but one of the charge storage layers is a mid-k dielectric. Referring to FIG. 9B, charge storage layers 708 and 710 are each a high-k dielectric. As one example, charge storage layer 710 is lanthanum oxide (e.g., $La_2O_3$). Charge storage layer 708 may be, but is not limited to, hafnium oxide (e.g., $HfO_2$), zirconium oxide (e.g., $ZrO_2$), $Y_2O_3$ or $ZrSo_4$. The mid-k dielectric for layer 706 may be, for example, silicon nitride (e.g., $Si_3N_4$). The tunnel dielectric 698 and blocking oxide 696 could be the same or similar to the materials listed for the example of FIG. 7A.

FIG. 9C is an energy band diagram of one embodiment of a memory cell in which three of the charge storage layers are a high-k dielectric As one example, charge storage layers 706 and 710 are each lanthanum oxide (e.g., $La_2O_3$). Charge storage layer 708 may be, but is not limited to, $HfO_2$, $ZrO_2$, $Y_2O_3$, $La_2O_3$, $ZrSiO_4$, $BaZrO_2$, $BaTiO_3$, $T_2O_5$, $Zr_2SO_3$. The tunnel dielectric 698 and blocking oxide 696 could be the same or similar to the materials listed for the example of FIG. 7A.

FIG. 9D is an energy band diagram of one embodiment of a memory cell in which three of the charge storage layers are a high-k dielectric. The tunnel dielectric 698 and blocking oxide 696 could be the same or similar to the materials listed for the example of FIG. 7A. As one example, charge storage layer 706 is lanthanum oxide (e.g., $La_2O_3$). Charge storage layer 708 may be, but is not limited to, $HfO_2$, $ZrO_2$, $Y_2O_3$, $La_2O_3$, $ZrSiO_4$, $BaZrO_2$, $BaTiO_3$, $T_2O_5$, $Zr_2SO_3$. Charge storage layer 710 may be lanthanum aluminum oxide (e.g., $LaAlO_3$).

Referring to FIG. 9D, depending on content of the aluminum in the lanthanum aluminum oxide in layer 710, the conduction and valence band offsets may increase relative to a material such as lanthanum oxide (e.g., $La_2O_3$). FIG. 9D shows dashed line 910 to represent where the conduction band would be if region 710 were $La_2O_3$, as well as dashed line 912 to represent where the valence band would be if region 710 were $La_2O_3$. The portion of the conduction band 801 for region 710 shows the energy level assuming a 50/50 mix of lanthanum to aluminum in the $LaAlO_3$ of region 710. These lines show the greater conduction band offset for $LaAlO_3$ relative to $La_2O_3$. Likewise, these lines show the greater valence band offset for $LaAlO_3$ relative to $La_2O_3$. The increase in the conduction band offset, as well as the increase in the valence band offset, may each improve data retention. With the larger band offset of the $LaAlO_3$ (relative to, for example, $La_2O_3$), the thickness of the $LaAlO_3$ can be reduced. Optionally, thickness of the charge trapping layer 708 can be increased to increase the efficiency of charge trapping.

In another embodiment that is an alternative to the example of FIG. 9D, the materials for layers 706 and 710 are switched. Thus, another combination is lanthanum aluminum oxide (e.g., $LaAlO_3$) for charge storage layer 706. Charge storage layer 708 may be, but is not limited to, $HfO_2$, $ZrO_2$, $Y_2O_3$, $La_2O_3$, $ZrSiO_4$, $BaZrO_2$, $BaTiO_3$, $T_2O_5$, $Zr_2SO_3$. Charge storage layer 710 may be lanthanum oxide (e.g., $La_2O_3$). In such an embodiment, the conduction band and valence band shown in FIG. 9D for regions 706 and 710 will be switched.

Figure 9E:
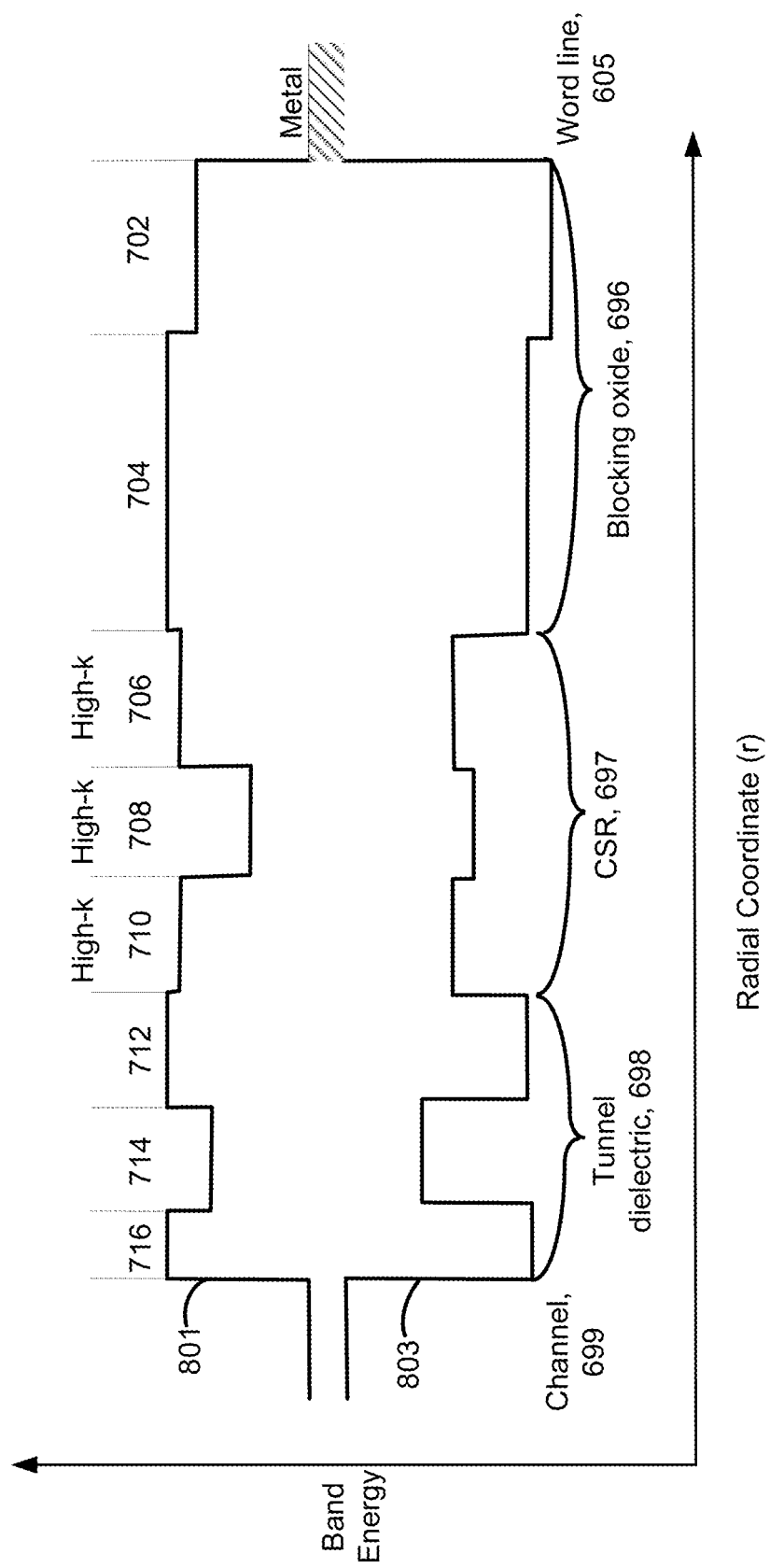
FIG. 9E is an energy band diagram of one embodiment of a memory cell in which three of the charge storage layers are a high-k dielectric.

FIG. 9E is an energy band diagram of one embodiment of a memory cell in which three of the charge storage layers are a high-k dielectric. The tunnel dielectric 698 and blocking oxide 696 could be the same or similar to the materials listed for the example of FIG. 8A. As one example, charge storage layers 706 and 710 are each lanthanum aluminum oxide (e.g., $LaAlO_3$). Charge storage layer 708 may be, but is not limited to, hafnium oxide (e.g., $HfO_2$), zirconium oxide (e.g., $ZrO_2$), $Y_2O_3$ or $ZrSO_4$.

The materials and band structures for the charge trapping layers described in connection with FIGS. 7A-9E can also be applied to 2D NAND. Note that for some 2D NAND embodiments, the tunnel dielectric has a single silicon oxide layer instead of the triple layer discussed with respect to the 3D NAND example. Therefore, the band structure of tunnel dielectric region for 2D NAND might have a single region such as either region 712 or 716 (which were described as being $SiO_2$, in some embodiment). Thus, referring back to FIG. 2B, the various materials for charge trapping layers that were discussed in connection with FIGS. 7A-9E can be used for tunnel CTL 341, mid CTL 343, and gate CTL 345. Note that tunnel CTL 341 may correspond to charge trapping layer 710, mid CTL 343 may correspond to charge trapping layer 708, and gate CTL 345 may correspond to charge trapping layer 706.

Figure 10:
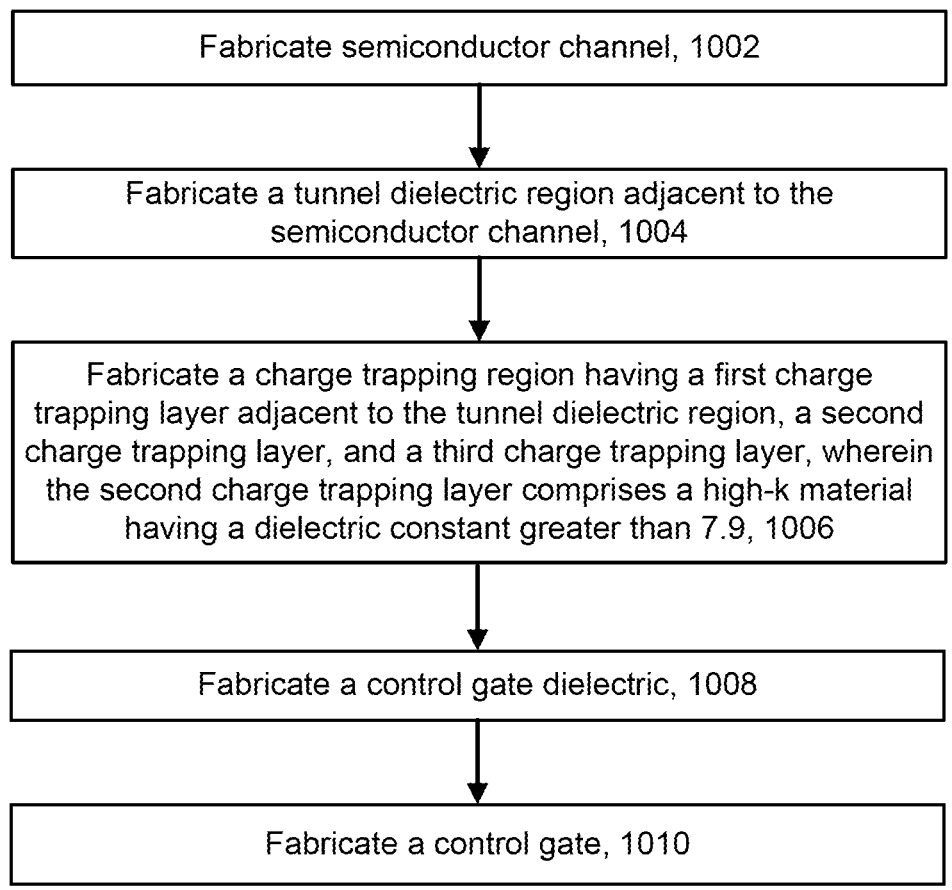
FIG. 10 is a flowchart of one embodiment of a process of fabricating a memory device having a high-k charge storage region.

FIG. 10 is a flowchart of one embodiment of a process of fabricating a memory device having a high-k charge storage region. The process may be used for fabricating a 2D memory array (such as 2D NAND) or a 3D memory array (such as 3D NAND). Devices such as, but not limited to, those depicted in FIGS. 2A, 2B, 3A, 3B, 4A, 4B, and 4C could be fabricated. The NAND strings are straight NAND strings in a 3D memory array, in one embodiment. The NAND strings are U-shaped in a 3D memory array, in one embodiment. Note that steps may be performed in a different order than presented in the flowchart.

Step 1002 includes fabricating (or forming) a semiconductor channel. This refers to fabricating a region that comprises a semiconductor. In one embodiment, a semiconductor channel 337 for a 2D NAND such as the example of FIG. 2B is fabricated. In one embodiment, a semiconductor channel 699 for a 3D NAND such as, but not limited to, the examples of FIG. 5A, 5B, 6A, or 6B, is fabricated. In one embodiment, the semiconductor channel is silicon. In one embodiment, the semiconductor channel is germanium. In one embodiment, the semiconductor channel is a III-V compound. The semiconductor channel is not limited to these examples.

Step 1004 includes fabricating a tunnel dielectric region. The tunnel dielectric region, at least by the end of the process, is adjacent to the semiconductor channel (note that the semiconductor channel could be formed after the tunnel dielectric region). In one embodiment, a tunnel dielectric 335 for a 2D NAND such as the example of FIG. 2A or 2B is formed on the surface of the substrate 340. In one embodiment, a tunnel dielectric 698 for a 3D NAND such as the example of FIG. 5A, 5B, 6A, or 6B is formed. For example, tunnel $SiO_2$ layer 712, tunnel SiN layer 714, and tunnel $SiO_2$ layer 716, as depicted in FIG. 7A may be formed in step 1004.

Step 1006 includes fabricating a charge trapping region that, at least by the end of the process, is adjacent to the tunnel dielectric region. In one embodiment, a tunnel CTL 341, a mid CTL 343, and a gate CTL 345, for a 2D NAND such as depicted in FIG. 2B are fabricated. In one embodiment, first (or gate) charge trapping layer 706, second (or middle) charge trapping layer 708, and third (or tunnel) charge trapping layer 710 for a 3D NAND such as depicted in FIG. 7A is fabricated. Numerous examples have been described already for 3D NAND, but step 1006 is not limited to those examples. Thus, the materials for the charge trapping layers discussed in connection with FIGS. 7A, 8A-8C, and 9A-9E may be used in step 1006. In step 1006, at least one of the layers is a high-k dielectric. As has been discussed, this is the middle layer, in one embodiment. In some embodiments, two or three of the layers are a high-k dielectric.

Step 1008 includes forming a control gate dielectric that, at least by the end of the process, is adjacent to the charge trapping region. In one embodiment, a control gate dielectric 333 for a 2D NAND such as the example of FIG. 2B is formed on the charge trapping region. In one embodiment, a blocking oxide 696 for a 3D NAND is formed in step 1008. For example, a silicon oxide layer 704 and an aluminum oxide layer 702 may be formed.

Step 1010 includes forming a control gate that, at least by the end of the process, is adjacent to the control gate dielectric. In one embodiment, control gate 351 for a 2D NAND is formed on the control gate dielectric 333. Additionally, a word line 353 may be formed on the control gate 351. In one embodiment, metal word lines are formed in a 3D NAND (e.g., word line 605, FIG. 7A).

FIG. 11 is a flowchart of one embodiment of a process of fabricating a 3D memory array in which the charge storage region comprises a high-k dielectric. FIGS. 12A-12K depict results after various steps of the process of FIG. 11. In FIG. 11, steps need not necessarily be performed as discrete steps in the order indicated. Various modifications can be made. Moreover, other steps which are known from the art of semiconductor fabrication but are not explicitly depicted here may also be performed. FIG. 11 represents a "word line last" technique in which the word lines are formed after forming the NAND strings. For example, after forming the NAND strings, sacrificial silicon nitride may be replaced, at least in part, with metal.

Prior to this process, below-stack circuitry and metal layers may be formed in the substrate. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance.

Step 1102 includes depositing alternating silicon oxide ($SiO_2$)/silicon nitride (SiN) layers above the substrate 201. The silicon nitride is a sacrificial layer, which will be replaced by metal to form word lines (as well as a source select line (SGS), and a drain select line (SGD or SG). The silicon oxide will be used for the insulating layers between the metal word (and select) lines. Other insulators could be used instead of silicon oxide. Other sacrificial materials could be used instead of silicon nitride.

Step 1104 includes etching slits in the alternating silicon oxide ($SiO_2$)/silicon nitride (SiN) layers. Step 1106 includes filling in the slits with insulation. FIGS. 4B and 4C show examples of slits 502 for straight NAND strings. FIG. 3B shows one example of slits 408 for U-shaped NAND strings. The pattern in which the slits are formed can vary widely.

Step 1108 includes etching memory holes (MH) in the alternating layers of silicon nitride and silicon oxide. Reactive ion etching can be used to etch the memory holes. In the memory array area, the memory holes are placed densely. For example, the memory holes can have a diameter of 70-110 nanometers (nm) (70-110×$10^{-9}$ meters). This is an example range; other ranges could be used. Also note that the diameter could vary from top to bottom.

FIG. 12A shows results after step 1108. FIG. 12A shows sacrificial layers (SAC0-SAC7) alternating with insulating layers (D0-D8) in a stack 1200 over a semiconductor substrate 201. The sacrificial layers are silicon nitride (SiN) in this embodiment and will eventually be layers SGS, WL0, WL1, WL2, WL3, WL4, WL5, and SGD. The insulating layers are silicon oxide in this embodiment. Six memory holes (MH) are depicted as extending vertically through the alternating sacrificial layers and insulating layers. The memory holes extend down to the semiconductor substrate 201, which is formed from silicon in one embodiment. Etching the memory holes could etch partway into the semiconductor substrate 201. An x-y-z coordinate system is depicted, showing the direction of formation. The memory holes each have a major axis that is parallel to the z-axis.

Figure 12B:
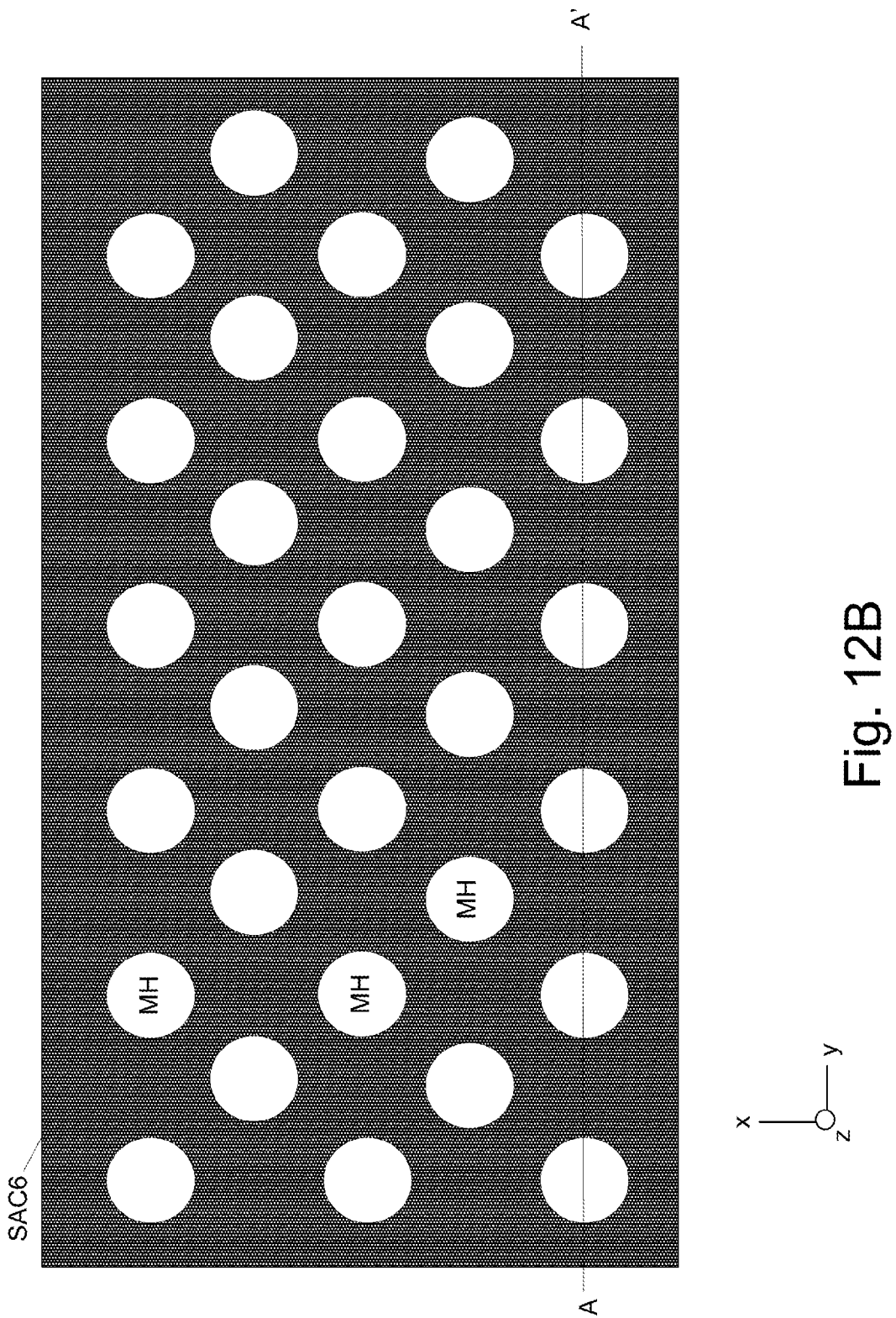

FIG. 12B shows a cross sectional view of layer SAC6 from FIG. 12A after step 1108, showing one possible pattern for the memory holes (MH). This is not the only possible pattern. For example, the memory holes do not need to be staggered as depicted. An x-y-z coordinate system is depicted, showing that direction of formation. Note that line A-A' indicates that FIG. 12A is a cross section along line A-A' of FIG. 12B. Also note that the memory holes have a circular cross section in the horizontal direction (e.g., x-y plane), in this example. The memory holes are not required to be circular in cross section. Note that the memory holes could be of different diameter in the different layers. For example, the memory holes could have a smaller diameter at the lower layers. The slits are not depicted in FIGS. 12A-12B so as to not obscure the diagrams.

Step 1110 includes formation of silicon at the bottom of the memory holes for the source side select transistor bodies. In one embodiment, the silicon is mono-crystalline silicon. Step 1110 includes epitaxial silicon growth at the bottom of the memory holes, in one embodiment. In one embodiment, precursors such as dicholorosilane (DCS) and HCl are used. Step 1110 includes two sub-steps, in one embodiment. In a first sub-step, a bake in hydrogen is performed. This bake may be at about 750 to 950 degrees Celsius and may be for between about ten seconds to 150 seconds. As one example, the hydrogen gas flow rate is about 10 to 50 sccm. As one example, the pressure may be about 10 to 30 mTorr. Also, a nitrogen gas flow may be used to mitigate unintentional nucleation sites on nitride corners. The nitrogen gas flow may be about 10 to 50 sccm. This optional nitrogen gas flow step passivates dangling silicon bonds prior to epitaxial silicon growth. The vertical sidewalls of the memory holes may have unintentional nucleation sites. The unintentional nucleation sites may be dangling silicon bonds. Passivating the dangling silicon bonds helps to prevent unintentional growth of silicon on the vertical sidewalls of the memory holes. Such growth could potentially block the memory hole during the formation of materials in the memory holes.

The second sub-step is epitaxial silicon growth. In one embodiment, precursors such as dicholorosilane (DCS) and HCl are used in this sub-step. As one example, the HCl flow rate is about 50 to 150 sccm. As one example, the DCS flow rate is about 100 to 400 sccm. A precursor other than dicholorosilane (DCS) and HCl could be used. An example range of temperatures is 750 to 850 degrees Celsius. However, higher or lower temperatures can be used. As one example, the pressure may be about 10 to 30 mTorr. The time may vary depending on the desired amount of epitaxial growth. The growth rate may increase with temperature. The entire growth process may be carried out in a Chemical Vapor Deposition (CVD) technique (single wafer process or batch).

Figure 12C:
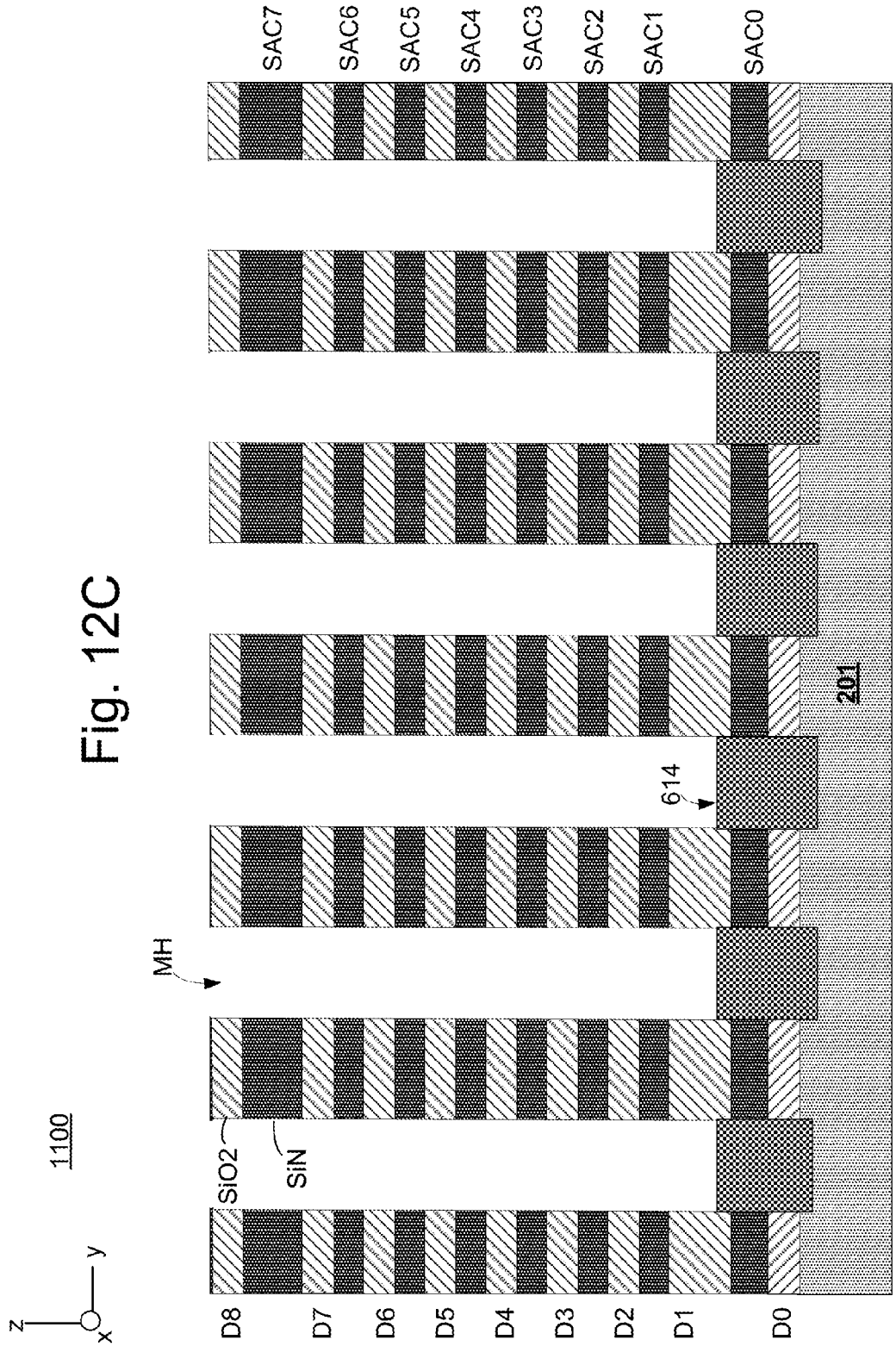

FIG. 12C depicts results after step 1110, showing mono-crystalline silicon region 614 in the bottom of the memory holes (MH). Note that silicon region 614 will serve as the body of the source side select transistor.

Figure 12D:
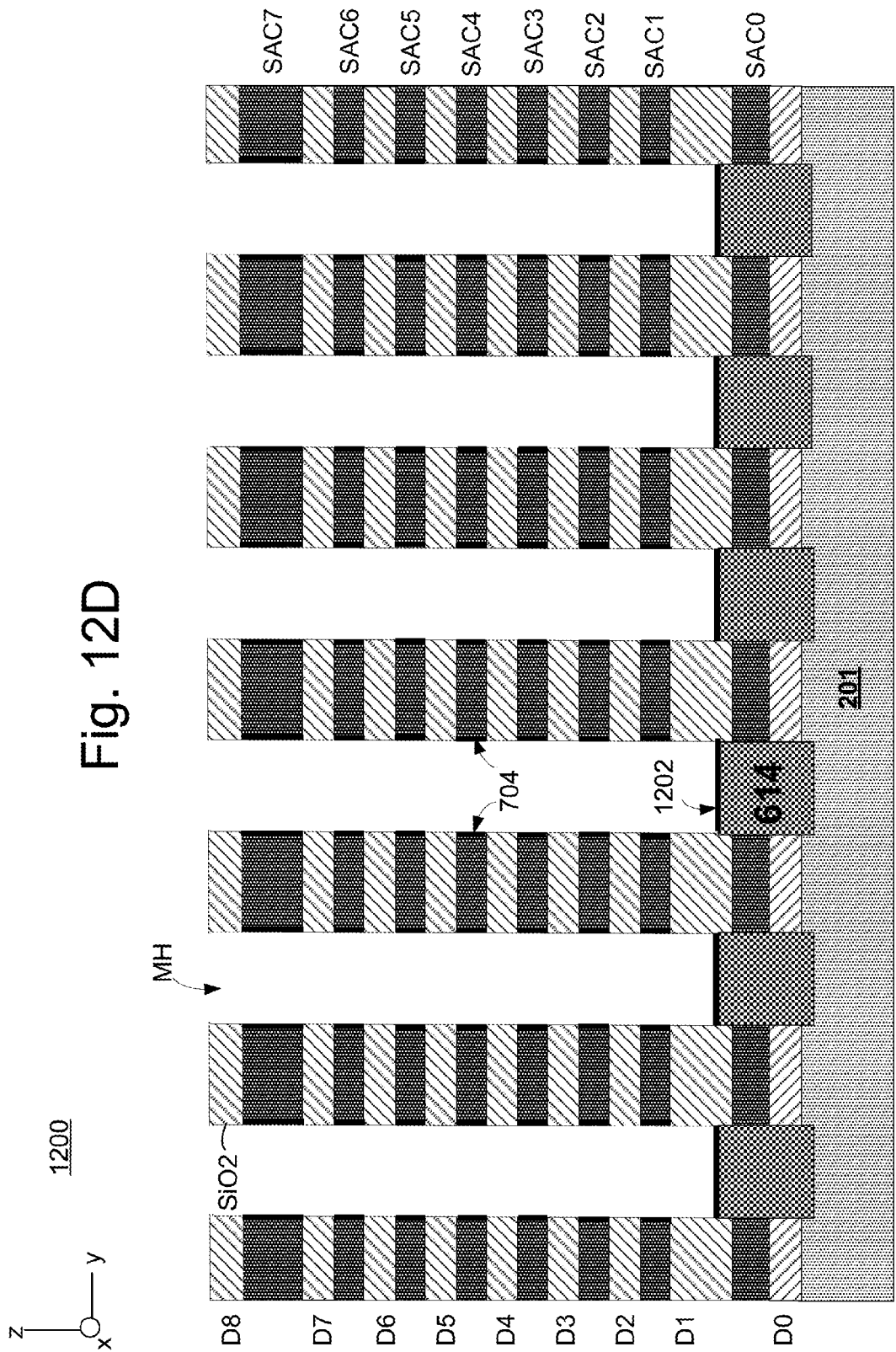

Step 1112 is an ISSG (in-situ steam generation) formed oxide step. Referring to FIG. 12D, this forms oxide 704 on the exposed sidewalls of the silicon nitride in the memory holes. Oxide 1202 is also formed on the exposed surface of the mono-crystalline silicon 614 at the bottom of the memory hole. The oxide 704 may also form a part of the blocking oxide 696. For example, this oxide may serve as silicon oxide layer 704. The oxide provides a high wet etch selectivity for later removal of the sacrificial silicon nitride. In one embodiment, step 1112 uses a growth temperature of between 850 C to 1150 C. Step 1112 may include radical oxidation ($O_2+H_2$).

Figure 12F:
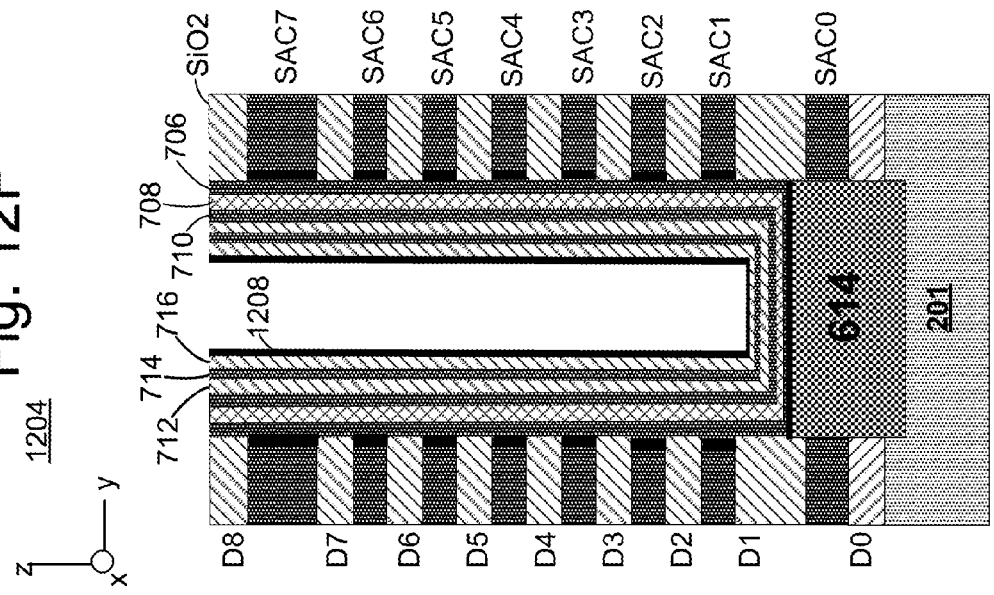
Figure 12E:
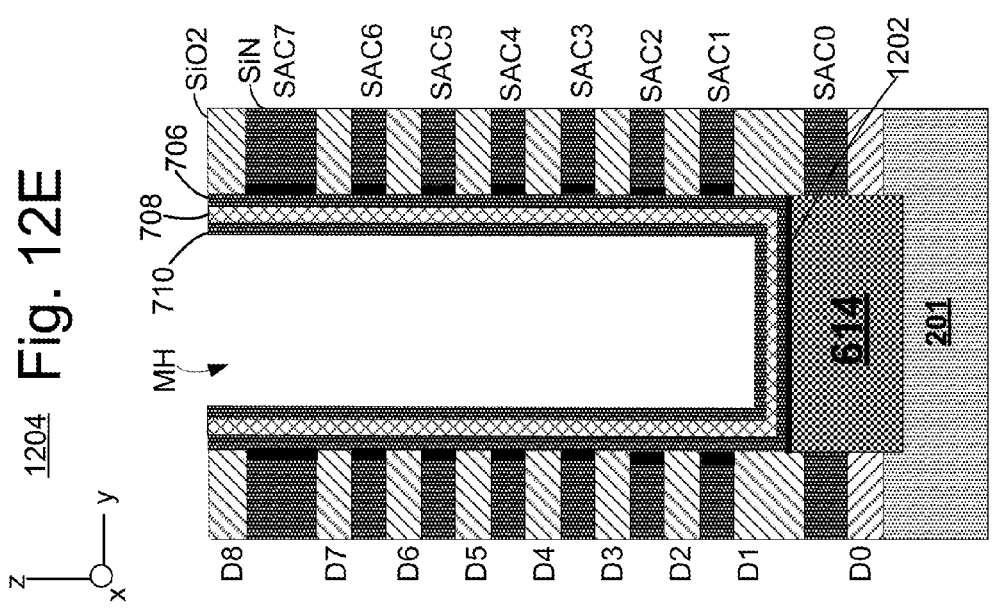

Step 1114 includes depositing the charge trapping layers (CTL) in the memory holes. These layers may be deposited as several conformal layers over vertical sidewalls of the memory holes, as well as over the silicon region 614. FIG. 12E depicts results after step 1114.

FIG. 12E shows a portion 1204 of stack 1200 containing just one of the memory holes from FIGS. 12A, 12C, and 12D. First charge trapping layer 706 is deposited as a conformal layer over exposed vertical sidewalls of the memory holes, as well as over the oxide 1202 on the bottom of the memory hole. Second charge trapping layer 708 is deposited as a conformal layer over exposed vertical sidewalls of the first charge trapping layer 706, as well as over the first charge trapping layer 706 at the bottom of the memory hole. Third charge trapping layer 710 is deposited as a conformal layer over exposed vertical sidewalls of the second charge trapping layer 708, as well as over the second charge trapping layer 708 at the bottom of the memory hole.

The first charge trapping layer 706, the second charge trapping layer 708, and the third charge trapping layer 710 may be formed from materials including, but not limited to, those discussed in connection with FIGS. 7A-9E. The charge trapping layers could be deposited using ALD or CVD, for example.

At least one of the charge trapping layers is $ZrO_2$, in one embodiment. For example, the second charge trapping layer 708 may be $ZrO_2$. The following describes example deposition parameters. The $ZrO_2$ could be deposited using ALD or CVD. ALD precursors include, but are not limited to, $ZrCl_4+H_2O$. An $N_2$ atmosphere may be used. The growth temperature may be about 300 C. CVD precursors include zirconium tetra-tert-butoxide (ZTB), $Zr(OC(CH_3)_3)_4$. The deposition temperature may be 300 C or greater. One possible issue with forming the $ZrO_2$ is a decrease in the k-value due to interfacial oxide (e.g., $ZrO_x$-$SiO_x$ formation). In one embodiment, a sandwich of $SiN/ZrO_2/SiN$ is formed with a post anneal for addressing the interfacial oxide. Further details are discussed below in connection with FIGS. 13A and 13B. A technique is also discussed below for reducing and/or controlling trap density at the interface. Further a technique is discussed below for forming deep traps, which can improve data retention.

At least one of the charge trapping layers is $HfO_2$, in one embodiment. For example, the second charge trapping layer 708 may be $HfO_2$. The following describes example deposition parameters. The $HfO_2$ could be deposited using ALD, as one example. Precursors include $HfCl_4$ (solid at room temperature) heated to approximately 185 C to achieve sufficient vapor pressure for hafnium-containing pulses. $H_2O$ may be used as an oxidizing agent. The deposition rate and mechanism may be a strong function of the starting surface and wafer temperature. Deposition may be at relatively low temperature of between 300 C-350 C at a pressure of approximately 1 Torr. The $HfO_2$ could also be deposited using CVD or MOCVD with temperature in the range of 550 C to 650 C. For the MOCVD based layers, simultaneous or pulsed injection of precursors may be used. Films deposited by simultaneous injection may be obtained from tetrakis(diethylamido) hafnium (TDEAH) and tetrakis(dimethylamido)silicon (TDMAS) precursors at 600 C with $O_2$ as an oxidizing agent.

Step 1116 is depositing at least one of the layers of the tunnel dielectric 698 in the memory holes. The tunnel dielectric 698 may be deposited as a conformal layer on the charge trapping region 697. Thus, the tunnel dielectric 698 may cover vertical sidewalls of the charge trapping region 697, as well as the portion of the charge trapping region 697 that is on the silicon region 614.

Step 1116 may include depositing multiple layers, such as $SiO_2$ and SiON, with the $SiO_2$ nearest the charge trapping region. The tunnel dielectric might also include $SiO_2$ and ISSG (in-situ steam generation) formed oxide, with the $SiO_2$ nearest the charge trapping region. The tunnel dielectric might include three layers: $SiO_2$, SiON, and ISSG formed oxide. The tunnel dielectrics could be deposited using ALD or CVD, for example.

Step 1118 is depositing a protective layer over the tunnel dielectric. Amorphous silicon is deposited, in one embodiment. The amorphous silicon may be undoped. FIG. 12F depicts results after step 1118. FIG. 12F shows the memory hole from FIG. 12E. Tunnel $SiO_2$ layer 712 is deposited as a conformal layer over exposed vertical sidewalls of the third charge trapping layer 710, as well as over the third charge trapping layer 710 on the bottom of the memory hole. Tunnel SiN layer 714 is deposited as a conformal layer over exposed vertical sidewalls of tunnel $SiO_2$ layer 712, as well as over the $SiO_2$ layer 712 at the bottom of the memory hole. Tunnel $SiO_2$ layer 716 is deposited as a conformal layer over exposed vertical sidewalls of tunnel SiN layer 714, as well as over tunnel SiN layer 714 at the bottom of the memory hole. Amorphous silicon oxide 1208 is deposited as a conformal layer over exposed vertical sidewalls of tunnel $SiO_2$ layer 716, as well as over the tunnel $SiO_2$ layer 716 at the bottom of the memory hole. In one embodiment, SiON is used instead of SiN layer 714.

Step 1120 includes etching at the bottom of the memory holes to expose the silicon region 614. In one embodiment, this is a reactive ion etch (RIE). Step 1122 is a post wet etch clean. This step removes of the protective layer 1208. In one embodiment, a wet etch is used to remove the amorphous silicon protective layer 1208. Also polymer residues from the etch of step 1120 are etched away.

Figure 12H:
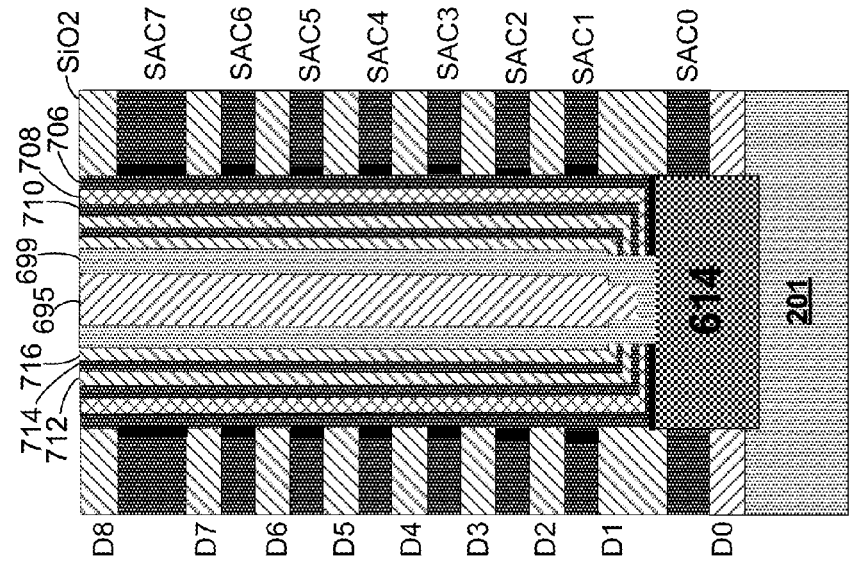
Figure 12G:
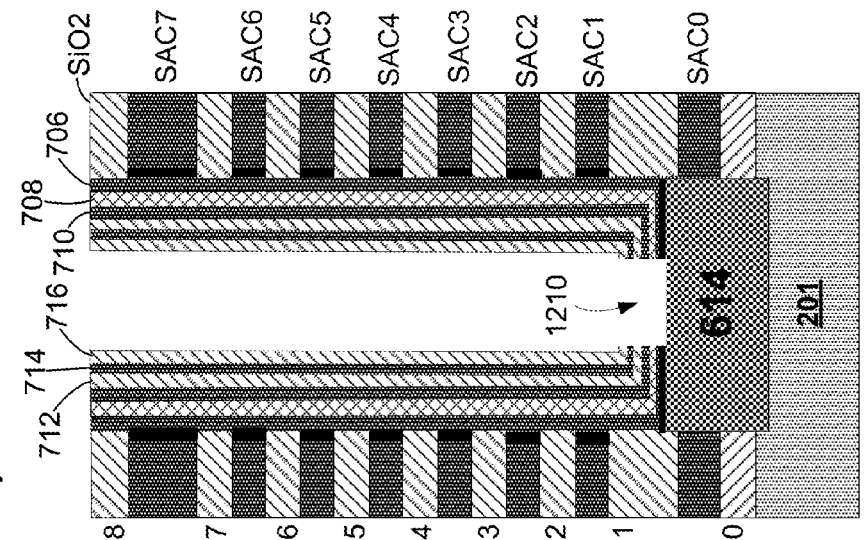

FIG. 12G shows results after step 1122. The etch has creating an opening 1210 at the bottom of the memory hole, exposing the surface of the silicon 614 that will be the body of the source side select transistor. The amorphous silicon protective layer 1208 has been removed, but served to protect the tunnel dielectric during the etch.

Step 1124 is to deposit the semiconductor channel. In one embodiment, amorphous silicon is deposited. This may be deposited as a conformal layer over the exposed sidewalls of the tunnel dielectric in the memory holes, as well as over the exposed silicon 614 at the bottom of the memory hole. The semiconductor channel could be formed from a semiconductor other than silicon.

Step 1126 is to deposit a core of silicon oxide in the memory holes. ALD is used in one embodiment. FIG. 12H shows results after step 1126. The silicon channel 699 is shown as a conformal layer over sidewalls of tunnel layer 716, as well as over the top of the silicon 614 at the bottom of the memory hole. The $SiO_2$ core 695 is depicted is filling the remaining portion of the memory hole.

Step 1128 is to form a recess in the $SiO_2$ core 695. This is a dry etch in one embodiment. In step 1130, amorphous silicon is deposited in the recess in the $SiO_2$ core 695. The amorphous silicon may be deposited by CVD. In step 1132, an impurity is implanted into the amorphous silicon. The doping may be in situ. The impurity could be arsenic, phosphorous, boron, or a combination thereof, but is not limited thereto. Step 1134 is an activation anneal. This reduces the contact resistance. FIG. 12I shoes results after step 1134, showing a silicon cap 1212 at the top of the $SiO_2$ core 695.

Step 1136 is to etch the slits. This removes the material that was in the slits and is done to allow removal of the sacrificial silicon nitride and to deposit metal.

Step 1138 includes performing an etch via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings. Note that the ISSG oxide 704 may serve as an etch stop.

The wet etch should remove essentially the entire silicon nitride layers wherein the NAND strings are being formed (memory cell area), so that when the regions of the removed silicon nitride are replaced by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Note that rather than performing the etch through the slits to remove the sacrificial material, the sacrificial material could be removed by etching through holes, voids, etc. In another embodiment, the sacrificial material is removed at an earlier stage of the process by etching through the memory holes to remove the sacrificial material. In such an embodiment, the slits can be filled with a material that serves as an anchor when etching through the memory holes.

Step 1140 includes water vapor generator (WVG) oxidation of exposed silicon 614 at the bottom of the memory holes. This step serves to form the gate oxide of the source side select transistors. The WVG oxidation selectively oxidizes silicon. Also, the surface of the substrate may also be oxidized in step 1140.

FIG. 12J shows results after step 1140. The gate oxide 1216a for the source side select transistor is shown on vertical sidewalls of silicon 614. Also, oxide 1216b is shown on the surface of the substrate 201. Note that the substrate 201 is a p-substrate, at least near the oxide 1216b, in one embodiment.

In step 1141, an aluminum oxide blocking layer is formed. The blocking layer may be deposited by ALD from outside of the memory hole through the slits.

Step 1142 is depositing a titanium nitride barrier layer in the holes where the sacrificial nitride was removed.

Step 1144 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal. In one embodiment, first a tungsten nucleation layer is formed, then tungsten is deposited by CVD. Step 1146 is re-filling in the slits. A tungsten recess may be performed to isolate the word lines. Also a cover dTEAS may be deposited by CVD.

FIG. 12K shows results after step 1146. The sacrificial layers SAC0-SAC7 have been replaced by metal layers SGS, WL0-WL5, and SGD, respectively. The aluminum oxide blocking layer 702 is depicted next to the silicon oxide blocking layer 704. The titanium nitride layer 1222 is also depicted adjacent to the metal for the word lines. After step 1146, the xy-cross section of a memory hole and adjacent word line layer may resemble the diagram of FIG. 7A.

The following describes details of fabricating the charge trapping region for one embodiment in which at least one of the charge trapping layers is $ZrO_2$. A flowchart illustrating one embodiment of the process is depicted in FIG. 13B. This process may be used for step 1114 in FIG. 11. This process could also be used when forming a 2D memory cell, such as the one of FIG. 2B. This process provides for crystalline $ZrO_2$ formation. Crystallizing the $ZrO_2$ can increase the k-value. The process also addresses issues mentioned above in which there could potentially be an interfacial oxide, which could reduce the k-value. In this process, the three charge trapping layers are: $SiN/ZrO_2/SiN$.

Figure 13A:
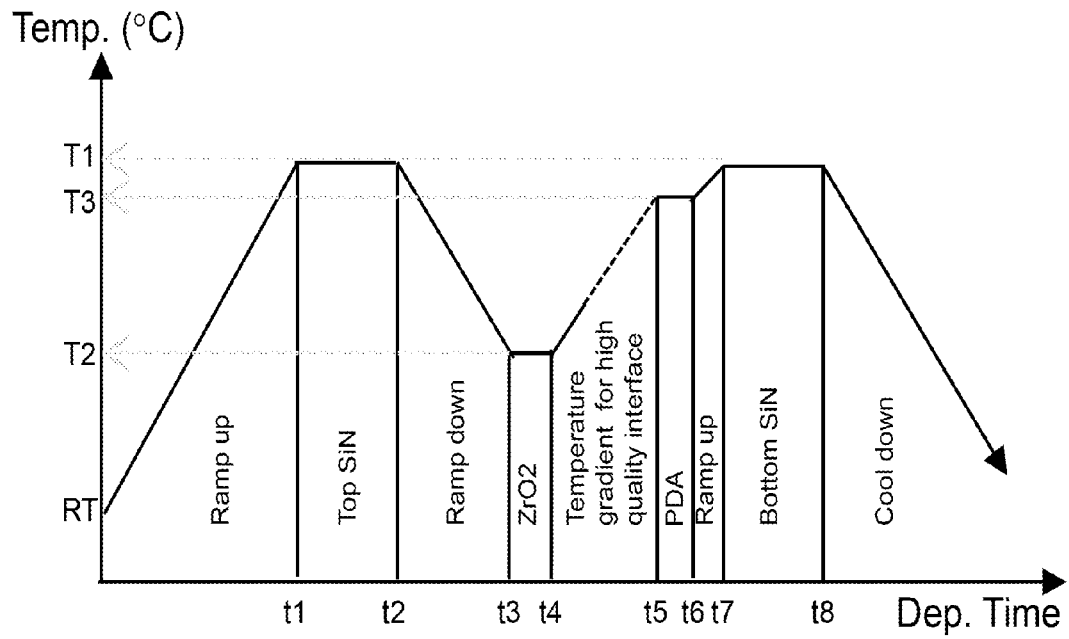
FIG. 13A depicts a graph of temperature versus time for one embodiment of a process in which the middle charge trapping layer is $ZrO_2$.
Figure 13B:
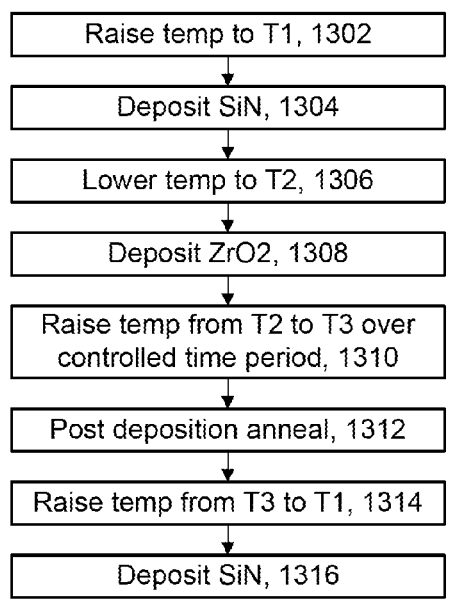
FIG. 13B depicts a flowchart of a process that corresponds to the graph of FIG. 13A.

FIG. 13A depicts a graph of temperature versus time for one embodiment of a process in which the middle charge trapping layer is $ZrO_2$. Temperature RT refers to room temperature. Examples for T1, T2, and T3 are: 650 C, 300 C, and 600 C, respectively. The time between t1 and t8 is between about 5 to 30 minutes, in one embodiment. The temperature is ramped up from room temperature to T1 at time t1 (step 1302, FIG. 13B). Then, silicon nitride (e.g., $S_3N_4$) is deposited between time t1 to t2 for the first charge trapping layer 706 (step 1304). The temperature is ramped down from temperature T1 to T2 between times t2 and t3 (step 1306).

Then, while at temperature T2, zirconium oxide (e.g., $ZrO_2$) is deposited between time t3 and t4 (step 1308). Zirconium oxide serves as the second charge trapping layer 708, in this embodiment. The temperature is ramped up from temperature T2 to T3 between time t4 and t5 (step 1310). The rate at which the temperature is raised is controlled to help provide for a high quality interface. Between times t5 and t6, a post deposition anneal is performed while at temperature T3 (step 1312).

The temperature is then ramped up from T3 to T1 between times t6 and t7 (step 1314). While at temperature T1, silicon nitride (e.g., $S_3N_4$) is deposited from time t7 to t8 for the third charge trapping layer 710 (step 1316). Then, the temperature may be ramped down after time t8.

Therefore, the foregoing process results in crystalline $ZrO_2$. The crystalline $ZrO_2$ may have a dielectric constant (k) of greater than 40. Moreover, the process reduces or eliminates interfacial oxide formation. Moreover, by controlling the gradient temperature ($\Delta T/\Delta t$) between times t4 and t5, as well as the post deposition annealing temperature, the k-value can be modulated over a wide range.

High-k materials other than $ZrO_2$ may be crystallized. Thus, in some embodiments, at least one of the charge trapping layers is crystallized. Crystallizing the charge trapping layer may increase the k-value.

The modulating of the k-value of the high-k material may be used for materials other than $ZrO_2$. Thus, in some embodiments, the k-value of at least one of the charge trapping layers is modulated. Since higher k-values may be desirable, the k-value is increased in some embodiments.

FIGS. 13C-13F describe several additional techniques for improving performance of the charge trapping region. Any of these processes could be used during step 1114 of FIG. 11. However, these processes are not limited to the 3D NAND example. As one alternative, these processes could be used for 2D NAND. These examples are for a $ZrO_2$ charge trapping layer. However, the principles are not limited to $ZrO_2$ for the charge trapping layer.

Figure 13C:
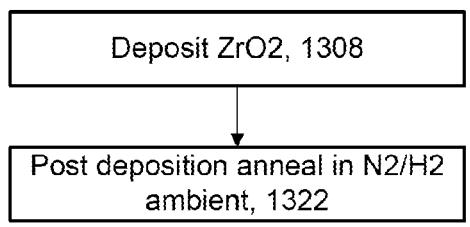
FIG. 13C depicts flowchart of steps of one embodiment that may reduce and/or control interface trap density.

In some embodiments, techniques are used to reducing and/or controlling interface trap density. FIG. 13C depicts flowchart of steps of one embodiment that may reduce and/or control interface trap density. In step 1308 $ZrO_2$ is deposited. In step 1322, a post $ZrO_2$ deposition anneal is performed in a $N_2/H_2$ ambient. The post $ZrO_2$ deposition anneal is in a $N_2/H_2$ ambient may result in lower interface traps as compared to a $N_2$ or an Ar ambient. The process of 13C is performed with the process of FIG. 13B in one embodiment. However, it is not required to use the processes in combination with each other.

Figure 13D:
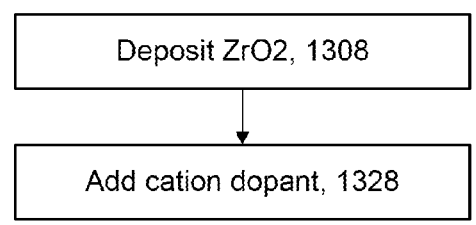
FIG. 13D depicts flowchart of one embodiment that adds a cation to the middle high-k layer $ZrO_2$, which may stabilize cubic or tetragonal phases.

FIG. 13D depicts flowchart of one embodiment that adds a cation to the middle high-k layer $ZrO_2$, which may stabilize cubic or tetragonal phases. In step 1308, $ZrO_2$ is deposited. In step 1328, a cation dopant is added to the $ZrO_2$. This doping is in situ, in one embodiment. The cation dopant may include, but is not limited to, yttrium, magnesium, calcium, iron, and cerium. The process of 13D is performed with the process of FIG. 13B in one embodiment. However, it is not required to use the processes in combination with each other.

Figure 13E:
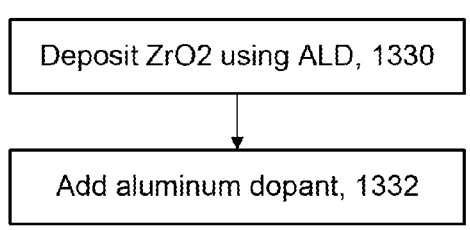
FIG. 13E depicts flowchart of one embodiment that adds aluminum to the middle high-k layer ZrO, which may increase the k-value.

FIG. 13E depicts flowchart of one embodiment that adds aluminum to the middle high-k layer ZrO, which may increase the k-value. In step 1330, $ZrO_2$ is deposited using ALD. In step 1332, aluminum is added to the $ZrO_2$ as a dopant. This doping is in situ, in one embodiment. The process of 13E is performed with the process of FIG. 13B in one embodiment. However, it is not required to use the processes in combination with each other.

Some embodiments disclosed herein include forming deep traps in at least one of the charge trapping layers. A deep trap may be defined based on the energy required to remove an electron or hole from the deep trap to the conduction band of the high-k material or the valence band of the high-k material. A deep trap may also be defined based on how close the energy level of the trap is to a mid-point between the valence band and the conduction band. For example, a deep trap may be defined as one that is in a band having width that is ⅓ of the bandgap and centered midway between the valence and conduction bands. As another example, a deep trap may be defined as one that is in a band having width that is ½ of the bandgap and centered midway between the valence and conduction bands. The foregoing examples refer to the traps continuously distributed in energy space within the band gap and having a width of about ⅓ or about ½ of the bandgap of a dielectric, and centered at the midpoint of the band gap. In another example, the traps may have a number of discrete energy levels positioned within an approximate range of ⅓ or ½ of the bandgap of a dielectric, with the range approximately centered at the midpoint of the band gap. In yet another example, the traps may be continuously distributed within the band gap and also having a number of discrete energy levels in some portion of the energy ranges described above. In one embodiment, the majority of the traps in one of the high-k layers are deep traps.

In one embodiment, HfO$_2$ is doped with Nb to produce deep traps with energy levels of about 3.2 eV below the conduction band. The concentration of traps per unit area can be about 1e$^{13}$ cm$^{-2}$ (e.g., range 5e$^{12}$ to 5e$^{13}$ cm$^{-2}$). These are numbers for illustration, and can be higher or lower. If the HfO$_2$ film is 5 nm, the area density of 1e$^{13}$ cm$^{-2}$ will translate into volume density of about 2e$^{19}$ cm$^{-3}$ (1e$^{13}$/5e$^{-7}$). Or for the range 5e$^{12}$ to 5e$^{13}$ cm$^{-2}$, the volume concentration can be 1e$^{19}$ to 1e$^{20}$ cm$^{-3}$.

Figure 13F:
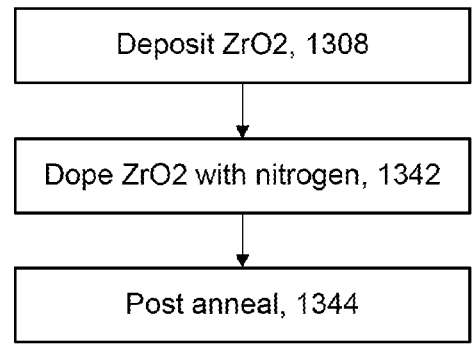
FIG. 13F depicts a flowchart of one embodiment that creates deep traps in the middle high-k layer ZrO.

Deep traps may provide better data retention. Also, trap levels may be modulated, which can help achieve longer data retention. Furthermore, an increase in the number of trap sites can improve performance. Moreover, the k-value may be increased. FIG. 13F depicts a flowchart of one embodiment that creates deep traps in the middle high-k layer, with ZrO being used in this example. In step 1308, ZrO$_2$ is deposited. In step 1342, the ZrO$_2$ is doped with nitrogen. This doping is in situ, in one embodiment. In step 1344, post deposition annealing is performed. This may form ZrON. The process of 13F is performed with the process of FIG. 13B in one embodiment. However, it is not required to use the processes in combination with each other.

Still other processing techniques can be used to improve properties of the charge trapping layers. One embodiment includes doping the high-k material with a material that decreases the conduction band offset of the high-k material relative to the semiconductor channel 699. In one embodiment, a high-k component such as ZrO$_2$ is doped with Zn. In one embodiment, ZrON is doped with Zn to form ZrZnON. The foregoing may be achieved by depositing ZrON with some amount of ZnO. Better charge trapping layer characteristics may result from a smaller conduction-band offset of ZrZnON with respect to SiO$_2$ in the tunnel dielectric layer 712, and Si$_3$N$_4$ in the charge trapping layers 706, 710. Also, ZrZnON may have stronger electron-capture ability with deeper-level traps. Owing to the negative conduction-band offset of ZnO (relative to silicon or polysilicon channel energy levels), some traps in the ZrZnON film are aligned with or above the valence band of the polysilicon channel 699. As a result, injected holes during erase can directly recombine with electrons trapped in the ZrZnON film and thus higher erasing speed can be achieved.

Many other variations for the charge trapping layers are possible in addition to those already discussed. In some embodiments, there is a single middle high-k layer. That is, there are three charge trapping layers.

Figure 14A:
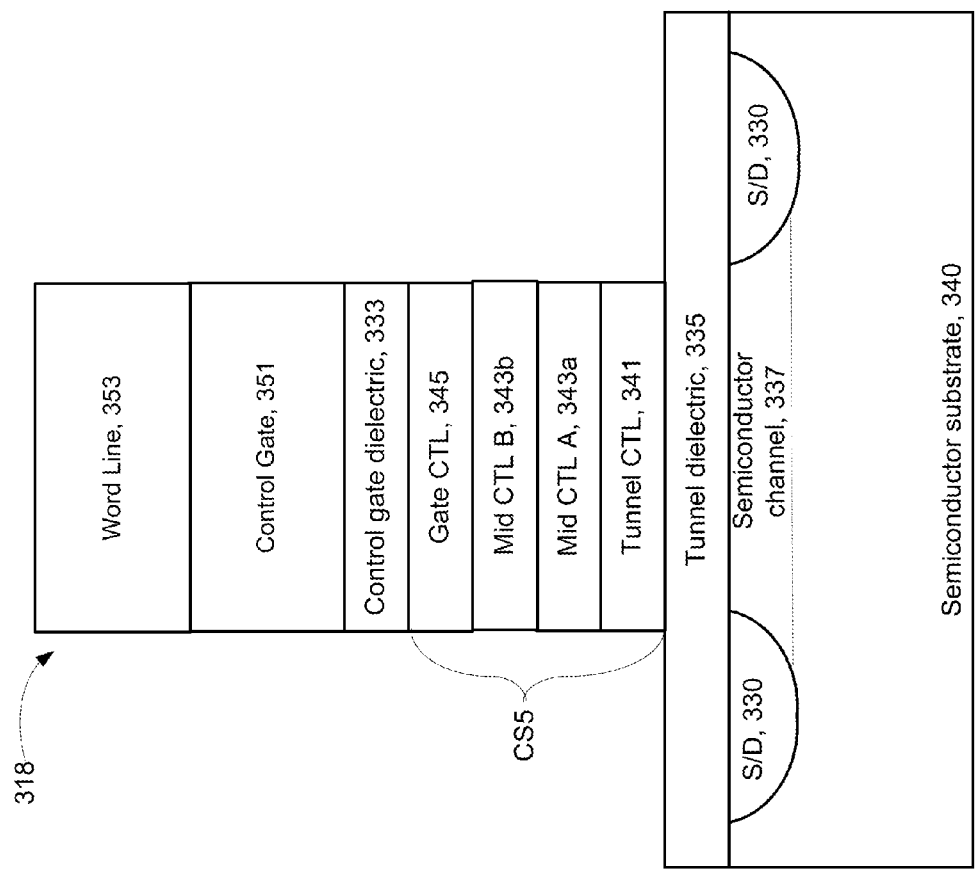
FIG. 14A shows one embodiment in which a 2D NAND cell has a charge storage region with four films.
Figure 14B:
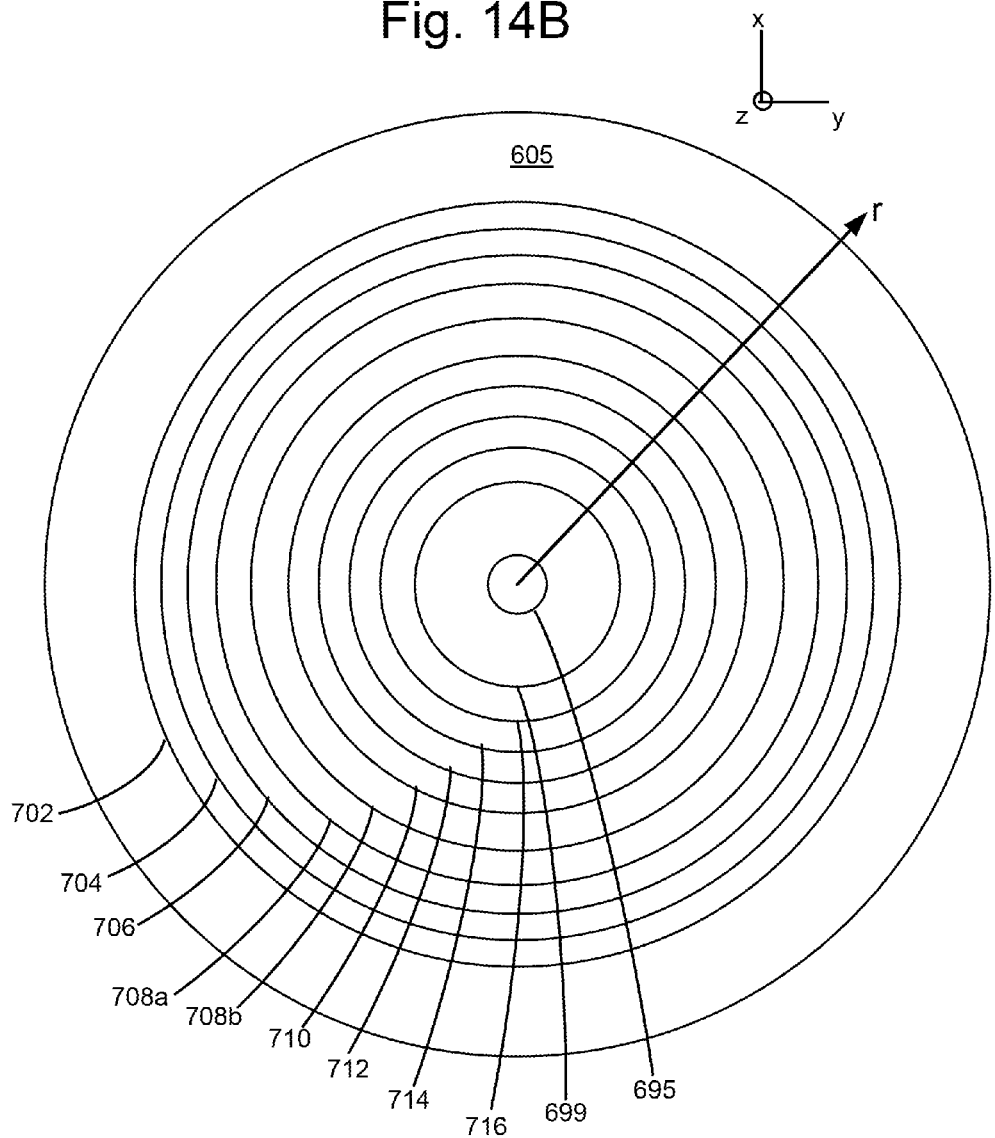
FIG. 14B shows one embodiment in which a 3D NAND cell has a charge storage region with four films.

In some embodiments, there is a double middle layer. For example, the charge trapping region comprises four different dielectric layers. FIG. 14A shows one embodiment in which a 2D NAND cell has a charge storage region CS5 having tunnel CTL 341, mid CTL A 343a, mid CTL B 343b, and gate CTL 345. FIG. 14B shows one embodiment in which a 3D NAND cell (similar to FIG. 7A) has a charge storage region having charge trapping layer 706, charge trapping layer A 708a, charge trapping layer B 708b, and charge trapping layer 710. One example of a double mid-layer is a LaO/SiN-HfO/LaO stack. Another example of a double mid-layer is a LaO/SiN-HfAlO/LaO stack.

Note that in the examples in which there is a double mid-layer, the high-low-high conduction band offset may be achieved. For example, charge trapping layer A 708a may have a smaller conduction band offset than charge trapping layer 706. Also, charge trapping layer A 708a may have a smaller conduction band offset than charge trapping layer 710. Likewise, charge trapping layer B 708b may have a smaller conduction band offset than neighboring charge trapping layer 710. Also, charge trapping layer B 708b may have a smaller conduction band offset than charge trapping layer 706. In the 2D example, mid CTL A 343a may have a smaller conduction band offset than tunnel CTL 341. Also, mid CTL A 343a may have a smaller conduction band offset than gate CTL 345. Likewise, mid CTL B 343b may have a smaller conduction band offset than gate CTL 345. Also, mid CTL B 343b may have a smaller conduction band offset than tunnel CTL 341. Similar reasoning applies to both the 2D and 3D examples for the low-high-low valence band offset discussed herein. Band gap engineering may be used to achieve the foregoing band offsets.

Other possible stacks for the charge trapping layer include, but are not limited to, LaO/SiN/LaO, LaAlO$_3$/SiN/LaAlO$_3$, LaO/HfAlO/LaO, SiN/ZrO$_2$/SiN, SiN/ZrON/SiN, SiN/HfO$_2$/SiN, SiN/HfAlO/SiN, SiN/HfN$_{1-x}$O$_x$/SiN, LaO/ZrO$_2$/LaO, LaO/ZrON/LaO, LaO/HfO$_2$/LaO, LaO/HfAlO/LaO, LaO/HfN$_{1-x}$O$_x$/LaO, AlO/LaO/AlO, and SiN/AlO/HfO. Note that in some of the foregoing examples, band gap engineering may be used to achieve the high-low-high conduction band offset for the CSR 697, and/or the low-high-low valence band offset for the CSR 697. As one example, for LaAlO$_3$/SiN/LaAlO$_3$, the aluminum component in the outer two layers can be modulated to raise the conduction band so that it will be somewhat higher than SiN. In the forgoing example, for the LaAlO$_3$ films that have the conduction band somewhat higher than in SiN (e.g., as the middle film in the CTL 697), the LaAlO$_3$ conduction band may still be lower than in SiO$_2$ of the tunnel dielectric film adjacent to the CTL 697, in one embodiment. In some cases, the middle layer can be bandgap engineered to lower its conduction band relative to the outer two layers. Similar bandgap engineering may be performed with respect to the valence band to achieve the low-high-low valence band offset for the CSR 697.

Note that some of the examples in the previous paragraph are for a high-k/mid-k/high-k CSR 697. For example, LaO/SiN/LaO and LaAlO$_3$/SiN/LaAlO$_3$ each may have such a structure. In one embodiment, bandgap engineering is used to achieve the high-low-high conduction band offset for the CSR 697 for a high-k/mid-k/high-k CSR 697. In another embodiment, a device having a high-k/mid-k/high-k CSR 697 does not have a high-low-high conduction band offset for the CSR 697. For example, it may have a low-high-low conduction band offset for the CSR 697.

Figure 15:
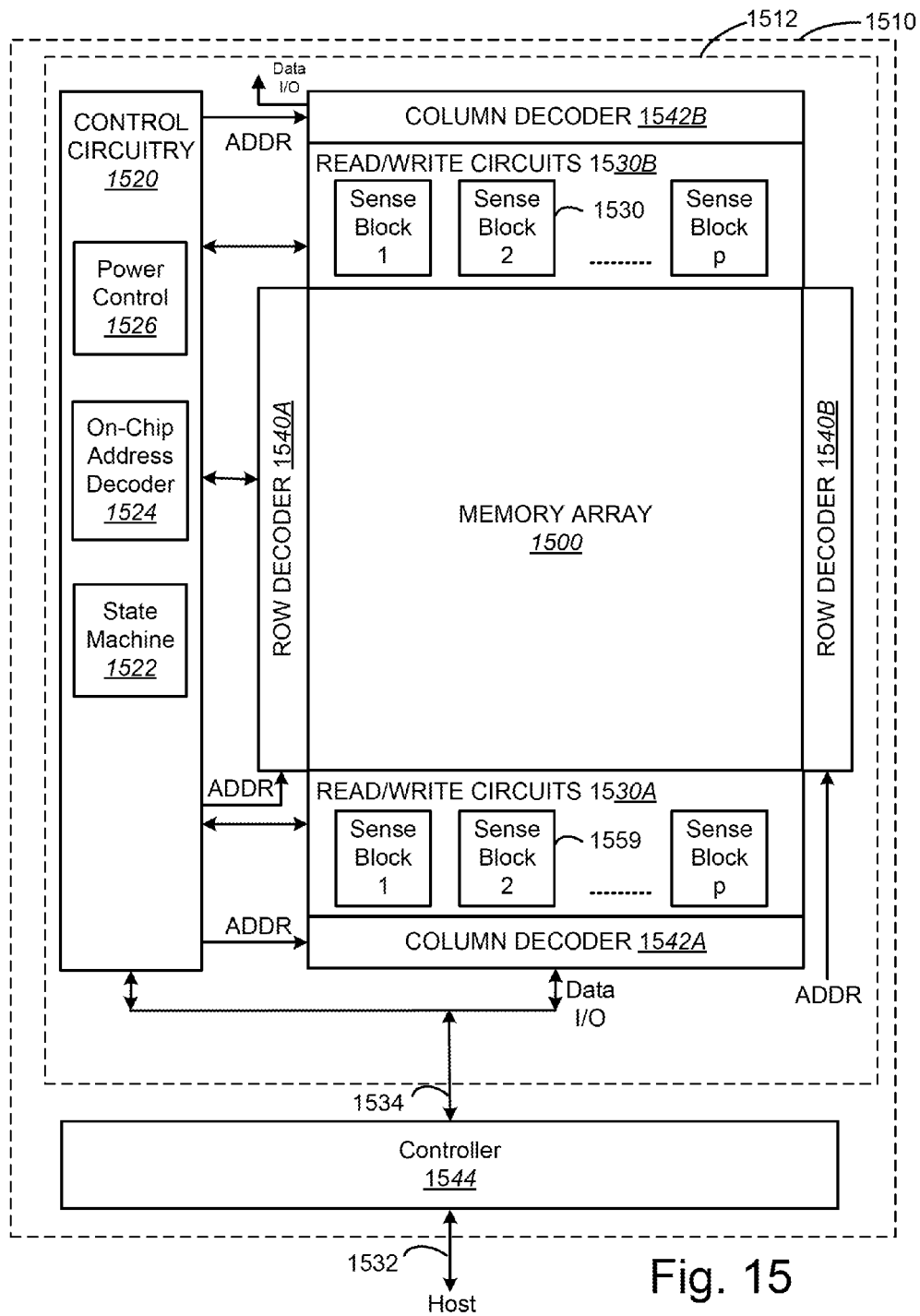
FIG. 15 illustrates a non-volatile storage device that may include one or more memory die or chips.

FIG. 15 illustrates a non-volatile storage device 1510 that may include one or more memory die or chips 1512. Memory die 1512 includes an array 1500 (two-dimensional memory structure or three dimensional memory structure) of memory cells, control circuitry 1520, and read/write circuits 1530A and 1530B. In one embodiment, the memory array 1500 has a 3D NAND configuration. For example, any of the 3D NAND configurations discussed herein may be used in the memory array 1550. In one embodiment, the memory cells array has a 2D NAND configuration. For example, any of the 2D NAND configurations discussed herein may be used in the memory array 1550.

In one embodiment, access to the memory array 1500 by the various peripheral circuits is implemented in a symmetric fashion, on opposite sides of the array, so that the densities of access lines and circuitry on each side are reduced by half. The read/write circuits 1530A and 1530B include multiple sense blocks 1559 which allow a page of memory cells to be read or programmed in parallel. The memory array 1500 is addressable by word lines via row decoders 1540A and 1540B and by bit lines via column decoders 1542A and 1542B. Data may input and output (Data I/O) via column decoders 1542A and 1542B. In a typical embodiment, a controller 1544 is included in the same memory device 1510 (e.g., a removable storage card or package) as the one or more memory die 1512. Commands and data are transferred between the host and controller 1544 via lines 1532 and between the controller and the one or more memory die 1512 via lines 1534. One implementation can include multiple chips 1512.

Control circuitry 1520 cooperates with the read/write circuits 1530A and 1530B to perform memory operations on the memory array 1500. The control circuitry 1520 includes a state machine 1522, an on-chip address decoder 1524 and a power control module 1526. The state machine 1522 provides chip-level control of memory operations. The on-chip address decoder 1524 provides an address interface to convert between the address that is used by the host or a memory controller to the hardware address (ADDR) used by the decoders 1540A, 1540B, 1542A, and 1542B. The power control module 1526 controls the power and voltages supplied to the word lines and bit lines during memory operations. In one embodiment, power control module 1526 includes one or more charge pumps that can create voltages larger than the supply voltage.

In one embodiment, one or any combination of control circuitry 1520, power control circuit 1526, decoder circuit 1524, state machine circuit 1522, decoder circuit 1542A, decoder circuit 1542B, decoder circuit 1540A, decoder circuit 1540B, read/write circuits 1530A, read/write circuits 1530B, and/or controller 1544 can be referred to as one or more managing circuits, managing circuitry, or the like.

One embodiment disclosed herein includes a non-volatile storage device, comprising a semiconductor channel, a tunnel dielectric region adjacent to the semiconductor channel, wherein the tunnel dielectric region comprises a first tunnel dielectric layer, a charge trapping region having a first charge trapping layer adjacent to the first tunnel dielectric layer, a second charge trapping layer, and a third charge trapping layer, a control gate dielectric, and a control gate, wherein the control gate dielectric is between the control gate and the charge trapping region. The second charge trapping layer is between the first and third charge trapping layers. The second charge trapping layer has a smaller conduction band offset relative to the semiconductor channel than a conduction band offset of the first charge trapping layer relative to the semiconductor channel and has a smaller conduction band offset relative to the semiconductor channel than a conduction band offset of the third charge trapping layer relative to the semiconductor channel. The first charge trapping layer has a smaller valance band offset relative to the semiconductor channel than a valance band offset of the first tunnel dielectric layer relative to the semiconductor channel. The second charge trapping layer comprises a high-k material having a dielectric constant greater than 7.9.

One embodiment disclosed herein includes a three-dimensional (3D) memory device, comprising a substrate that has a major surface that extends horizontally, a semiconductor channel that extends vertically with respect to the major surface, and a tunnel dielectric region that surrounds the semiconductor channel. The tunnel dielectric region has a first dielectric layer adjacent to the semiconductor channel, a second dielectric layer, and a third dielectric layer. The second dielectric layer has a smaller conduction band offset relative to the semiconductor channel than a conduction band offset of the first dielectric layer relative to the semiconductor channel and has a smaller conduction band offset relative to the semiconductor channel than a conduction band offset of the third dielectric layer relative to the semiconductor channel. The memory device further comprises a charge trapping region that surrounds the tunnel dielectric region. The charge trapping region has a first charge trapping layer adjacent to the third dielectric layer, a second charge trapping layer, and a third charge trapping layer. The second charge trapping layer has a smaller conduction band offset relative to the semiconductor channel than a conduction band offset of the first charge trapping layer relative to the semiconductor channel and has a smaller conduction band offset relative to the semiconductor channel than a conduction band offset of the third charge trapping layer relative to the semiconductor channel, wherein the first charge trapping layer has a smaller valance band offset relative to the semiconductor channel than a valance band offset of the third dielectric layer relative to the semiconductor channel. The second charge trapping layer comprises a high-k material having a dielectric constant greater than 7.9. The memory device further comprises a blocking oxide region that surrounds the charge trapping region and a control gate that surrounds the blocking oxide region.

One embodiment disclosed herein includes a monolithic three-dimensional memory device, comprising: a semiconductor substrate that has a major surface that extends in a horizontal plane; a first plurality of layers of conductive material that extend parallel to the major surface of the substrate, wherein the layers of conductive material comprise metal control gates of memory cells; a second plurality of layers of insulating material alternating with the first plurality of layers of conductive material in a stack above the semiconductor substrate; and a plurality of NAND strings that extend vertically through the plurality of layers of conductive material and the plurality of layers of insulating material. Each of the NAND strings comprises a plurality of the memory cells and a semiconductor channel that has a major axis that extends in a vertical direction with respect to the horizontal plane. Each of the memory cells comprises a charge storage region, a tunnel dielectric between the semiconductor channel and the charge storage region, and a blocking oxide between the charge storage region and the control gate. The tunnel dielectric comprises a high-low-high conduction band offset between the semiconductor channel and the charge storage region. The charge storage region comprises a high-low-high conduction band offset between the tunnel dielectric and the blocking oxide. The charge storage region comprises a first charge storage film, a second charge storage film, and a third charge storage film. The second charge storage film has a lower conduction band than the first charge storage film. The second charge storage film has a lower conduction band than the third charge storage film. The second charge storage film comprises a high-k material having a dielectric constant greater than 7.9. The first charge storage film has a higher valance band than a valance band of a portion of the tunnel dielectric that is closest to the charge trapping layer.

One embodiment disclosed herein includes a method of fabricating a non-volatile storage device. The method comprises fabricating a semiconductor channel and fabricating a tunnel dielectric region. The tunnel dielectric region is adjacent to the semiconductor channel. The tunnel dielectric region comprises a first dielectric layer. The method comprises fabricating a charge trapping region having a first charge trapping layer, a second charge trapping layer, and a third charge trapping layer. The first charge trapping layer is adjacent to the tunnel dielectric region. This includes forming the second charge trapping layer between the first and third charge trapping layers. The second charge trapping layer has a smaller conduction band offset relative to the semiconductor channel than a conduction band offset of the first charge trapping relative to the semiconductor channel and has a smaller conduction band offset relative to the semiconductor channel than a conduction band offset of the third charge trapping relative to the semiconductor channel. The first charge trapping layer has a smaller valance band offset relative to the semiconductor channel than a valance band offset of the first dielectric layer relative to the semiconductor channel. The second charge trapping layer comprises a high-k material having a dielectric constant greater than 7.9. The method also comprises fabricating a control gate dielectric. The charge trapping region is between the control gate dielectric and the tunnel dielectric. The method also comprises fabricating a control gate. The control gate dielectric is between the control gate and the charge trapping region.

One embodiment disclosed herein includes a method of forming a three-dimensional (3D) memory device, comprising: forming a plurality of layers of material, wherein the layers are parallel to a major surface of a substrate; forming memory holes in the plurality of layers of material; forming a first charge trapping layer within each of the memory holes, wherein the first charge trapping layer has a vertical sidewall; forming a second charge trapping layer on the vertical sidewall of the first charge trapping layer, wherein the second charge trapping layer has a vertical sidewall, wherein the second charge trapping layer comprises a high-k material having a dielectric constant greater than 7.9; forming a third charge trapping layer on the vertical sidewall of the second charge trapping layer, wherein the second charge trapping layer has a vertical sidewall; forming a first dielectric layer on the vertical sidewall of the third charge trapping layer, wherein the first dielectric layer has a vertical sidewall; forming a second dielectric layer on the vertical sidewall of the first dielectric layer, wherein the second dielectric layer has a vertical sidewall; forming a third dielectric layer on the vertical sidewall of the second dielectric layer, wherein the third dielectric layer has a vertical sidewall; forming a semiconductor channel on the vertical sidewall of the third dielectric layer, wherein the second charge trapping layer has a lower conduction band offset relative to the semiconductor channel than a conduction band offset of the first charge trapping layer relative to the semiconductor channel, wherein the second charge trapping layer has a lower conduction band offset relative to the semiconductor channel than a conduction band offset of the third charge trapping layer relative to the semiconductor channel, wherein the third charge trapping layer has a lower valance band offset relative to the semiconductor channel than a valence valance band offset of the first dielectric layer relative to the semiconductor channel; forming a blocking oxide region that surrounds the charge trapping region; and forming a metal control gate that surrounds the blocking oxide region.

One embodiment includes a method of forming a monolithic three-dimensional (3D) memory device. The method comprises forming a charge trapping region, wherein the charge trapping region has a first charge trapping film, a second charge trapping film, and a third charge trapping film, wherein the second charge trapping film is between the first charge trapping film and the third charge trapping film, wherein the second charge trapping film comprises a high-k material having a dielectric constant greater than 7.9; forming a tunnel dielectric region, wherein the charge trapping region surrounds the tunnel dielectric region, wherein the tunnel dielectric region has a first dielectric film, a second dielectric film, and a third dielectric film, wherein the third charge trapping film is adjacent to the first dielectric film; forming a semiconductor channel that extends vertically with respect to a major surface of a semiconductor substrate, wherein the tunnel dielectric region surrounds the semiconductor channel, wherein the third dielectric film is adjacent to the semiconductor channel, wherein the second dielectric film has a smaller conduction band offset relative to the semiconductor channel than a conduction band offset of the first dielectric film relative to the semiconductor channel and has a smaller conduction band offset relative to the semiconductor channel than a conduction band offset of the third dielectric film relative to the semiconductor channel, wherein the second charge trapping film has a smaller conduction band offset relative to the semiconductor channel than a conduction band offset of the first charge trapping film relative to the semiconductor channel and has a smaller conduction band offset relative to the semiconductor channel than a conduction band offset of the third charge trapping film relative to the semiconductor channel, wherein the third charge trapping film has a smaller valance band offset relative to the semiconductor channel than a valance band offset of the first dielectric film relative to the semiconductor channel; forming a blocking oxide region that surrounds the charge trapping region; and forming a metal control gate that surrounds the blocking oxide region.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of fabricating a non-volatile storage device, the method comprising:
fabricating a semiconductor channel;
fabricating a tunnel dielectric region wherein the tunnel dielectric region is adjacent to the semiconductor channel, wherein the tunnel dielectric region comprises a first dielectric layer;
fabricating a charge trapping region having a first charge trapping layer, a second charge trapping layer, and a third charge trapping layer, including forming the second charge trapping layer between the first and third charge trapping layers, wherein the first charge trapping layer is adjacent to the tunnel dielectric region wherein the second charge trapping layer has a smaller conduction band offset relative to the semiconductor channel than a conduction band offset of the first charge trapping relative to the semiconductor channel and has a smaller conduction band offset relative to the semiconductor channel than a conduction band offset of the third charge trapping relative to the semiconductor channel, wherein the first charge trapping layer has a smaller valance band offset relative to the semiconductor channel than a valance band offset of the first dielectric layer relative to the semiconductor channel, wherein the second charge trapping layer comprises a high-k material having a dielectric constant greater than 7.9;
fabricating a control gate dielectric, wherein the charge trapping region is between the control gate dielectric and the tunnel dielectric region; and fabricating a control gate, wherein the control gate dielectric is between the control gate and the charge trapping region.

2. The method of claim 1, further comprising:
doping the high-k material in the second charge trapping layer with nitrogen.

3. The method of claim 2, wherein the high-k material is either $ZrO_2$ or $HfO_2$.

4. The method of claim 1, wherein forming the second charge trapping layer comprises:
doping the high-k material with a material that decreases the conduction band offset of the high-k material relative to the semiconductor channel.

5. The method of claim 1, wherein forming the second charge trapping layer comprises:
doping the high-k material with a material that increases the valence band offset of the high-k material relative to the semiconductor channel.

6. The method of claim 1, wherein forming the charge trapping region comprises:
depositing the first charge trapping layer at a first temperature;
depositing the second charge trapping layer at a second temperature that is lower than the first temperature, ramping up from the second temperature to a third temperature over a pre-determined time period, wherein the third temperature is higher than the second temperature; and
depositing the third charge trapping layer at the third temperature.

7. The method of claim 6, further comprising:
performing a thermal anneal at the third temperature after depositing the second charge trapping layer and prior to depositing the third charge trapping layer.

8. The method of claim 6, wherein the second charge trapping layer is $ZrO_2$.

9. The method of claim 8, wherein the first charge trapping layer and the third charge trapping layer are each $Si_3N_4$.

10. The method of claim 1, wherein forming the second charge trapping layer includes forming a region of $ZrO_2$ and doping the $ZrO_2$ with a cation.

11. The method of claim 1, wherein forming a tunnel dielectric region further includes forming a second dielectric layer and a third dielectric layer, wherein the second dielectric layer is between the first and third dielectric layers, wherein the second dielectric layer has a smaller conduction band offset relative to the semiconductor channel than a conduction band offset of the first dielectric layer relative to the semiconductor channel and has a smaller conduction band offset relative to the semiconductor channel than a conduction band offset of the third dielectric layer relative to the semiconductor channel.

12. A method of forming a three-dimensional (3D) memory device, comprising:
forming a plurality of layers of material, wherein the layers are parallel to a major surface of a substrate;
forming memory holes in the plurality of layers of material;
forming a first charge trapping layer within each of the memory holes, wherein the first charge trapping layer has a vertical sidewall;
forming a second charge trapping layer on the vertical sidewall of the first charge trapping layer, wherein the second charge trapping layer has a vertical sidewall, wherein the second charge trapping layer comprises a high-k material having a dielectric constant greater than 7.9;
forming a third charge trapping layer on the vertical sidewall of the second charge trapping layer, wherein the third charge trapping layer has a vertical sidewall;
forming a first dielectric layer on the vertical sidewall of the third charge trapping layer, wherein the first dielectric layer has a vertical sidewall;
forming a second dielectric layer on the vertical sidewall of the first dielectric layer, wherein the second dielectric layer has a vertical sidewall;
forming a third dielectric layer on the vertical sidewall of the second dielectric layer, wherein the third dielectric layer has a vertical sidewall;
forming a semiconductor channel on the vertical sidewall of the third dielectric layer,
wherein the second charge trapping layer has a lower conduction band offset relative to the semiconductor channel than a conduction band offset of the first charge trapping layer relative to the semiconductor channel, wherein the second charge trapping layer has a lower conduction band offset relative to the semiconductor channel than a conduction band offset of the third charge trapping layer relative to the semiconductor channel, wherein the third charge trapping layer has a lower valance band offset relative to the semiconductor channel than a valence valance band offset of the first dielectric layer relative to the semiconductor channel;
forming a blocking oxide region that surrounds the first charge trapping layer; and
forming a metal control gate that surrounds the blocking oxide region.

13. The method of claim 12, further comprising doping the high-k material in the second charge trapping layer with an impurity to intentionally create deeper traps in the high-k material.

14. The method of claim 12, wherein forming the second charge trapping layer comprises:
doping $ZrO_2$ with Zn.

15. The method of claim 12, wherein forming the second charge trapping layer comprises:
depositing ZrON with ZnO.

16. The method of claim 12:
wherein forming the first charge trapping layer comprises:
depositing a first material having a dielectric constant greater than 7.9; and
wherein forming the third charge trapping layer comprises:
depositing a second material having a dielectric constant greater than 7.9.

17. The method of claim 12, wherein forming the second charge trapping layer comprises:
depositing $ZrO_2$ as the high-k material for the second charge trapping layer; and
performing a post-deposit anneal in a nitrogen/hydrogen ambient.

18. The method of claim 12, wherein forming the second charge trapping layer comprises:
depositing $ZrO_2$ as the high-k material for the second charge trapping layer; and
adding one or more of yttrium, magnesium, calcium, iron or cerium while depositing the $ZrO_2$.

19. The method of claim 12, wherein forming the second charge trapping layer comprises:
depositing $ZrO_2$ as the high-k material for the second charge trapping layer; and
doping the $ZrO_2$ with aluminum.

20. The method of claim 12, wherein forming the second charge trapping layer comprises:

depositing the high-k material for the second charge trapping layer; and performing a thermal anneal to crystallize the high-k material.

21. A method of forming a monolithic three-dimensional (3D) memory device, the method comprising:

forming a charge trapping region, wherein the charge trapping region has a first charge trapping film, a second charge trapping film, and a third charge trapping film, wherein the second charge trapping film is between the first charge trapping film and the third charge trapping film, wherein the second charge trapping film comprises a high-k material having a dielectric constant greater than 7.9;

forming a tunnel dielectric region, wherein the charge trapping region surrounds the tunnel dielectric region, wherein the tunnel dielectric region has a first dielectric film, a second dielectric film, and a third dielectric film, wherein the third charge trapping film is adjacent to the first dielectric film;

forming a semiconductor channel that extends vertically with respect to a major surface of a semiconductor substrate, wherein the tunnel dielectric region surrounds the semiconductor channel, wherein the third dielectric film is adjacent to the semiconductor channel, wherein the second dielectric film has a smaller conduction band offset relative to the semiconductor channel than a conduction band offset of the first dielectric film relative to the semiconductor channel and has a smaller conduction band offset relative to the semiconductor channel than a conduction band offset of the third dielectric film relative to the semiconductor channel, wherein the second charge trapping film has a smaller conduction band offset relative to the semiconductor channel than a conduction band offset of the first charge trapping film relative to the semiconductor channel and has a smaller conduction band offset relative to the semiconductor channel than a conduction band offset of the third charge trapping film relative to the semiconductor channel, wherein the third charge trapping film has a smaller valance band offset relative to the semiconductor channel than a valance band offset of the first dielectric film relative to the semiconductor channel;

forming a blocking oxide region that surrounds the charge trapping region; and forming a metal control gate that surrounds the blocking oxide region.

22. The method of claim 21, wherein the second charge trapping film has a greater valence band offset relative to the semiconductor channel than a valence band offset of the first charge trapping film relative to the semiconductor channel and has a greater valence band offset relative to the semiconductor channel than a valence band offset of the third charge trapping film relative to the semiconductor channel.

* * * * *